(12) United States Patent
Tsubota et al.

(10) Patent No.: US 9,966,866 B2
(45) Date of Patent: May 8, 2018

(54) DISTRIBUTED POWER SYSTEM, DC-DC CONVERTER, AND POWER CONDITIONER

(71) Applicant: OMRON Corporation, Kyoto-shi, Kyoto (JP)

(72) Inventors: Yasuhiro Tsubota, Moriyama (JP); Tomoya Irie, Kyoto (JP); Kunio Aono, Hirakata (JP); Takao Mizokami, Ritto (JP); Masao Mabuchi, Moriyama (JP); Kenji Kobayashi, Moriyama (JP)

(73) Assignee: OMRON Corporation, Kyoto-shi (JP)

( * ) Notice: Subject to any disclaimer, the term of this patent is extended or adjusted under 35 U.S.C. 154(b) by 0 days. days.

(21) Appl. No.: 15/681,768

(22) Filed: Aug. 21, 2017

(65) Prior Publication Data

US 2018/0083547 A1   Mar. 22, 2018

(30) Foreign Application Priority Data

Sep. 20, 2016 (JP) ................................. 2016-183509

(51) Int. Cl.
*H02M 7/5387* (2007.01)
*H02M 3/335* (2006.01)
(Continued)

(52) U.S. Cl.
CPC ...... *H02M 3/33569* (2013.01); *H01L 31/042* (2013.01); *H02M 7/5387* (2013.01); *H02S 40/32* (2014.12)

(58) Field of Classification Search
CPC ........... H02M 2001/007; H02M 3/156; H02M 7/537; H02M 7/5387
(Continued)

(56) References Cited

U.S. PATENT DOCUMENTS 8,564,261 B2 * 10/2013 Yoneda .................. H02J 3/383
                                                      323/266
2002/0044473 A1 * 4/2002 Toyomura ......... H01R 13/7039
                                                      363/142
(Continued)

FOREIGN PATENT DOCUMENTS

WO      2008154918 A1    12/2008

OTHER PUBLICATIONS

Shinichi Kato, "What is PID with which Output decreases by about 70% in one year"?, Mega-solar Business, Jan. 7, 2016, Nikkei Business Publications, Inc., Retrieved from the internet : URL: http://techon.nikkeibp.co.jp/atcl/feature/15/302961/010500010/?ST=msb&P=1, Accessed on Sep. 13, 2016, Concise explanation of relevance provided in the specification.
(Continued)

*Primary Examiner* — Jeffrey Sterrett
(74) *Attorney, Agent, or Firm* — Metrolexis Law Group, PLLC

(57) ABSTRACT

A distributed power system that is connected to a utility grid during both daytime and nighttime includes a plurality of power supplies including a solar array, a non-isolated DC-DC converter that has an input terminal and an output terminal and raises, at a predetermined step-up ratio, a DC voltage input from the power supplies via the input terminal and outputs the DC voltage via the output terminal, an inverter that converts the DC voltage output from the DC-DC converter via the output terminal into an alternating current, and a potential adjustment section that adjusts a potential at a negative electrode of the solar array to a potential higher than a potential at a negative electrode of the inverter at least during nighttime.

20 Claims, 47 Drawing Sheets

(51) Int. Cl.
*H01L 31/042* (2014.01)
*H02S 40/32* (2014.01)

(58) Field of Classification Search
USPC .......................... 323/222, 266; 363/131, 132
See application file for complete search history.

(56) References Cited

U.S. PATENT DOCUMENTS

| | | | | |
|---|---|---|---|---|
| 2004/0165408 A1* | 8/2004 | West | .................... | H02M 7/5387 363/131 |
| 2007/0236187 A1* | 10/2007 | Wai | .................... | H02J 3/383 323/222 |
| 2010/0133904 A1* | 6/2010 | Klodowski | ............. | H02M 7/48 307/24 |
| 2010/0226160 A1* | 9/2010 | Prior | .................... | H01H 47/002 363/132 |
| 2010/0232191 A1* | 9/2010 | Mabuchi | ................. | H02J 3/383 363/124 |
| 2011/0228578 A1* | 9/2011 | Serpa | .................... | H02M 3/158 363/132 |
| 2012/0062044 A1* | 3/2012 | Wagoner | ................... | H02J 3/38 307/151 |
| 2012/0081937 A1* | 4/2012 | Phadke | .................... | H02J 1/10 363/95 |
| 2012/0087159 A1* | 4/2012 | Chapman | ................ | H02J 3/383 363/41 |
| 2012/0120694 A1* | 5/2012 | Tsuchiya | ........... | H01L 31/02021 363/97 |
| 2012/0134191 A1* | 5/2012 | Yoneda | ................. | H01M 10/02 363/131 |
| 2012/0155140 A1* | 6/2012 | Chen | .................... | H02M 7/5387 363/132 |
| 2013/0038130 A1* | 2/2013 | Lai | ........................ | H02M 7/487 307/80 |
| 2013/0301314 A1* | 11/2013 | Fu | ........................ | H02M 7/487 363/37 |
| 2014/0211530 A1* | 7/2014 | Chen | ................ | H02M 7/53871 363/132 |
| 2016/0322899 A1* | 11/2016 | Toujinbara | .............. | H02J 3/381 |
| 2017/0033678 A1* | 2/2017 | Park | ...................... | H02M 1/143 |
| 2017/0338651 A1* | 11/2017 | Fishman | ................. | H02J 3/01 |

OTHER PUBLICATIONS

EESR dated Feb. 15, 2018 in a counterpart European Patent application.

* cited by examiner

FIG. 20

|  | Daytime (PV = 250V) | | Nighttime (when charging) | | PV module | |
| --- | --- | --- | --- | --- | --- | --- |
|  | P to E | N to E | P to E | N to E | P-type | N-type |
| Comparative Example 1 | +90VDC | -160VDC | 0VDC | 0VDC | B | B |
| Comparative Example 2 | +90VDC | -160VDC | -160VDC | -160VDC | C | A |
| Comparative Example 3 | +125VDC | -125VDC | 0VDC | 0VDC | B | B |
| First embodiment | +160VDC | -90VDC | +160VDC | +160VDC | B | C |
| Second embodiment | +125VDC | -125VDC | 0VDC | 0VDC | B | B |
| Third embodiment | +90VDC | -160VDC | 0VDC | 0VDC | B | B |
| Fourth embodiment | +90VDC | -160VDC | 0VDC | 0VDC | B | B |

A: Good, B: Fair, C: Poor

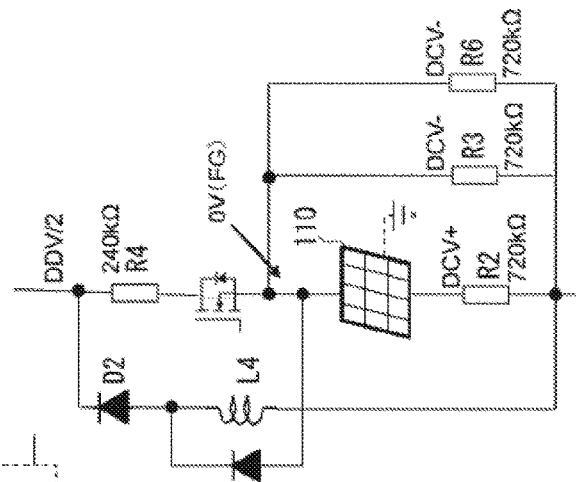
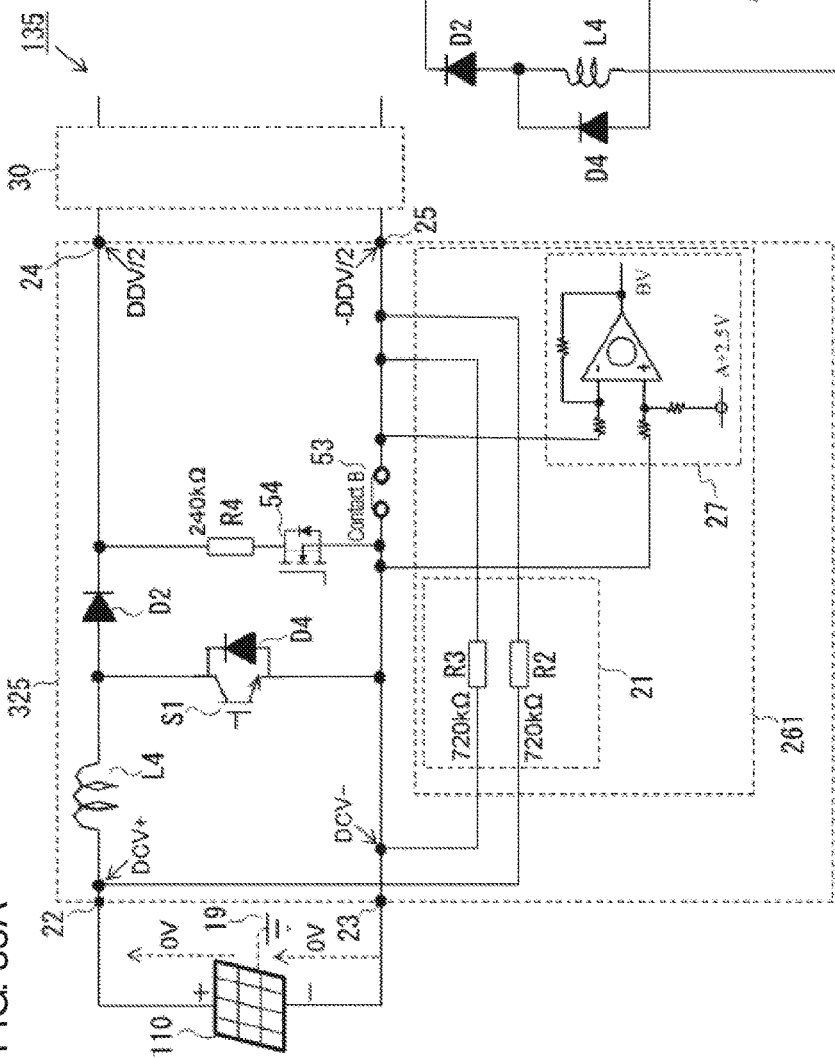
FIG. 35A
FIG. 35B

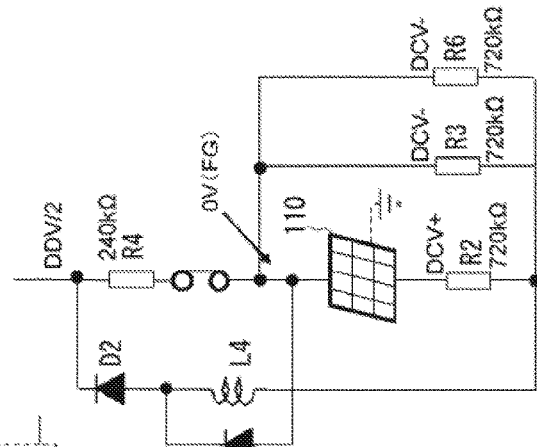
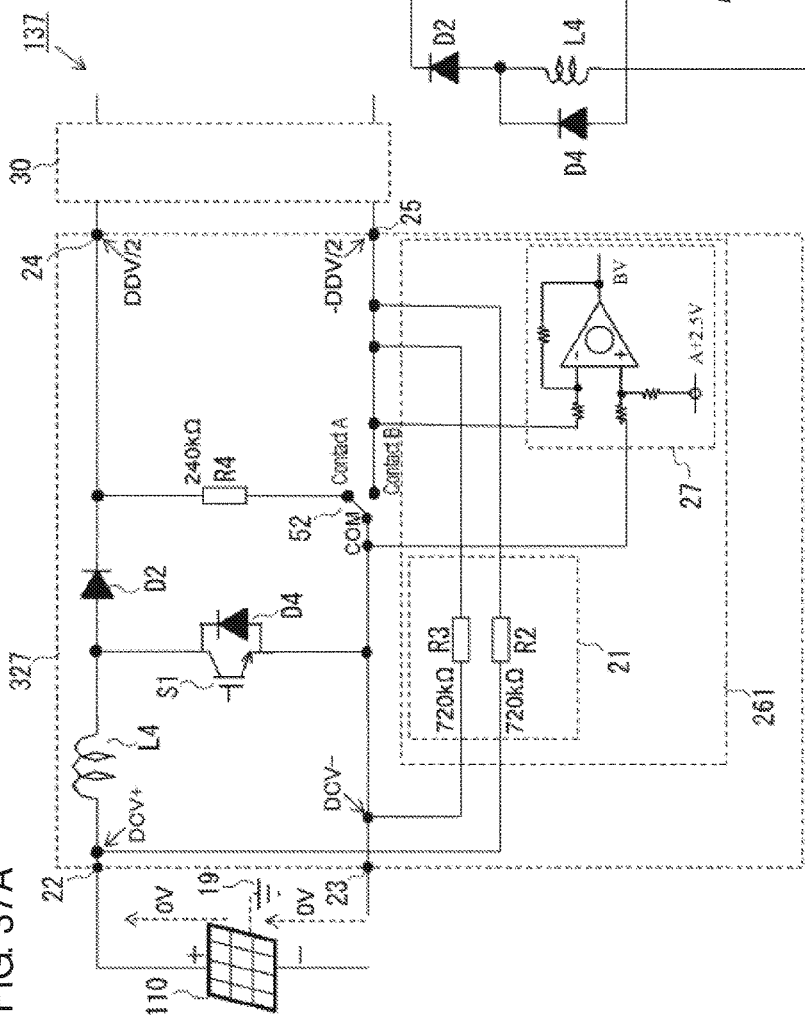
FIG. 37A
Fig. 37B

DISTRIBUTED POWER SYSTEM, DC-DC CONVERTER, AND POWER CONDITIONER

CROSS REFERENCE TO RELATED APPLICATIONS

This application claims priority from prior Japanese Patent Application No. 2016-183509 filed with the Japan Patent Office on Sep. 20, 2016, the entire contents of which are incorporated herein by reference.

FIELD

The disclosure relates to a distributed power system, a DC-DC converter, and a power conditioner.

BACKGROUND

A photovoltaic system for generating power using sunlight includes a solar array connected to the utility grid or a load through a power conditioner including components such as an inverter, and feeds power generated in the solar array to the utility grid and the load.

Recent photovoltaic systems have higher voltages, and increasingly use inverters including no transformers to achieve higher efficiency. This may cause a large potential difference to appear between the solar cells and the grounded frame. The potential difference, combined with external factors such as temperature and humidity (high temperature and high humidity), is known to produce a leakage current, which can possibly cause the potential induced degradation (PID) phenomenon.

FIG. 47 is a conceptual illustration of an example PID phenomenon. FIG. 47 shows one solar module string 10 included in a solar array in a photovoltaic system. The solar module string 10 includes multiple solar modules (solar panels) 1 that are connected in series. The solar module string 10 is connected to a utility grid 40 through a power conditioner 30. Each solar module 1 in the solar module string 10 receives sunlight during the daytime to generate power, thus producing a potential difference between a positive input terminal 301 and a negative input terminal 302.

FIG. 48 is a schematic diagram showing the structure of the solar module 1. As shown in FIG. 48, the solar module 1 includes a frame 11, a back-sheet 12, a cell 13, a glass sheet 14, and a sealant 15.

The cell 13 is a device including a semiconductor layer (power generation layer) that converts light energy into power with the photovoltaic effect. The glass sheet 14 is placed above the cell 13 on its light-receiving side, whereas the back-sheet 12 is placed below the cell 13 on the light non-receiving side. The cell 13 is sealed by the sealant 15 placed between the glass sheet 14 and the cell 13 and between the cell 13 and the back-sheet 12. The frame 11, which is on the outer periphery of the solar module 1, fixes the solar module 1 onto a support. The frame 11 is formed from conductive metal, and is grounded.

Of the solar modules 1 that are connected in series, as shown in FIG. 47, solar modules 1 adjacent to the input terminal 301 include cells 13 having positive potentials to ground, whereas solar modules 1 adjacent to the input terminal 302 include cells 13 having negative potentials to ground. As the difference between the potentials to ground increases, a leakage current may appear between the cell 13 and the frame 11 in a solar module 1 or between water 91 on the glass surface and the cell 13 as indicated with dashed arrows in FIG. 48. In this case, sodium ions in the glass sheet 14 and other components may move to the cell 13 and interfere with the electron transfer of the cell 13 to reduce the performance of the cell 13 or to cause the PID phenomenon. For example, in a cell of the solar module 1 including a p-type semiconductor, a negative potential to ground can reduce performance. In a cell of the solar module 1 including an n-type semiconductor, a positive potential to ground can reduce performance.

CITATION LIST

Non-Patent Literature

Non-patent Literature 1: Mega-solar/business/trouble, Nikkei Business Publications, Inc., (online) available at: <http://techon.nikkeibp.co.jp/atcl/feature/15/302961/010500010/?ST=msb&P=1>(accessed Sep. 13, 2016)

SUMMARY

Technical Problem

Performance reduction caused by PID is more notable as the potential to ground of the solar module 1 increases. Recent solar module systems with higher voltages can be more susceptible to PID.

The reduced performance of each solar module caused by PID is known to recover gradually as the potential to ground decreases after the solar module stops generating power at night. Thus, a solar module system having no potential to ground during the nighttime can avoid such performance reduction caused by PID.

However, a hybrid power supply system including a storage battery in addition to solar modules involves the charging and discharging operation of the storage battery during the nighttime as well, and thus does not lower the potentials to ground of the solar modules. This system may have performance reduction of the solar modules caused by PID.

One or more aspects are directed to a technique for preventing performance reduction caused by PID.

Solution to Problem

In response to the above issue, a first aspect provides a distributed power system that is connected to a utility grid during both daytime and nighttime. The system includes a plurality of power supplies including a solar array, a non-isolated DC-DC converter that has an input terminal and an output terminal and raises, at a predetermined step-up ratio, a DC voltage input from the power supplies via the input terminal and outputs the DC voltage via the output terminal, an inverter that converts the DC voltage output from the DC-DC converter via the output terminal into an alternating current, and a potential adjustment section that adjusts a potential at a negative electrode of the solar array to a potential higher than a potential at a negative electrode of the inverter at least during the nighttime.

In this structure, the potential adjustment section can readily maintain a very high potential at the negative electrode of the solar array during nighttime, and can either prevent or delay potential induced degradation (PID).

In a first aspect, the potential adjustment section includes a circuit configuration including a common potential at a positive electrode of an output terminal of the solar array and a positive electrode of the output terminal of the DC-DC converter.

This structure can have a common potential at the positive electrode of the output terminal of the DC-DC converter. In this case, the potential at the negative electrode of the solar array can be obtained by subtracting the voltage between the terminals of the solar array before the voltage raising operation from the potential at the positive electrode of the output terminal of the DC-DC converter after the voltage raising operation. Thus, the potential can be higher than the potential at the negative electrode of the inverter in a more reliable manner.

In a first aspect, the DC-DC converter includes at least a reactor, a diode, and a switching element. The potential adjustment section further includes a series-connected circuit configuration in which a first terminal of the reactor is connected to a negative electrode of the solar array, a second terminal of the reactor is connected to a cathode of the diode, and an anode of the diode is connected to a negative electrode of the output terminal of the DC-DC converter.

This structure allows the potential at the negative electrode of the solar array to be higher than the potential at the negative electrode of the inverter in a more reliable manner using at least the voltage between the anode and the cathode of the diode.

In a first aspect, the potential adjustment section includes a circuit configuration in which an equivalent voltage appears between a positive electrode of the input terminal of the DC-DC converter and a positive electrode of the output terminal of the DC-DC converter and between a negative electrode of the input terminal of the DC-DC converter and a negative electrode of the output terminal of the DC-DC converter when raising a voltage. This structure allows the potential at the positive and negative electrodes of the solar array to be adjusted to the potential of the DC voltage between the positive and negative electrodes of the inverter. Thus, the potential at the negative electrode of the solar array can be higher than the potential at the negative electrode of the inverter in a more reliable manner.

In a first aspect, the DC-DC converter includes at least a first reactor and a second reactor, a first diode and a second diode, a capacitor, and a switching element. The potential adjustment section includes a series-connected circuit configuration in which a first terminal of the first reactor is connected to the positive electrode of the input terminal of the DC-DC converter, a second terminal of the first reactor is connected to an anode of the first diode, and a cathode of the first diode is connected to the positive electrode of the output terminal of the DC-DC converter, and a first terminal of the second reactor is connected to the negative electrode of the input terminal of the DC-DC converter, a second terminal of the second reactor is connected to a cathode of the second diode, and an anode of the second diode is connected to the negative electrode of the output terminal of the DC-DC converter.

In a first aspect, when the system includes a DCV detection circuit that detects a DC voltage between two terminals of the solar array. The potential adjustment section includes a circuit configuration including a resistor having a resistance equivalent to a resistance of the DCV detection circuit between the positive electrode of the input terminal of the DC-DC converter and the positive electrode of the output terminal of the DC-DC converter.

In this structure, the DCV detection circuit and the resistor having the resistance equivalent to the resistance of the DCV detection circuit allow the potential at the positive and negative electrodes of the solar array to be adjusted to the potential of the DC voltage between the positive and negative electrodes of the inverter. Thus, the potential at the negative electrode of the solar array can be higher than the potential at the negative electrode of the inverter in a more reliable manner.

In a first aspect, the system includes a DCV detection circuit that detects a DC voltage between two terminals of the solar array. The potential adjustment section includes a circuit configuration including a GND for a control circuit of the DC-DC converter between the positive electrode and the negative electrode of the output terminal of the DC-DC converter. This structure allows the control voltage to be the median value of the potential of the positive and negative electrodes of the inverter, and thus allows the potential at the positive and negative electrodes of the solar array to be adjusted to the potential of the DC voltage between the positive and negative electrodes of the inverter in a more reliable manner. Thus, the potential at the positive and negative electrodes of the solar array can be higher than the potential at the negative electrode of the inverter in a more reliable manner.

In a first aspect, the system includes a DCV detection circuit that detects a DC voltage between two terminals of the solar array. The potential adjustment section includes a circuit configuration in which the positive electrode of the output terminal of the DC-DC converter is connected to a first terminal of a resistor having a resistance equivalent to a resistance of the DCV detection circuit, a second terminal of the resistor is connected to a cathode of a third diode, an anode of the third diode is connected to the negative electrode of the output terminal of the DC-DC converter, and the second terminal of the resistor and the cathode of the third diode are connected to the negative electrode of the solar array.

This structure allows the potential obtained by dividing the potential of the DC voltage across the positive electrode and the negative electrode of the inverter to be the potential at the negative electrode of the solar array. Thus, the potential at the negative electrode of the solar array can be higher than the potential at the negative electrode of the inverter in a more reliable manner.

In a first aspect, the third diode is connected to a resistor in parallel with the third diode between the cathode and the anode of the third diode. This structure allows the potential obtained by dividing the potential of the DC voltage across the positive electrode and the negative electrode of the inverter to be the potential at the negative electrode of the solar array.

In a first aspect, the system includes a DCV detection circuit that detects a DC voltage between two terminals of the solar array. The potential adjustment section includes a circuit configuration in which a positive electrode of the output terminal of the DC-DC converter is connected to a first terminal of a resistor having a resistance equivalent to a resistance of the DCV detection circuit, a second terminal of the resistor is connected to a positive electrode of a metal-oxide-semiconductor field-effect transistor, a negative electrode of the metal-oxide-semiconductor field-effect transistor is connected to a negative electrode of the output terminal of the DC-DC converter, and the second terminal of the resistor and the positive electrode of the metal-oxide-semiconductor field-effect transistor are connected to the negative electrode of the solar array.

This structure allows the potential at the positive and negative electrodes of the solar array to be adjusted to the potential of the DC voltage between the positive and negative electrodes of the inverter. Thus, the potential at the negative electrode of the solar array can be higher than the potential at the negative electrode of the inverter in a more reliable manner. In this structure, the resistor may have its two terminals each connected to a capacitor. This structure reduces noise generated when the metal-oxide-semiconductor field-effect transistors are turned on or off.

In a first aspect, the third diode is connected to a capacitor in parallel with the third diode between the cathode and the anode of the third diode. This structure also reduces noise.

In a first aspect, the system includes a DCV detection circuit that detects a DC voltage between two terminals of the solar array. The potential adjustment section includes a circuit configuration in which a positive electrode of the output terminal of the DC-DC converter is connected to a first terminal of a resistor having a resistance equivalent to a resistance of the DCV detection circuit, a three-terminal relay is connected to a second terminal of the resistor, the negative electrode of the solar array, a negative electrode of the output terminal of the DC-DC converter, and the three-terminal relay are connected to the negative electrode of the solar array and the negative electrode of the output terminal of the DC-DC converter during daytime, and during nighttime, the second terminal of the resistor is connected to the negative electrode of the solar array under control.

In this structure, the resistor included in the DCV detection circuit and the resistor having the resistance equivalent to the resistance of the DCV detection circuit allow, at least during the nighttime, the potential obtained by dividing the potential of the DC voltage across the positive electrode and the negative electrode of the inverter to be the potential at the negative electrode of the solar array. Thus, the potential at the negative electrode of the solar array can be higher than the potential at the negative electrode of the inverter in a more reliable manner.

In a first aspect, the potential adjustment section includes a circuit configuration including disconnectors that electrically disconnect the solar array from the input terminal of the DC-DC converter, between the positive electrode of the solar array and a positive electrode of the input terminal of the DC-DC converter, and between the negative electrode of the solar array and a negative electrode of the input terminal of the DC-DC converter.

This structure can electrically disconnect the solar array and the input terminal of the DC-DC converter during the nighttime, and allows the potential at the negative electrode of the solar array to be higher than the potential at the negative electrode of the inverter in a more reliable manner. In this structure, the disconnectors may be metal-oxide-semiconductor field-effect transistors. The disconnectors may include relays placed in parallel with the metal-oxide-semiconductor field-effect transistors.

The DC-DC converter may include resistors between a positive electrode of the output terminal and a negative electrode of the output terminal, and an intermediate section between the resistors, the negative electrode of the solar array, and one of the disconnectors connected to the negative electrode may be electrically connected.

This structure can electrically disconnect the solar array and the input terminal of the DC-DC converter during the nighttime, and allows the potential at the negative electrode of the solar array to be the potential obtained by dividing the potential of the DC voltage across the positive electrode and the negative electrode of the inverter. Thus, the potential at the negative electrode of the solar array can be higher than the potential at the negative electrode of the inverter in a more reliable manner.

The solar array may be a solar module array including a plurality of solar panels connected in series or in parallel. Another aspect provides a DC-DC converter included in the distributed power system. Another aspect may be a power conditioner to be used in the distributed power system.

Advantageous Effects

Embodiments may prevent reduction in the solar module performance caused by PID.

BRIEF DESCRIPTION OF THE DRAWINGS

FIG. 20 is a comparison table showing the potentials to ground and the influence of PID in embodiments and the comparative examples.

FIGS. 35A and 35B are diagrams each showing the circuit configuration of a distributed power system according to modification 3-5.

FIGS. 37A and 37B are diagrams each showing the circuit configuration of a distributed power system according to modification 3-7.

DETAILED DESCRIPTION

Specific embodiments of the present technique will now be described with reference to the drawings.

First Embodiment

Figure 1:
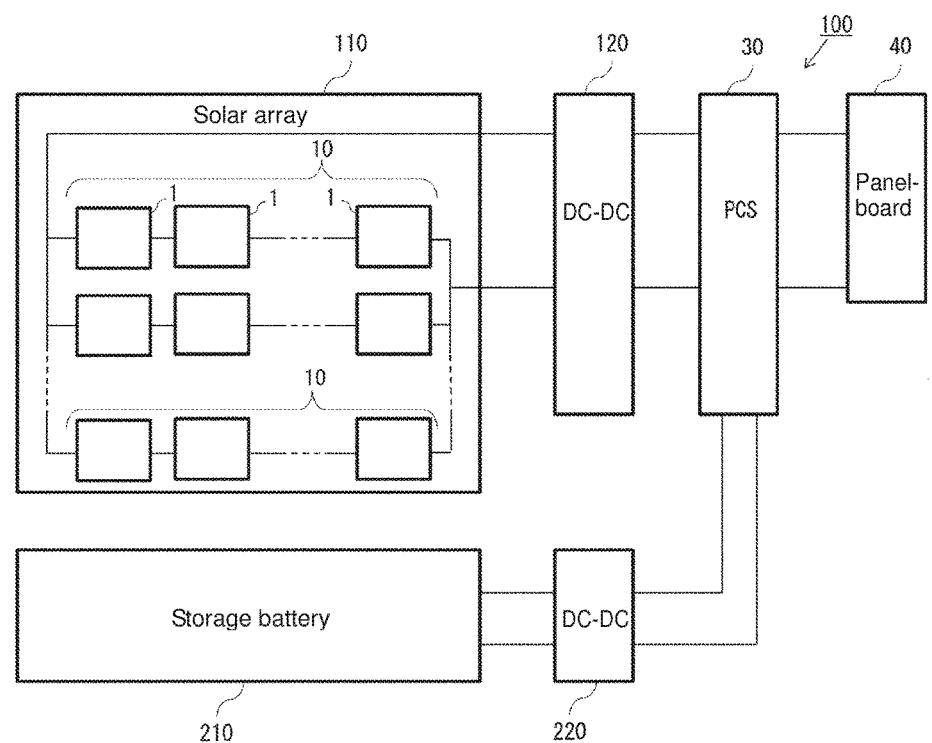
FIG. 1 is a diagram showing the configuration of a distributed power system according to a first embodiment.

FIG. 1 is a diagram showing the configuration of a distributed power system according to a first embodiment. In FIG. 1, a distributed power system 100 includes a solar array 110, a storage battery 210, DC-DC converters 120 and 220, and a power conditioner (also a power conditioning system, PCS) 30. The distributed power system 100 is connected to the utility grid or a load via a panelboard 40.

Figure 48:
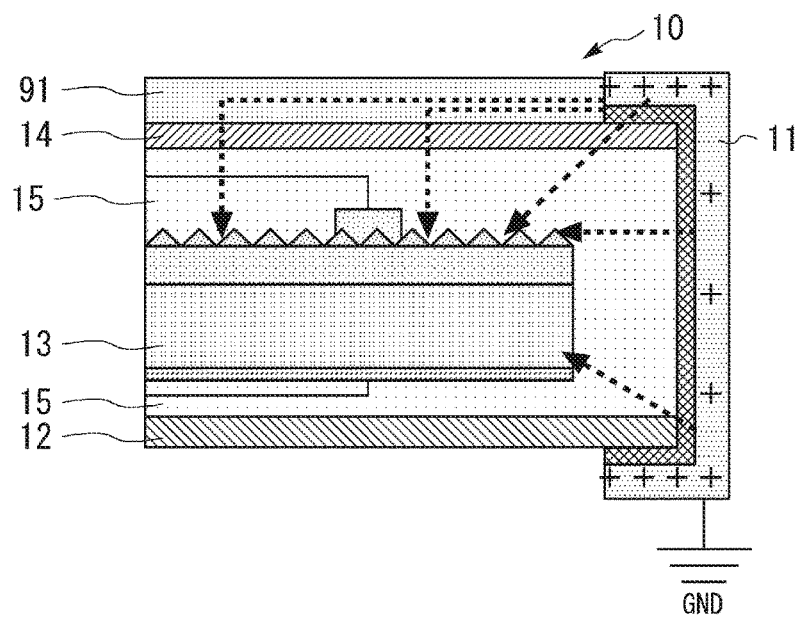
FIG. 48 is a schematic diagram showing a solar module structure.

The solar array 110 includes multiple solar modules 1 connected in series, which form multiple solar module strings 10 connected in parallel. Each solar module 1 converts sunlight energy into electric energy with the photovoltaic effect, and outputs the resulting energy as direct-current power. The solar module 1 has a known structure as shown in, for example, FIG. 48, and includes a frame 11 holding a panel in which a cell 13 is sealed between a glass sheet 14 and a back-sheet 12. Although FIG. 48 shows one cell 13 as an example, the solar module 1 includes multiple cells 13 connected in series through an electrode pattern, and the multiple sets of the serially connected cells 13 are connected in parallel. The cells 13 are connected to an output terminal (not shown) of the solar module 1, and the power generated in each cell 13 is output from the output terminal. The frame 11 is grounded separately from the internal circuit of the cell 13, and the cell 13 has a potential difference (potential to ground) between the cell 13 and the frame 11. This prevents potential induced degradation (PID) from being caused by the potential to ground as described later.

The DC-DC converter 120 converts the voltage of the output from the solar array 110 (raises the voltage in this example) to a predetermined voltage, and feeds the resulting power to the power conditioner 30.

The storage battery 210 is a secondary battery such as a lithium-ion battery, and stores the power fed by the solar array 110 and the utility grid. The storage battery 210 also discharges the stored power into a load during the nighttime or in the event of power shortage.

The DC-DC converter 220 converts the voltage of the electric power discharged from the storage battery 210 (raises the voltage in this example) to a predetermined voltage, and feeds the resulting power to the power conditioner 30. The DC-DC converter 220 also receives the power fed from the solar array 110 and the utility grid via the power conditioner 30. The DC-DC converter 220 converts the voltage of the power received from the power conditioner 30 (lowers the voltage in this example) to a predetermined voltage, and feeds the resulting power to the storage battery 210 for charging.

The power conditioner 30 includes an inverter that converts the DC power fed from the DC-DC converter 120 or 220 into AC power, and feeds the resulting power to the utility grid or a load. Conversely, the inverter converts the AC power from the utility grid into DC power, and feeds the resulting power to the DC-DC converter 220. The power conditioner 30 also includes a utility grid-connection relay for controlling the connection (interconnection) to and disconnection from the utility grid.

Figure 2:
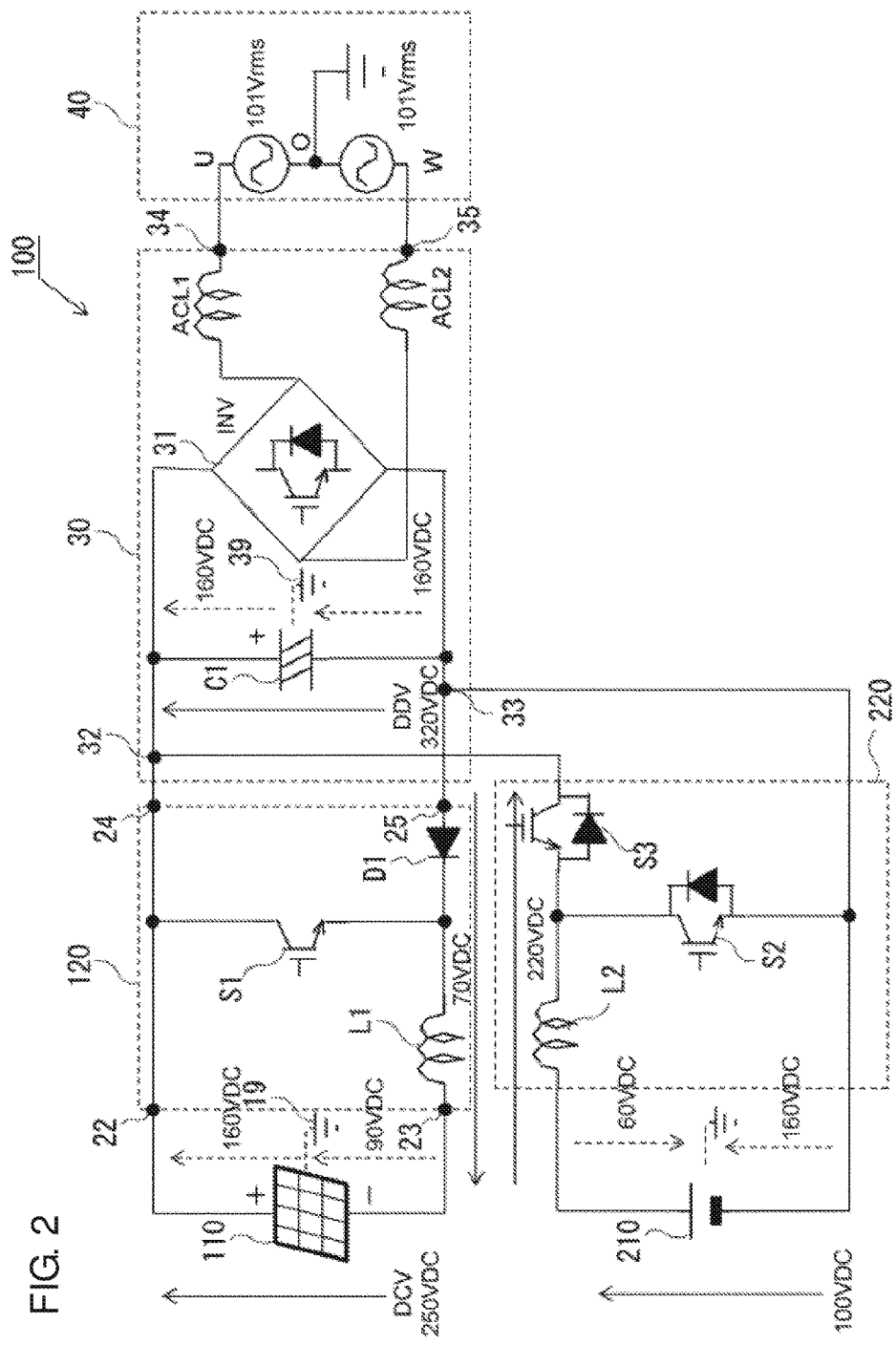
FIG. 2 is a diagram showing the circuit configuration of a distributed power system according to a first embodiment (during the daytime).
Figure 3:
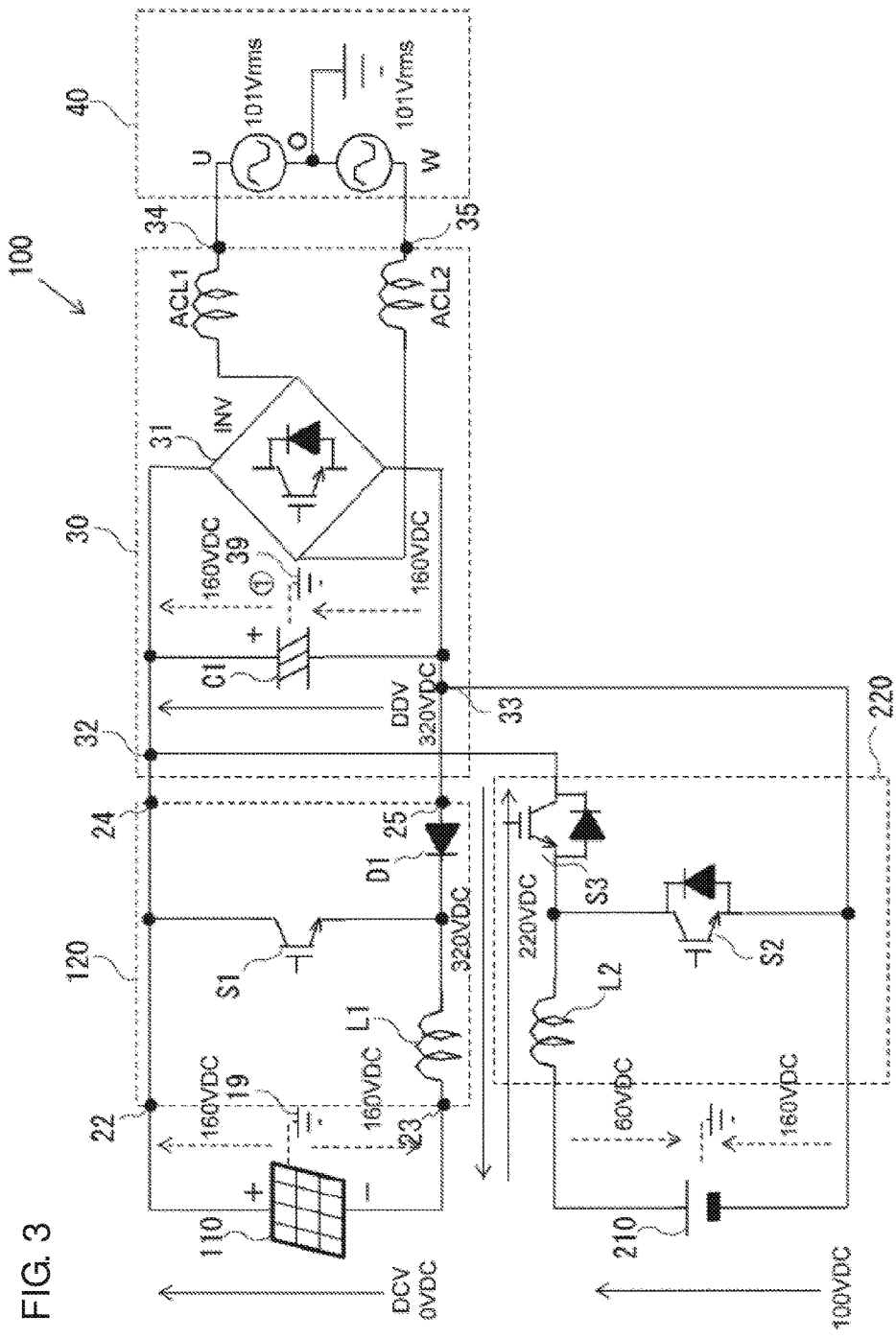
FIG. 3 is a diagram showing the circuit configuration of a distributed power system according to a first embodiment (during the nighttime).

FIGS. 2 and 3 are diagrams each showing the circuit configuration of the distributed power system 100 according to a first embodiment. FIG. 2 shows the system state during the daytime. FIG. 3 shows the system state during the nighttime.

The DC-DC converter 120 connected to the solar array 110 is a non-isolated boost circuit including a reactor L1, a step-up switching element S1, and a diode D1.

The reactor L1 has one terminal connected to the negative electrode of the solar array 110, and the other terminal connected to the cathode of the diode D1 and the lower-potential terminal of the switching element S1.

The diode D1 has the cathode connected to the reactor L1 and the lower-potential terminal of the switching element S1, and the anode connected to the negative electrode of the output terminal of the DC-DC converter 120. More specifically, the reactor L1 and the diode D1 are connected in series in the negative line of the DC-DC converter 120.

The switching element S1 is connected in parallel with the solar array 110. The higher-potential terminal of the switching element S1 is connected to the positive electrode of the solar array 110 and the positive electrode of the output terminal of the DC-DC converter 120.

The switching element S1 may be, for example, a switch device such as a metal-oxide-semiconductor (MOS) field effect transistor or an insulated gate bipolar transistor (IGBT).

The DC-DC converter 120 raises the DC voltage (e.g., 250 V) input from the solar array 110 to a predetermined voltage (e.g., 320 V) and outputs the resulting voltage to the power conditioner 30 through the switching operation performed by the switching element S1.

The DC-DC converter 220 connected to the storage battery 210 includes a reactor L2 and step-up/down switching elements S2 and S3. The DC-DC converter 220 may also include diodes each connected in inverse parallel to the switching elements S2 and S3.

The reactor L2 has one terminal connected to the positive electrode of the storage battery 210, and the other terminal connected to one terminal of each of the switching elements S2 and S3.

The switching element S2 is connected in parallel with the storage battery 210. The lower-potential terminal of the switching element S2 is connected to the negative electrode of the storage battery 210 and the negative electrode of the power conditioner 30, whereas the higher-potential terminal is connected to the reactor L2 and the switching element S3.

The switching element S3 has one terminal connected to the positive electrode of the power conditioner 30, and the other terminal connected to the reactor L2 and the switching element S2.

The DC-DC converter 220 raises the DC voltage (e.g., 100 V) discharged from the storage battery 210 to a predetermined voltage (e.g., 320 V), and outputs the resulting voltage to the power conditioner 30 through the switching operation performed by the switching elements S2 and S3. The DC-DC converter 220 also lowers the DC voltage (e.g., 320 V) from the power conditioner 30 to a predetermined voltage (e.g., 100 V), and feeds the resulting power to the storage battery 210 for charging.

The power conditioner 30 includes a capacitor C1, an inverter 31, and AC reactors ACL1 and ACL2.

The capacitor C1 is a filter circuit connected between the positive and negative electrodes for DC in the power conditioner 30. The filter circuit smooths the noise components in the DC voltage input from the solar array 110 through the DC-DC converter 120.

The inverter 31 converts the DC power from the solar array 110 and the storage battery 210 into AC power, and outputs the resulting power through the AC reactors ACL1 and ACL2. The inverter 31 also converts the AC power from the utility grid into DC power, and outputs the resulting power via the positive and negative electrodes 32 and 33 for DC.

A DC-DC converter known in the art includes a negative line as a common line, and a positive line connected to a reactor and a diode. The DC-DC converter 120 in the distributed power system 100 according to a first embodiment has the negative line connected to the reactor L1 and the diode D1, and the positive line of the DC-DC converter 120 that is common. The potential to ground of the solar array 110 is thus equal to the potential to ground at the positive electrode of the power conditioner 30. In an example shown in FIG. 2, when the potential difference between the positive and negative electrodes 32 and 33 for DC in the power conditioner 30 is 320 V and the potential at the positive electrode 32 is +160 V relative to the ground 39, the potential at the positive electrode of the solar array 110 is +160 V relative to the ground 19. During the daytime, when the solar array 110 generates power until, for example, the potential difference between the positive and negative electrodes is 250 V, the potential at the negative electrode relative to the ground 19 (potential to ground) is −90 V. The solar module 1 thus has the negative potential to ground at the negative electrode, and may involve PID for a cell 13 including a p-type semiconductor. However, this potential to ground has a lower likelihood of PID than in the known structure in which the potential to ground becomes −160 V, which is equal to the potential to ground at the negative electrode of the power conditioner 30, when the negative line is used as a common line.

During the nighttime when the solar array 110 generates no power, the potential difference between the positive and negative electrodes of the solar array 110 is 0 V as shown in FIG. 3. In a first embodiment, however, the utility grid-connection relay remains turned on and connected to the utility grid and the load for charging and discharging the storage battery 210. As in the daytime example shown in FIG. 2, the potential difference between the positive and negative electrodes 32 and 33 for DC in the power conditioner 30 is 320 V, and the potential at the positive electrode 32 relative to the ground 39 is +160 V. Thus, the potential at the positive electrode of the solar array 110 is also +160 V relative to the ground 19. When the solar array 110 generates no power and has no potential difference between the positive and negative electrodes, the potential to ground of each solar module 1 is equally +160 V, and thus the potential at the negative electrode (potential to ground) is +160 V, which is higher than the potential at the negative electrode of the inverter 31. In other words, the circuit configuration including a positive line as a common line and a negative line to which the reactor L1 and the diode D1 are connected in series in the DC-DC converter 120 is a potential adjustment section in a first embodiment.

In this manner, each solar module 1 has a positive potential to ground, and thus a cell 13 including a p-type semiconductor has no likelihood of PID during the nighttime. If PID reduces the performance during the daytime, the performance can recover during the nighttime.

Comparison with Other Structure Examples

PID prevention enabled by the distributed power system 100 according to a first embodiment will now be described in comparison with other structure examples.

Figure 4:
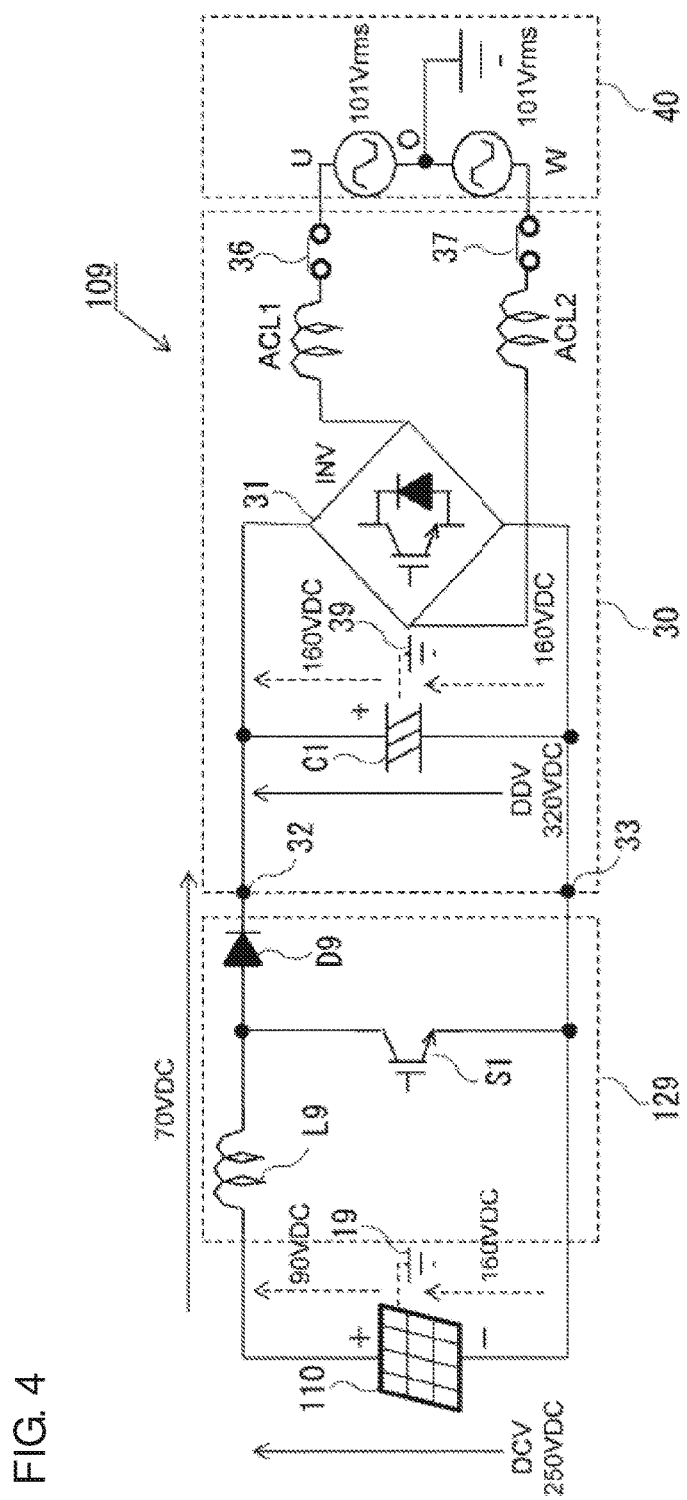
FIG. 4 is a diagram showing the circuit configuration of a distributed power system according to comparative example 1 (during the daytime).
Figure 5:
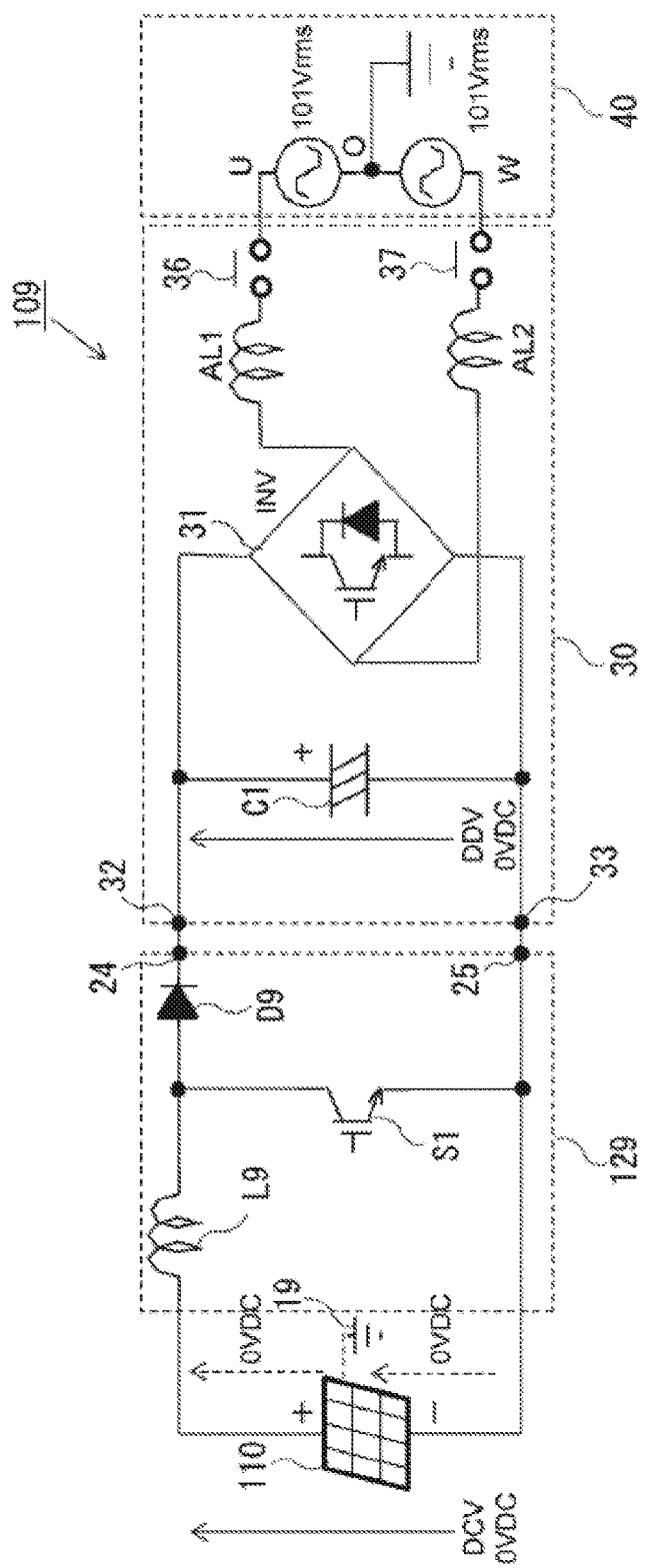
FIG. 5 is a diagram showing the circuit configuration of the distributed power system according to comparative example 1 (during the nighttime).
Figure 6:
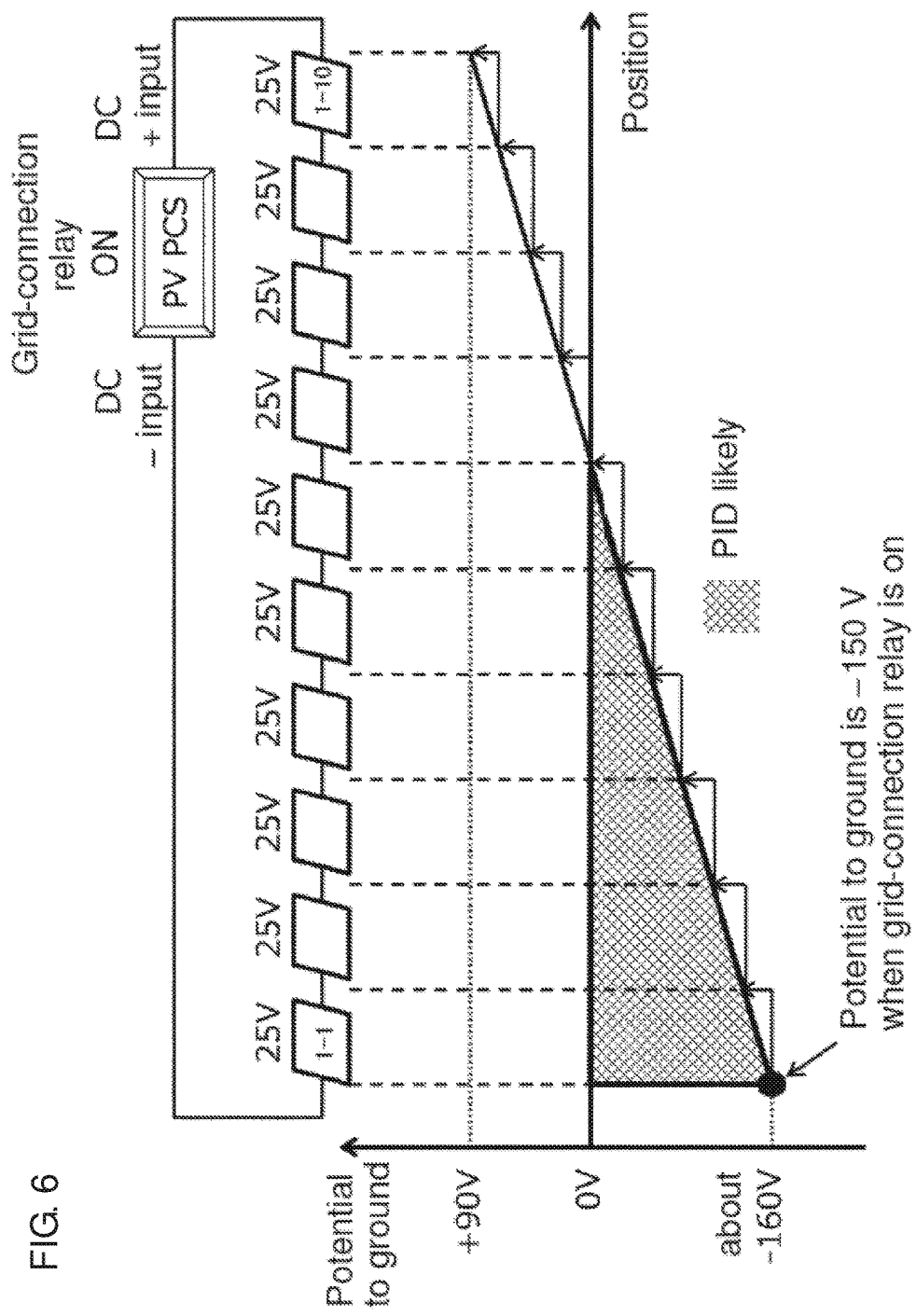
FIG. 6 is a diagram showing potentials to ground during the daytime according to comparative example 1.
Figure 7:
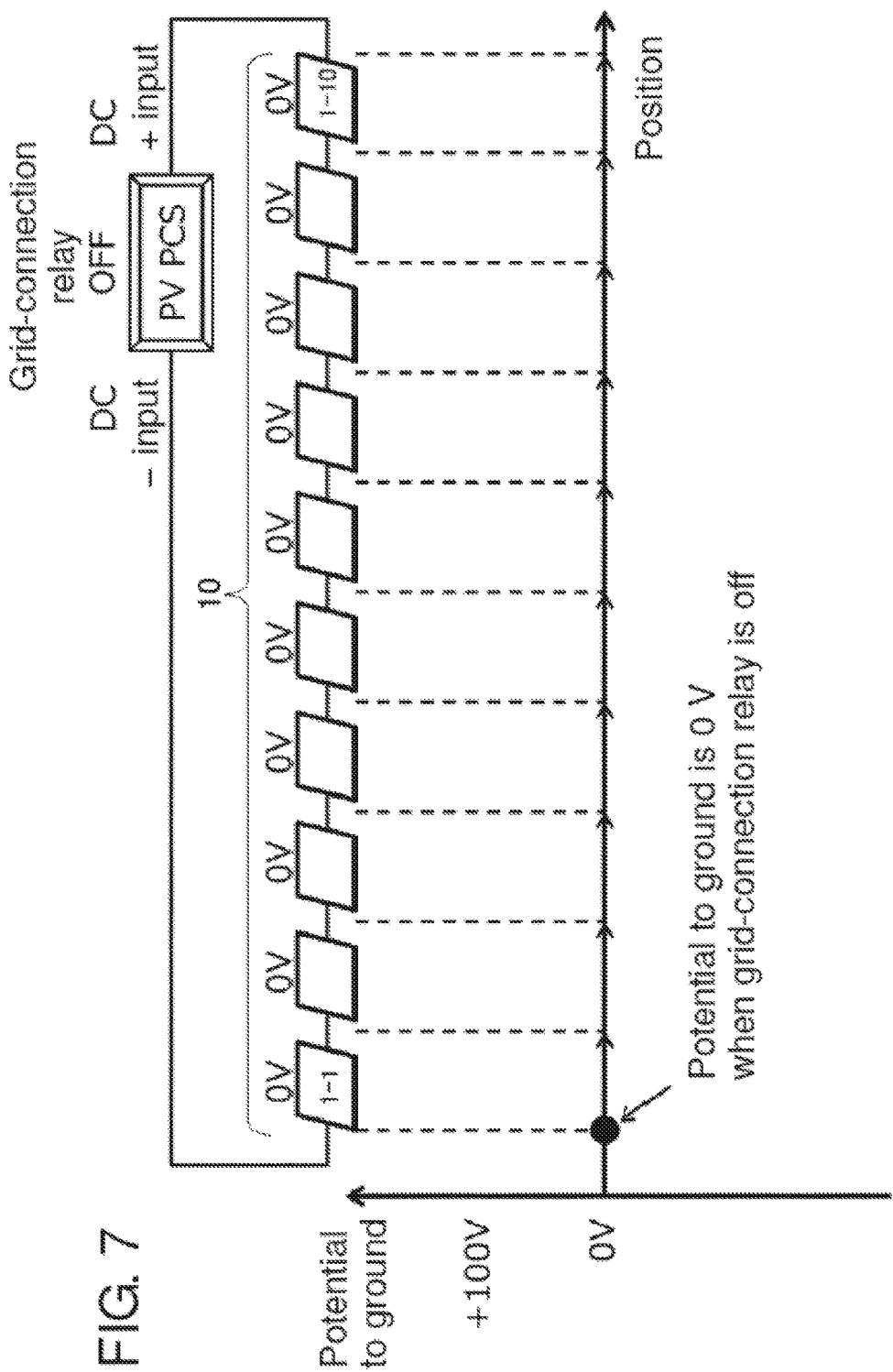
FIG. 7 is a diagram showing potentials to ground during the nighttime according to comparative example 1.

FIGS. 4 and 5 are diagrams each showing the circuit configuration of a distributed power system 109 according to comparative example 1. FIG. 4 shows the system state during the daytime. FIG. 5 shows the system state during the nighttime. FIG. 6 shows the potential to ground during the daytime in comparative example 1. FIG. 7 shows the potential to ground during the nighttime.

The distributed power system 109 in comparative example 1 differs from the distributed power system 100 according to a first embodiment in that no storage battery 210 is connected to the solar array 110 and a DC-DC converter 129 has a common negative line. The same components as those in the distributed power system 100 are given the same reference numerals, and will not be described redundantly.

The DC-DC converter 129 in comparative example 1 is a non-isolated boost circuit including a reactor L9, a step-up switching element S1, and a diode D9.

The reactor L9 has one terminal connected to the positive electrode of the solar array 110, and the other terminal connected to the anode of the diode D9 and the higher-potential terminal of the switching element S1.

The diode D9 has the anode connected to the reactor L9 and the higher-potential terminal of the switching element S1, and the cathode connected to the positive electrode of the output terminal of the DC-DC converter 129.

The switching element S1 is connected in parallel with the solar array 110. The lower-potential terminal is connected to the negative electrode of the solar array 110 and the negative electrode of the output terminal of the DC-DC converter 129.

The DC-DC converter 129 in the distributed power system 109 in comparative example 1 has a positive line to which the reactor L9 and the diode D9 are connected, and a negative line as a common line in the DC-DC converter 129. The potential to ground of the solar array 110 is thus equal to the potential to ground at the negative electrode of the power conditioner 30. In an example shown in FIG. 4, when the potential difference between the positive and negative electrodes 32 and 33 for DC in the power conditioner 30 is 320 V and the potential at the negative electrode 33 is −160 V relative to the ground 39, the potential at the negative electrode of the solar array 110 is −160 V relative to the ground 19. During the daytime, when the solar array 110 generates power until, for example, the potential difference between the positive and negative electrodes is 250 V, the positive electrode potential relative to the ground 19 (potential to ground) is +90 V. Thus, solar modules 1 adjacent to the negative electrode have negative potentials to ground as shown in FIG. 6, and the cells 13 each including a p-type semiconductor have a likelihood of PID (in a hatched area in FIG. 6) that may reduce the performance.

During the nighttime when the solar array 110 generates no power, the power conditioner 30 turns off and disconnects grid-connection relays 36 and 37 from the utility grid. The potential to ground of the power conditioner 30 and the solar array 110 thus becomes 0 V.

In this manner, the potential to ground of each solar module 1 is 0 V as shown in FIG. 7, and thus the solar module 1 has no likelihood of PID during the nighttime. If PID reduces the performance during the daytime, the performance may gradually recover during the nighttime.

Figure 8:
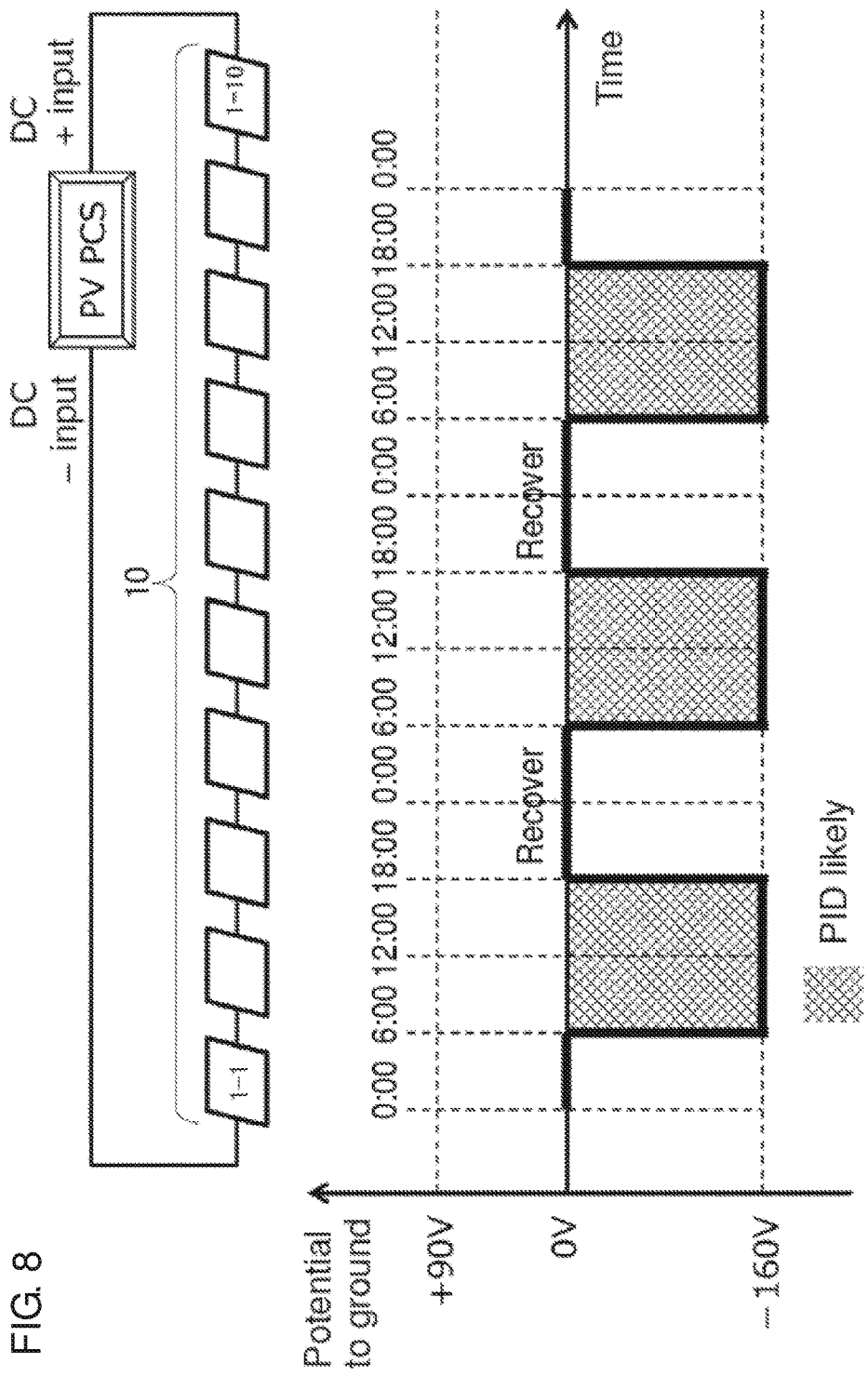
FIG. 8 is a schematic diagram showing the time-varying potential to ground of the solar module nearest the negative electrode in a solar module string.
Figure 9:
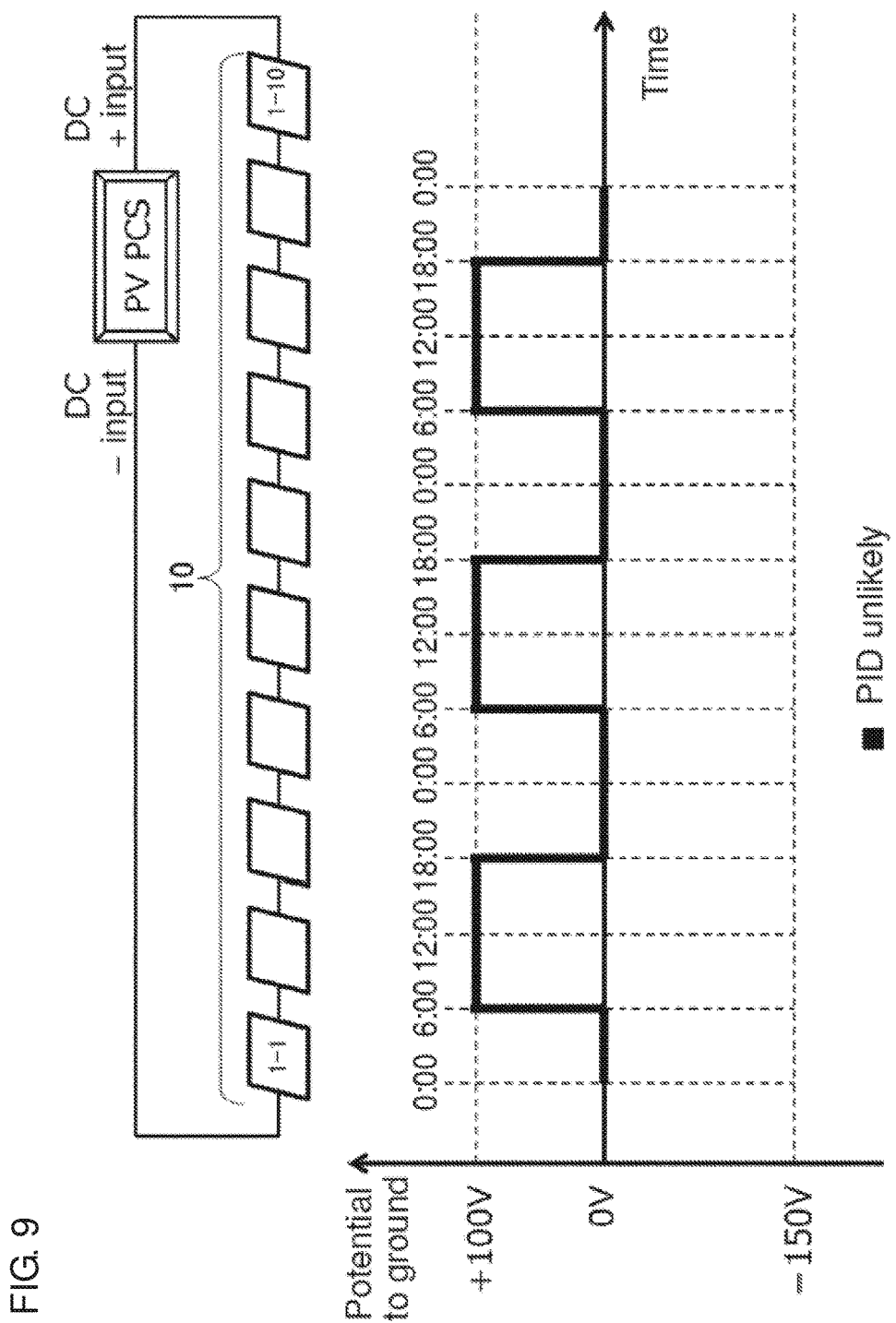
FIG. 9 is a schematic diagram showing the time-varying potential to ground of the solar module nearest the positive electrode in a solar module string.

FIG. 8 is a schematic diagram showing the time-varying potential to ground of a solar module 1-1 nearest the negative electrode in a solar module string 10. FIG. 9 is a schematic diagram showing the time-varying potential to ground of a solar module 1-10 nearest the positive electrode in the solar module string 10.

In the distributed power system 109 in comparative example 1, the solar module 1-1 nearest the negative electrode has a negative potential to ground (e.g., −160 V) as shown in FIG. 8 during the time period in which the solar array 110 generates power, thus increasing the likelihood of PID. In contrast, the solar module 1-1 has a potential to ground being 0 V during the time period in which the solar array 110 generates no power. Thus, the performance reduced by PID recovers gradually.

In the distributed power system 109 in comparative example 1, the solar module 1-10 nearest the positive electrode has a positive potential to ground (e.g., +90 V) as shown in FIG. 9 during the time period in which the solar array 110 generates power, and has no likelihood of PID that may reduce the performance. Additionally, the solar module 1-10 has a potential to ground of 0 V during the time period in which the solar array 110 generates no power, and has no likelihood of PID that may reduce the performance.

Figure 10:
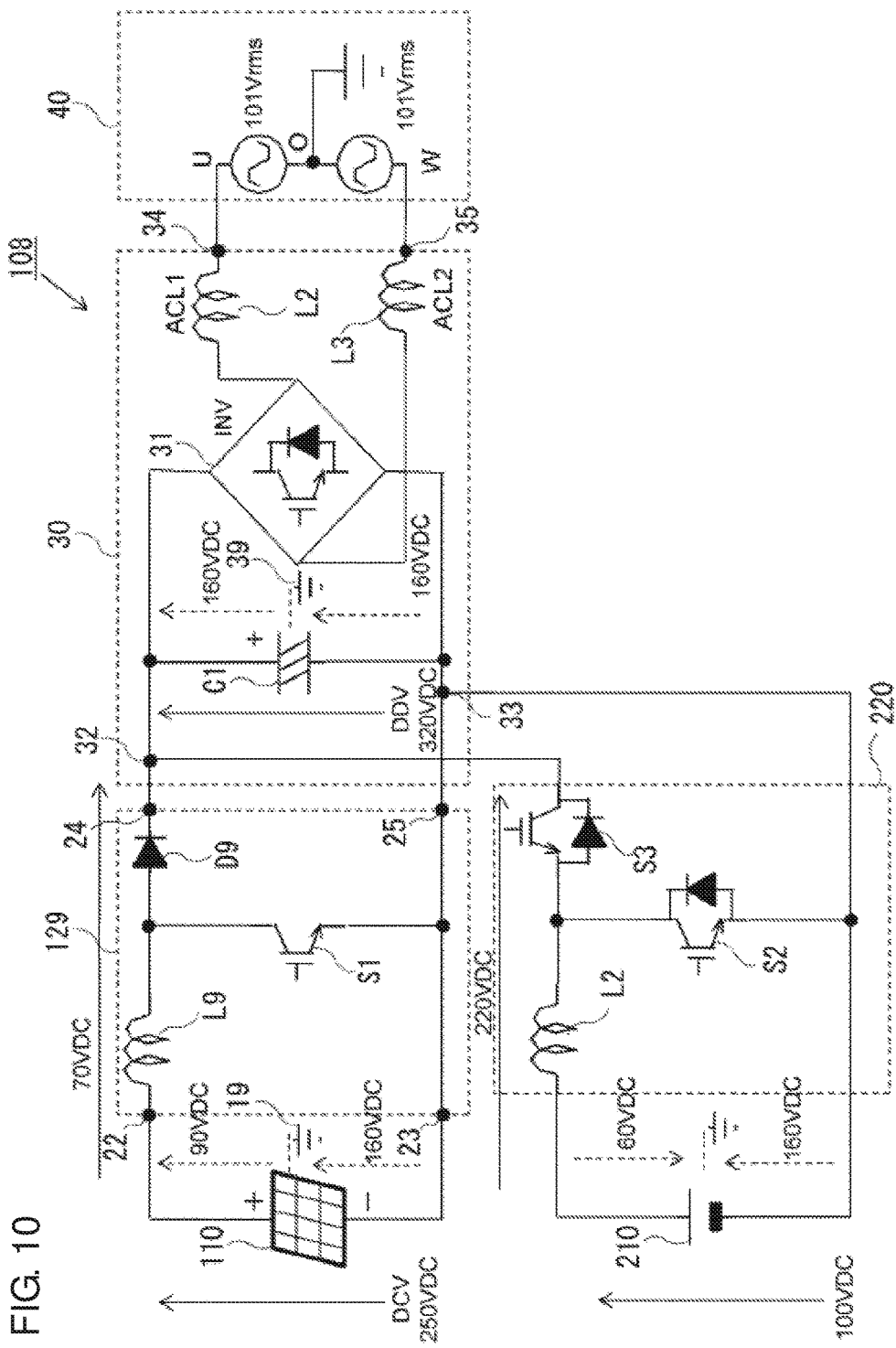
FIG. 10 is a diagram showing the circuit configuration of a distributed power system according to comparative example 2 (during the daytime).
Figure 11:
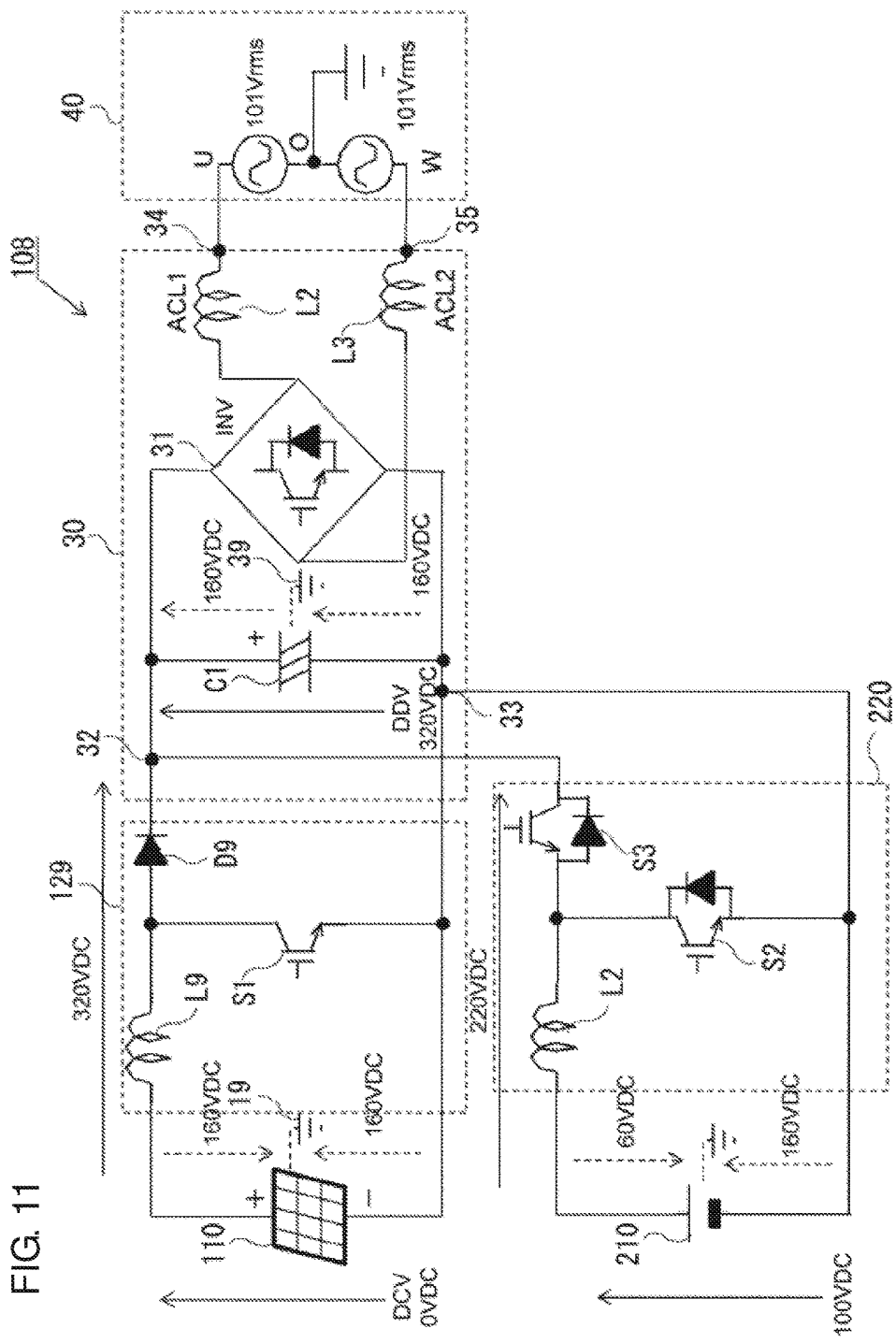
FIG. 11 is a diagram showing the circuit configuration of the distributed power system according to comparative example 2 (during the nighttime).
Figure 12:
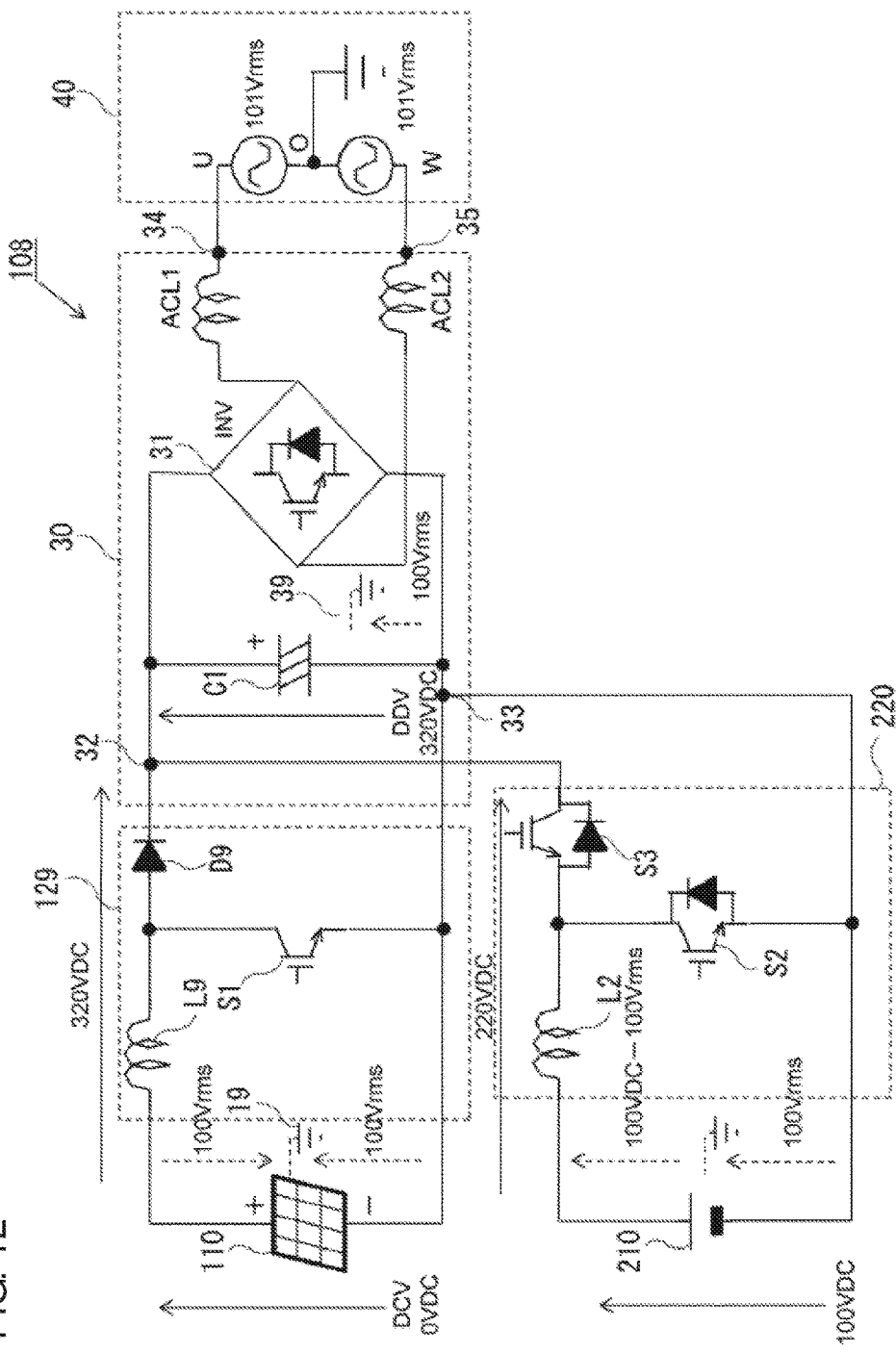
FIG. 12 is a diagram showing the circuit configuration of the distributed power system according to comparative example 2 (during the shutdown).
Figure 13:
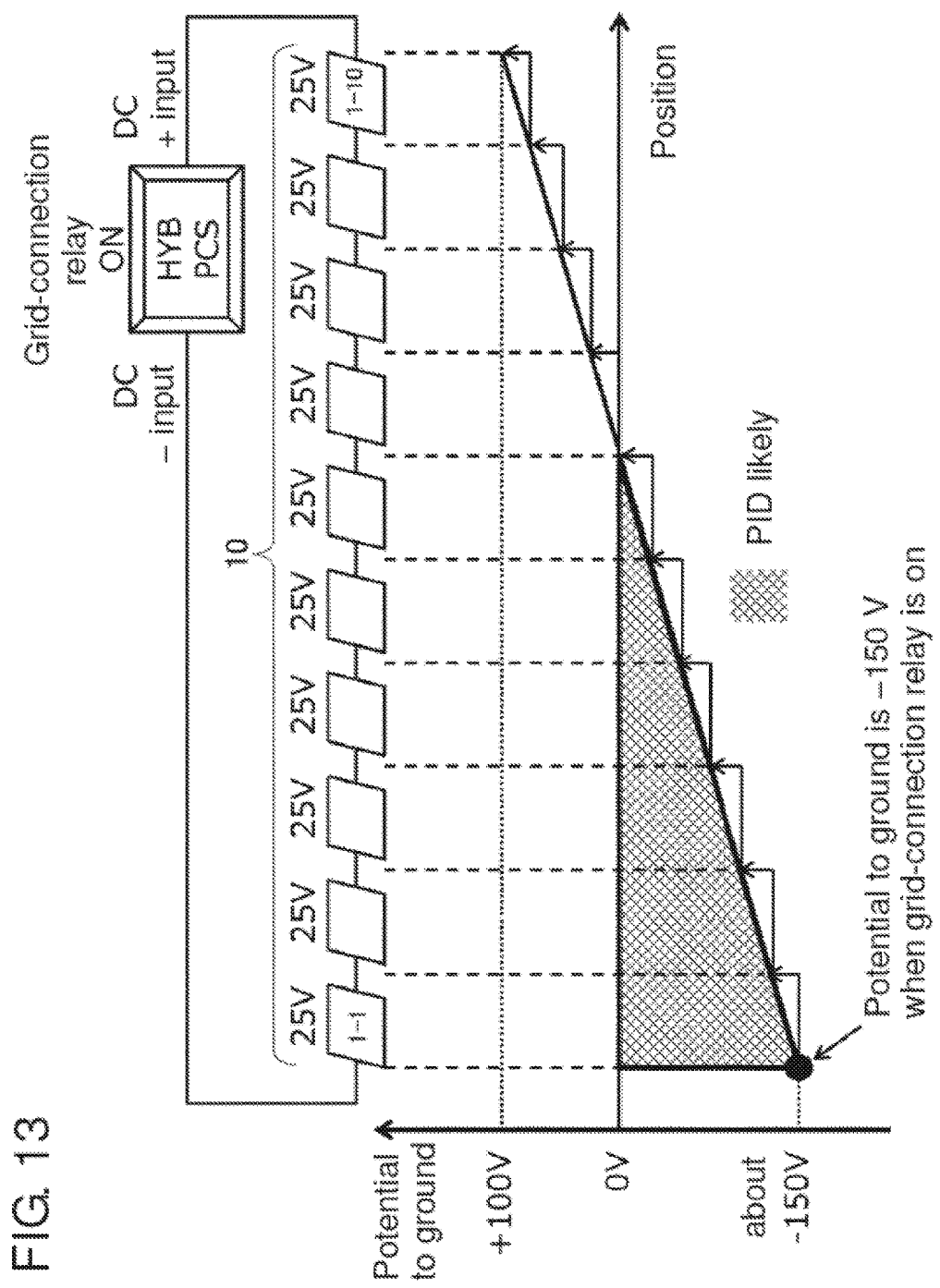
FIG. 13 is a diagram showing potentials to ground during the daytime according to comparative example 2.
Figure 14:
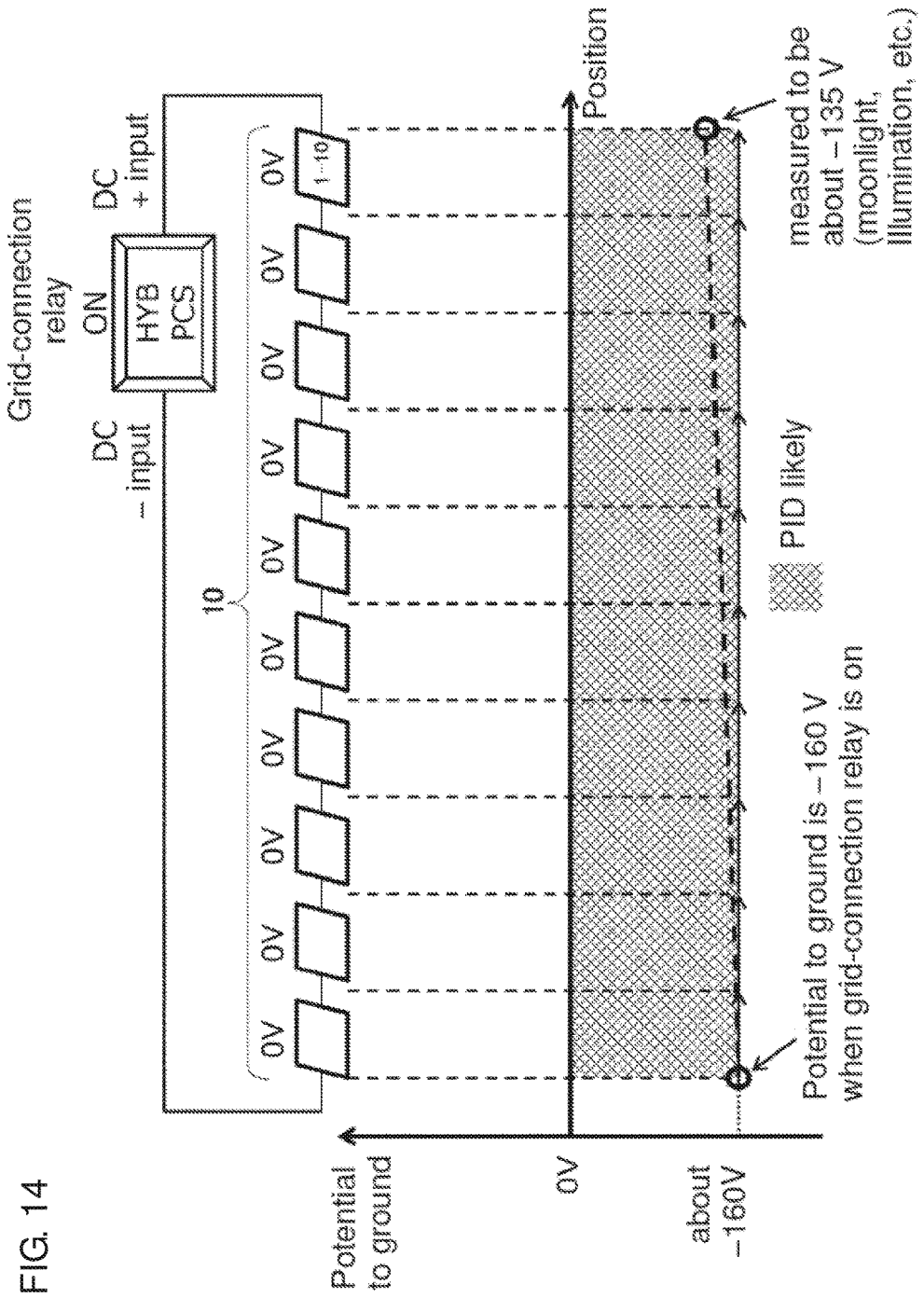
FIG. 14 is a diagram showing potentials to ground during the nighttime according to comparative example 2.
Figure 15:
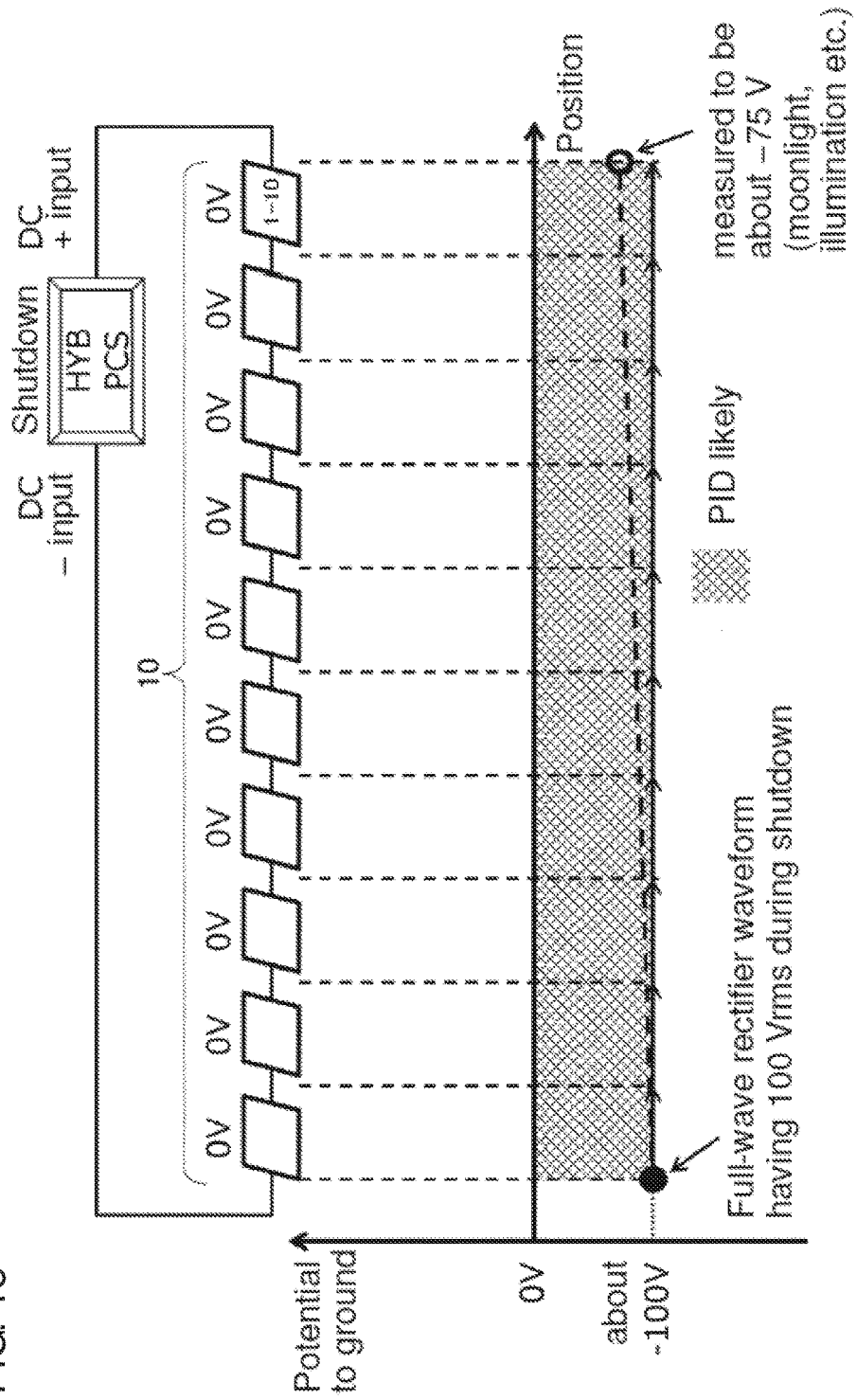
FIG. 15 is a diagram showing potentials to ground during the shutdown according to comparative example 2.

FIGS. 10 to 12 are diagrams each showing the circuit configuration of a distributed power system 108 in comparative example 2. FIG. 10 shows the system state during the daytime. FIG. 11 shows the system state during the nighttime. FIG. 12 shows the system state during the shutdown. FIG. 13 shows the potential to ground during the daytime in comparative example 2. FIG. 14 shows the potential to ground during the nighttime in comparative example 2. FIG. 15 shows the potential to ground during the shutdown in comparative example 2.

The distributed power system 108 in comparative example 2 differs from the distributed power system 100 according to a first embodiment in that a DC-DC converter 129 has a common negative line. The same components as those in the distributed power systems 100 and 109 are given the same reference numerals, and will not be described.

The DC-DC converter 129 in the distributed power system 108 in comparative example 2 has the positive electrode connected to the reactor L9 and the diode D9, and the negative electrode of the DC-DC converter 129 that is common. The potential to ground of the solar array 110 is thus equal to the potential to ground at the negative electrode of the power conditioner 30. In an example shown in FIG. 10, when the potential difference between the positive and negative electrodes 32 and 33 for DC in the power conditioner 30 is 320 V and the potential at the negative electrode 33 is −160 V relative to the ground 39, the potential at the negative electrode of the solar array 110 is −160 V relative to the ground 19. During the daytime, when the solar array 110 generates power until, for example, the potential difference between the positive and negative electrodes is 250 V, the positive electrode potential relative to the ground 19 (potential to ground) is +90 V. Thus, solar modules 1 adjacent to the negative electrode have negative potentials to ground as shown in FIG. 13, and the cells 13 each including a p-type semiconductor have a likelihood of PID (in a hatched area in FIG. 13) that may reduce the performance.

During the nighttime when the solar array 110 generates no power, the potential difference between the positive and negative electrodes of the solar array 110 is 0 V as shown in FIG. 11. In comparative example 2, however, the utility grid-connection relay remains turned on and connected to the utility grid and the load for charging and discharging the storage battery 210. As in the daytime, the potential difference between the positive electrode 32 and the negative electrode 33 for DC in the power conditioner 30 is 320 V, and the potential at the negative electrode 33 relative to the ground 39 is −160 V. Thus, the potential at the negative electrode of the solar array 110 is also −160 V relative to the ground 19. When the solar array 110 generates no power and has no potential difference between the positive and negative electrodes, the potential to ground of each solar module 1 is equally −160 V as shown in FIG. 14. The solar module 1 during the nighttime may convert moonlight or illumination into power (e.g., 25 V). In that case, the potential to ground at the positive electrode may be about −135 V.

In this manner, each solar module 1 has a negative potential to ground. Thus, the cells 13 each including a p-type semiconductor have a likelihood of PID (in a hatched area in FIG. 14) that may reduce the performance.

In the distributed power system 108, the potential at the negative electrode 33 of the power conditioner 30 is −100 V rms (theoretical value) relative to the ground 39 during the night shutdown as shown in FIG. 12. Thus, the potential at the negative electrode of the solar array 110 is also −100 V rms relative to the ground 19. When the solar array 110 generates no power and has no potential difference between the positive and negative electrodes, the potential to ground of each solar module 1 is equally −100 V rms as shown in FIG. 15.

In this manner, each solar module 1 has a negative potential to ground. Thus, the cells 13 each including a p-type semiconductor have a likelihood of PID (in a hatched area in FIG. 15) that may reduce the performance.

Figure 16:
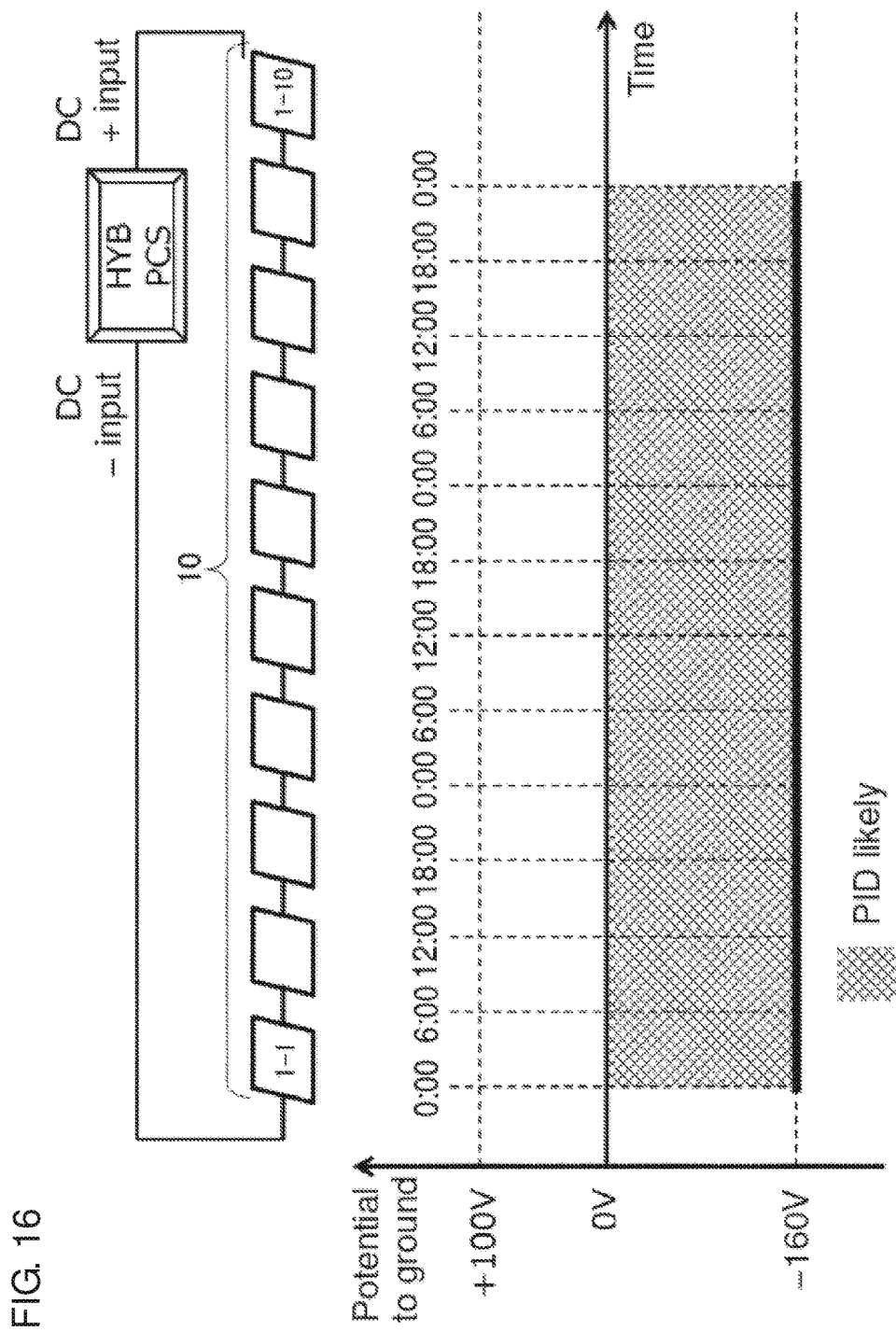
FIG. 16 is a schematic diagram showing the time-varying potential to ground of the solar module nearest the negative electrode in a solar module string according to comparative example 2.
Figure 17:
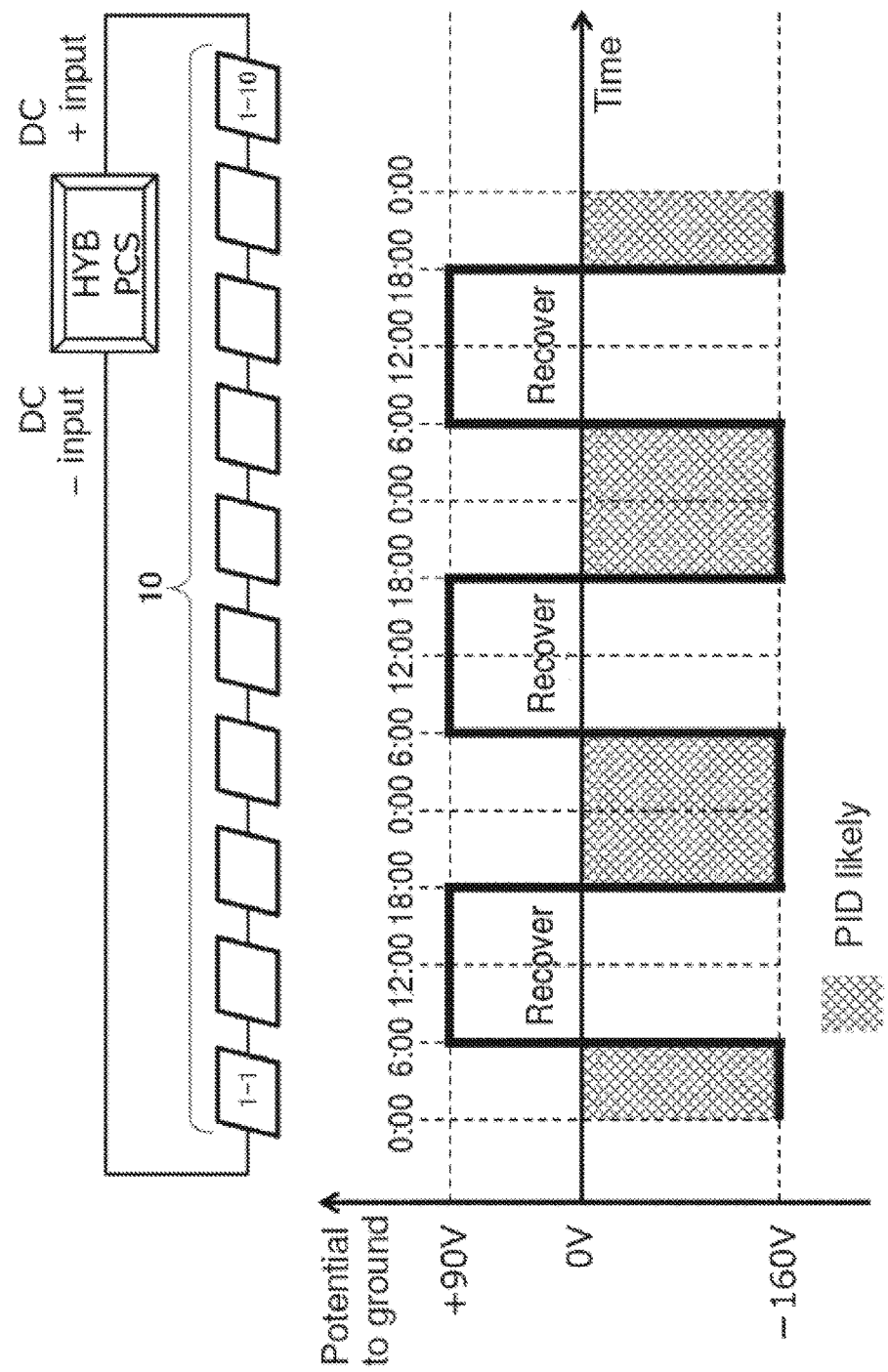
FIG. 17 is a schematic diagram showing the time-varying potential to ground of the solar module nearest the positive electrode in the solar module string.

FIG. 16 is a schematic diagram showing the time-varying potential to ground of the solar module 1-1 nearest the negative electrode in the solar module string 10 according to comparative example 2. FIG. 17 is a schematic diagram showing the time-varying potential to ground of the solar module 1-10 nearest the positive electrode in the solar module string 10.

In the distributed power system 108 in comparative example 2, the solar module 1-1 nearest the negative electrode constantly has a negative potential to ground (e.g., −160 V) as shown in FIG. 16, thus increasing the likelihood of PID.

In the distributed power system 108 in comparative example 2, the solar module 1-10 nearest the positive electrode has a negative potential to ground (e.g., −160 V) during the time period in which the solar array 110 generates no power (nighttime) as shown in FIG. 17, thus increasing the likelihood of PID. In contrast, the solar module 1-10 has a positive potential to ground (e.g., +90 V) during the time period in which the solar array 110 generates power (daytime). Thus, the performance reduced by PID recovers.

Figure 18:
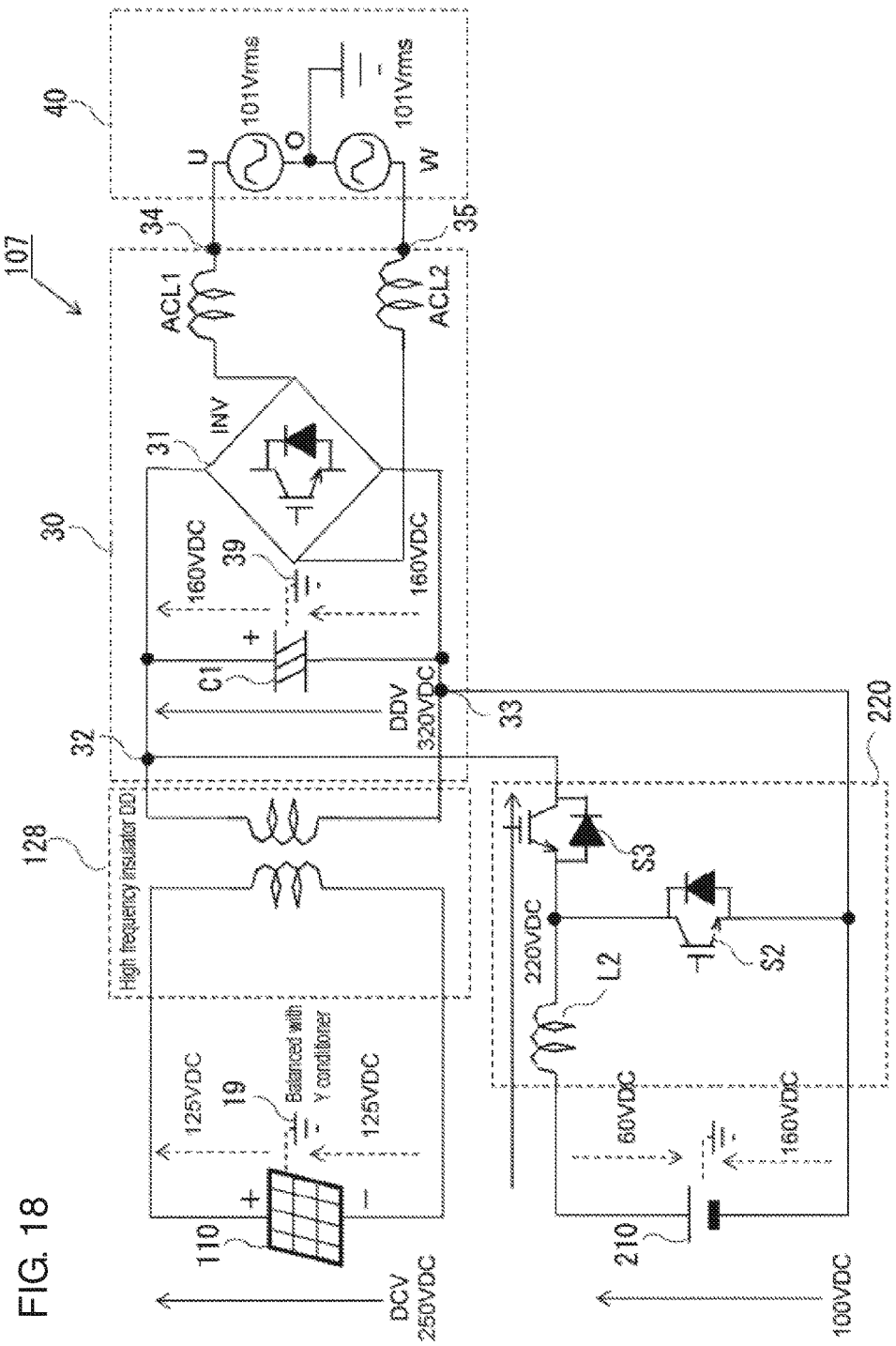
FIG. 18 is a diagram showing the circuit configuration of a distributed power system according to comparative example 3 (during the daytime).
Figure 19:
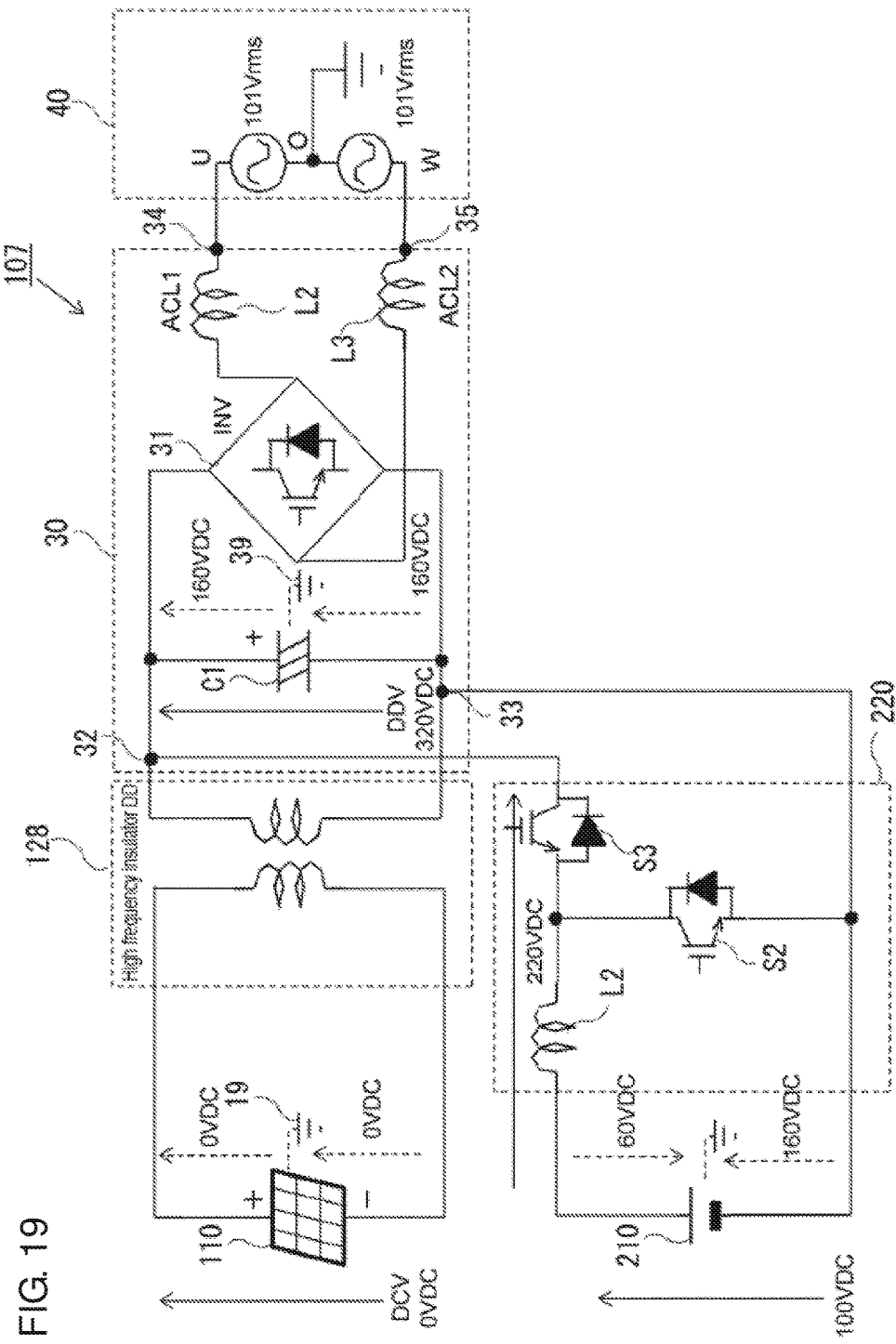
FIG. 19 is a diagram showing the circuit configuration of the distributed power system according to comparative example 3 (during the nighttime).

FIGS. 18 and 19 are diagrams each showing the circuit configuration of a distributed power system 107 according to comparative example 3. FIG. 18 shows the system state during the daytime. FIG. 19 shows the system state during the nighttime.

The distributed power system 107 in comparative example 3 differs from the distributed power system 100 according to a first embodiment in that it includes an isolated DC-DC converter 128. The same components as those in the distributed power system 100 are given the same reference numerals, and will not be described.

In the distributed power system 107 in comparative example 3, the DC-DC converter 128 is an isolated converter including a transformer, and isolates the input of the solar array 110 from the output of the power conditioner 30. This isolation prevents the potential to ground of the solar array 110 from being affected by the output from the power conditioner 30. In an example shown in FIG. 18, when the solar array 110 generates power during the daytime until, for example, the potential difference between the positive and negative electrodes is 250 V, the positive electrode potential relative to the ground 19 (potential to ground) is +125 V, whereas the potential at the negative electrode relative to the ground 19 (potential to ground) is −125 V. Thus, solar modules 1 adjacent to the negative electrode have negative potentials to ground, and the cells 13 each including a p-type semiconductor have a likelihood of PID that may reduce the performance.

During the nighttime when the solar array 110 generates no power, the potential difference between the positive and negative electrodes of the solar array 110 is 0 V as shown in FIG. 19, and is not affected by the output from the power conditioner 30. As a result, both the positive- and negative-electrode potentials relative to the ground 19 are both 0 V, having no likelihood of PID that may reduce the performance during the nighttime. If PID reduces the performance during the daytime, the performance may gradually recover during the nighttime.

FIG. 20 is a comparison table showing the potentials to ground and the influence of PID in distributed power systems with various structures.

As shown in FIG. 20, although some of the solar modules 1 in comparative example 1 are affected by PID during the daytime, the nighttime potential to ground is 0 V. Thus, the performance may gradually restore, and PID causes less problems (rated as B in FIG. 20). However, the system in comparative example 1 includes the solar array 110 as a solitary distributed power supply. In the recent widespread use of photovoltaic systems, the demand is increasing for additional distributed power supplies for not only exporting power generated in the solar array back into the utility grid, but also charging a storage battery that can feed the power during the nighttime. This demand cannot be met by the system in comparative example 1.

The system in comparative example 2 includes the storage battery 210. However, daytime solar modules 1 adjacent to the negative electrode and all the nighttime solar modules 1 have negative voltages to ground. For solar modules 1 each including a p-type semiconductor, the performance reduction caused by PID is notable (rated as C in FIG. 20). In comparative example 2, almost no performance reduction caused by PID is observed for solar modules each including an n-type semiconductor. However, most of the modern solar modules 1 include a p-type semiconductor. In comparative example 2, the system fabricated using an n-type semiconductor is unrealistic.

Although some of the solar modules 1 in comparative example 3 are affected by PID during the daytime, the nighttime potential to ground is 0 V. Thus, the performance may gradually restore, and PID causes less problems. However, the system in comparative example 3 includes the isolated DC-DC converter 128 including a transformer, and thus can be costly.

In a first embodiment, the negative terminal of the solar module 1 has a small negative potential to ground during the daytime, and the potential to ground is positive during the nighttime. Thus, the solar module 1 including a p-type semiconductor substantially prevents PID. Even with PID, the nighttime positive voltage to ground allows the performance reduced by the PID to recover.

Second Embodiment

Figure 21:
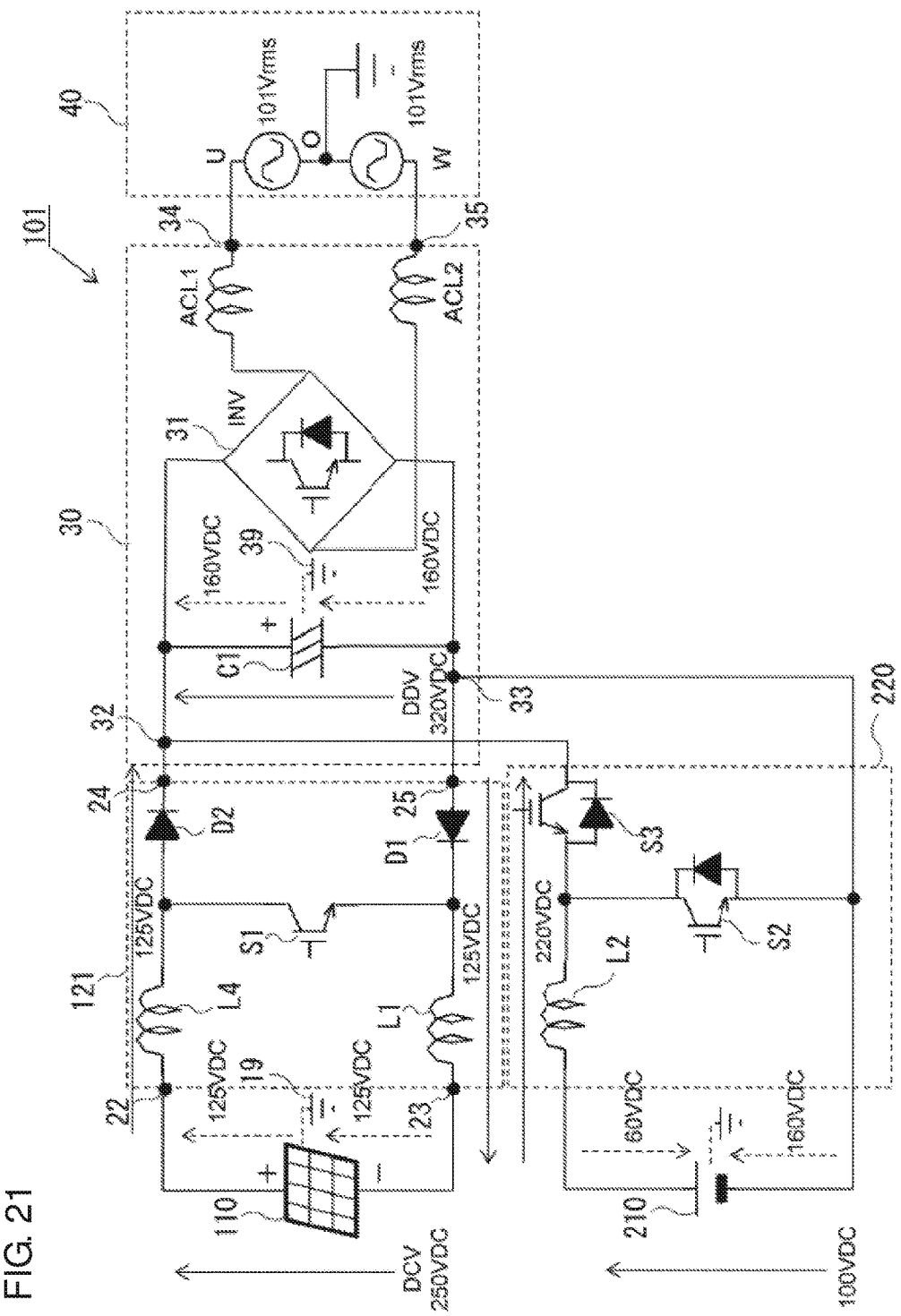
FIG. 21 is a diagram showing the circuit configuration of a distributed power system according to a second embodiment (during the daytime).
Figure 22:
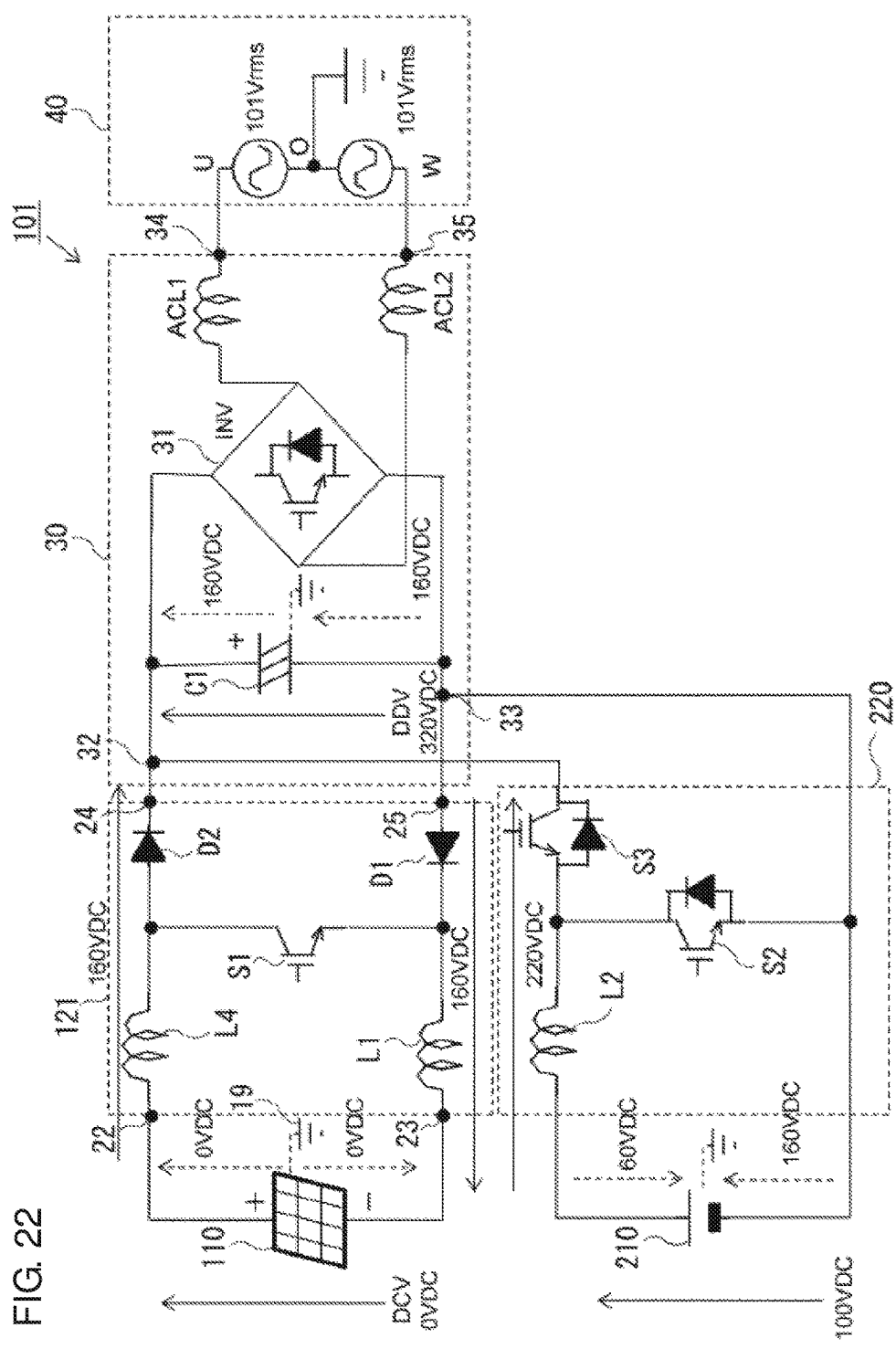
FIG. 22 is a diagram showing the circuit configuration of a distributed power system according to a second embodiment (during the nighttime).

FIGS. 21 and 22 are diagrams each showing the circuit configuration of a distributed power system 101 according to a second embodiment. FIG. 21 shows the system state during the daytime. FIG. 22 shows the system state during the nighttime. The distributed power system 101 according to a second embodiment includes a DC-DC converter 121. The negative line of the DC-DC converter 121 has a reactor L1 and a diode D1, whereas the positive line has a reactor L4 and a diode D2 equivalent to the reactor 1 and the diode D1. In other words, the positive line connected to the positive electrode of the solar array 110 is equivalent to the negative line connected to the negative electrode of the solar array 110. A second embodiment differs from a first embodiment in that it includes the equivalent positive and negative lines, and includes the same other components as in a first embodiment. In a second embodiment, the same components as those in a first embodiment are given the same reference numerals, and will not be described.

As shown in FIGS. 21 and 22, the DC-DC converter 121 in a second embodiment includes, as a potential adjustment section, a reactor (first reactor) L4 and a diode (first diode) D2 in addition to a reactor (second reactor) L1, a step-up switching element S1, and a diode (second diode) D1.

The reactor L4 has one terminal connected to the positive electrode of the solar array 110, and the other terminal connected to the anode of the diode D2 and the higher-potential terminal of the switching element S1.

The diode D2 has the anode connected to the reactor L4 and the higher-potential terminal of the switching element S1, and the cathode connected to the positive electrode of the output terminal of the DC-DC converter 121.

In the distributed power system 101 according to a second embodiment, the positive line of the DC-DC converter 121 connected to the positive electrode of the solar array 110 is equivalent to the negative line connected to the negative electrode of the solar array 110. The positive and negative electrodes of the solar array 110 have an equivalent potential to ground accordingly. As shown in FIG. 21, when the solar array 110 generates power during the daytime until, for example, the potential difference between the positive and negative electrodes is 250 V, the positive- and negative-electrode potentials relative to the ground 19 (potential to ground) are +125 V and −125 V.

During the nighttime when the solar array 110 generates no power and the potential difference between the positive and negative electrodes of the solar array 110 is 0 V as shown in FIG. 22, each of the positive- and negative-electrode potentials relative to the ground 19 (potential to ground) is 0 V.

In the distributed power system 101 according to a second embodiment, although solar modules 1 adjacent to the negative electrode have negative potentials to ground during the daytime, the nighttime voltage to ground is 0 V. This prevents PID from reducing the performance. If the performance decreases during the daytime, the performance can recover during the nighttime. Additionally, the distributed power system 101 has the voltage to ground of 0 V during the nighttime, and thus prevents PID from reducing the performance as shown in FIG. 20, regardless of whether the solar module 1 is of p-type or n-type.

Modification 2-1

Figure 23:
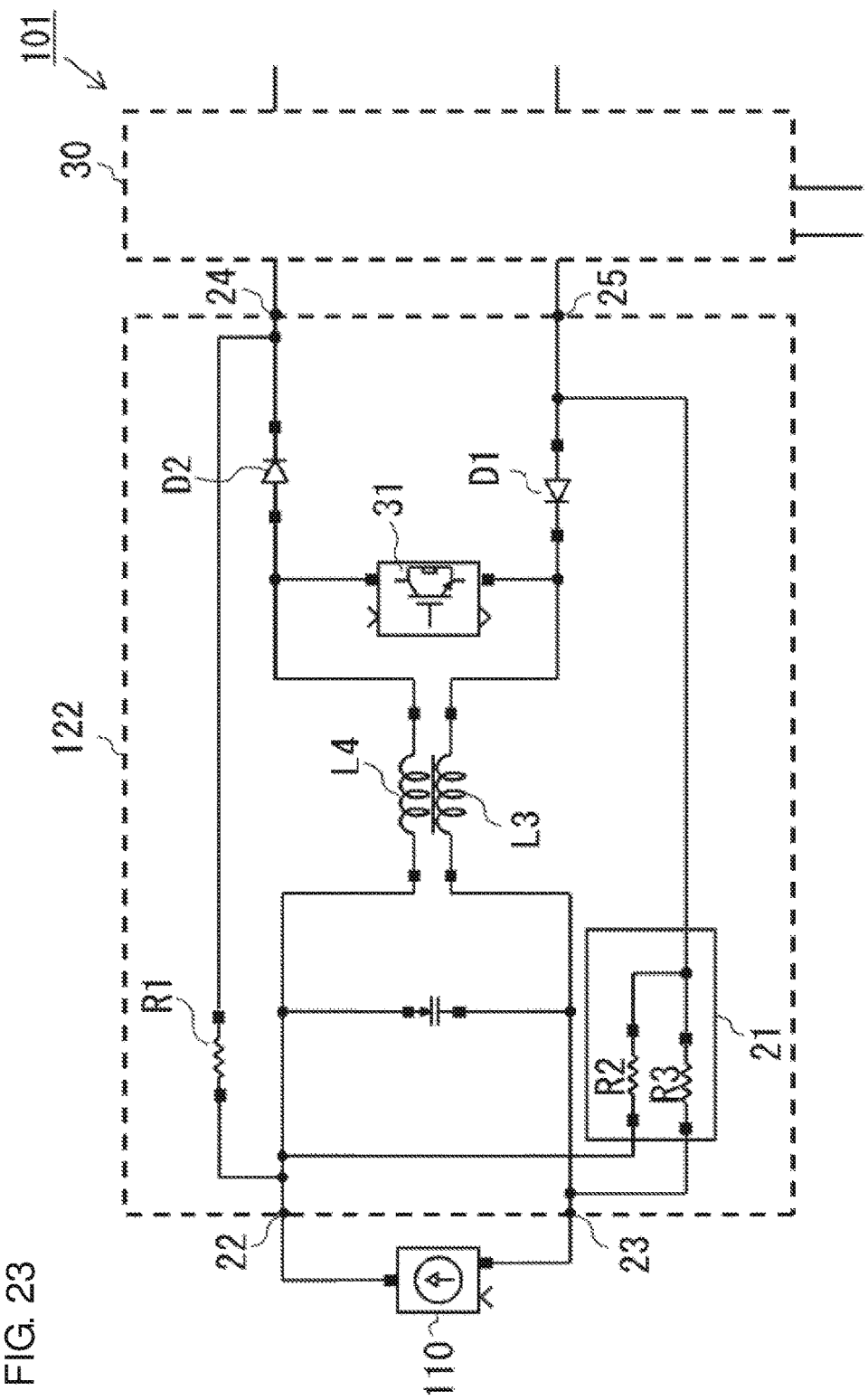
FIG. 23 is a diagram showing the circuit configuration of a distributed power system according to modification 2-1.

FIG. 23 is a diagram showing the circuit configuration of a distributed power system 101 according to modification 2-1.

The distributed power system 101 according to modification 2-1 includes a DCV detection circuit 21 for detecting the DC voltage across the solar array 110, and a resistor R1 equivalent to resistor components R2 and R3 in the DCV detection circuit 21. The system includes the same other components as in a second embodiment, which are given the same reference numerals and will not be described. FIG. 23 mainly shows the circuit configuration of a DC-DC converter 122, and does not show the circuit of the power conditioner 30 or other components such as the storage battery 210.

The DC-DC converter 122 in this example has a potential adjustment section including, as shown in FIG. 23, the resistor R1 between a positive electrode of an input terminal of the DC-DC converter 122 and a positive electrode 24 of an output terminal of the DC-DC converter 122, the resistor R1 having a resistance equivalent to that of the resistor components R2 and R3 of the DCV detection circuit 21. This structure enables the positive and negative electrodes of the input terminal of the DC-DC converter 122 to be equivalent. When the solar array 110 generates power during the daytime and has a potential difference between the positive and negative electrodes as in FIG. 21, each of the positive- and negative-electrode potentials is a positive potential to ground. When the solar array 110 generates no power during the nighttime and the potential difference between the positive and negative electrodes of the solar array 110 is 0 V as in FIG. 22, and each of the positive- and negative-electrode potentials to ground is 0 V.

Modification 2-2

Figure 24:
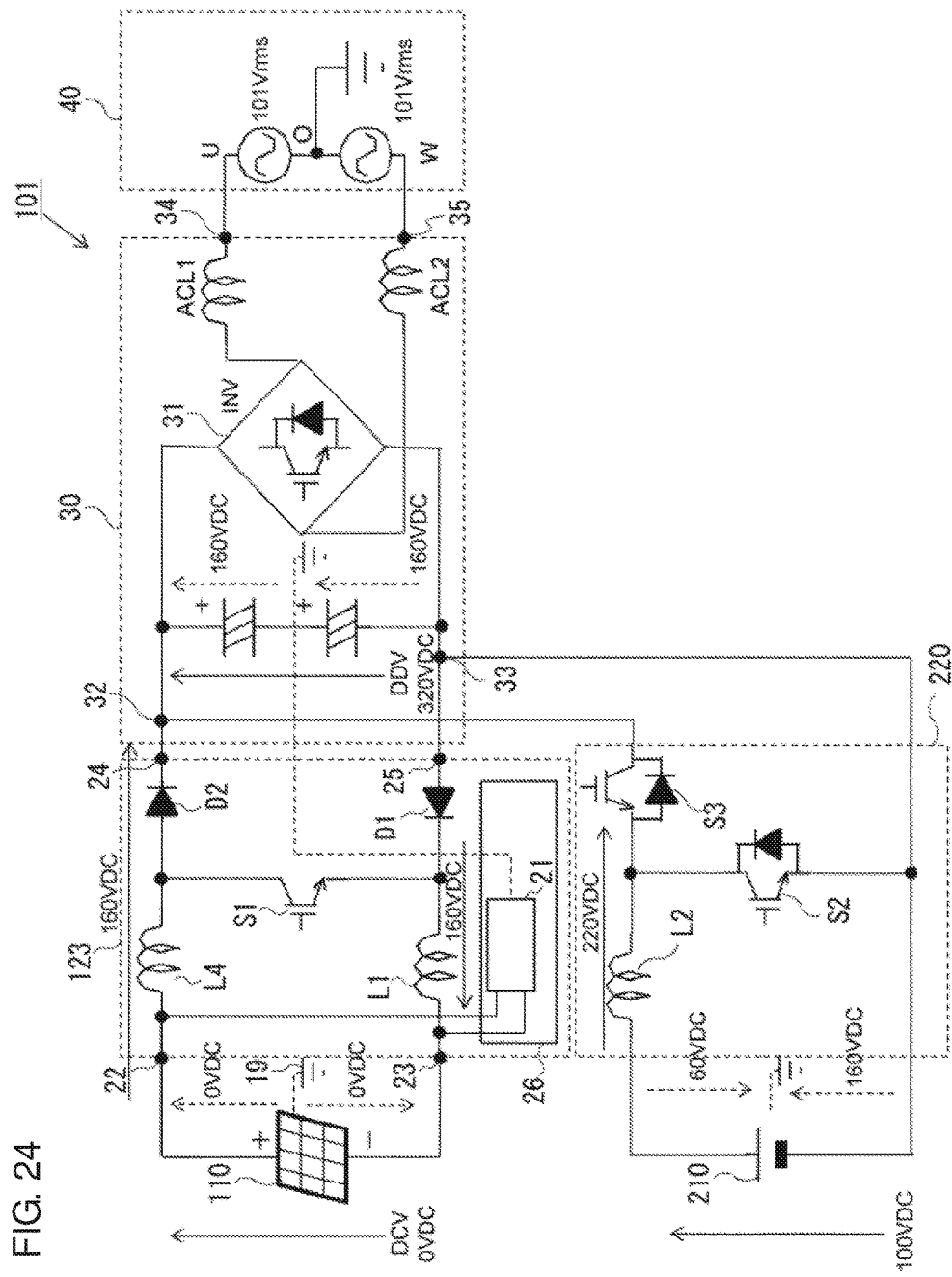
FIG. 24 is a diagram showing the circuit configuration of a distributed power system according to modification 2-2.

FIG. 24 is a diagram showing the circuit configuration of a distributed power system 101 according to modifications 2-2.

A DC-DC converter 123 in modification 2-2 includes a control circuit 26 including a DCV detection circuit 21 for detecting the DC voltage across the solar array 110. The control circuit 26 controls the DC-DC converter 123 based on, for example, a detection value from the DCV detection circuit 21. The control circuit 26 may also include a detector for detecting a short-circuit current from the switching element S1. The switching element S1 is short-circuited at night. At dawn when the solar array 110 receives sunlight and the short-circuit current from the switching element S1 exceeds a predetermined value, the detector may detect the daybreak to switch to, for example, daytime control.

The control circuit 26 has a circuit configuration including GND between the positive electrode 24 and the negative electrode 25 of the output terminal of the DC-DC converter 123 (in this example, at a midpoint). This enables the equivalent positive and negative terminals relative to GND for the DC-DC converter 123. As in FIG. 21, when the solar array 110 generates power during the daytime and has a potential difference between the positive and negative electrodes, each of the positive- and negative-electrode potentials is a positive potential to ground. As in FIG. 22, when the solar array 110 generates no power during the nighttime and the potential difference between the positive and negative electrodes of the solar array 110 is 0 V, and each of the positive- and negative-electrode potentials to ground is 0 V.

Third Embodiment

Figure 25:
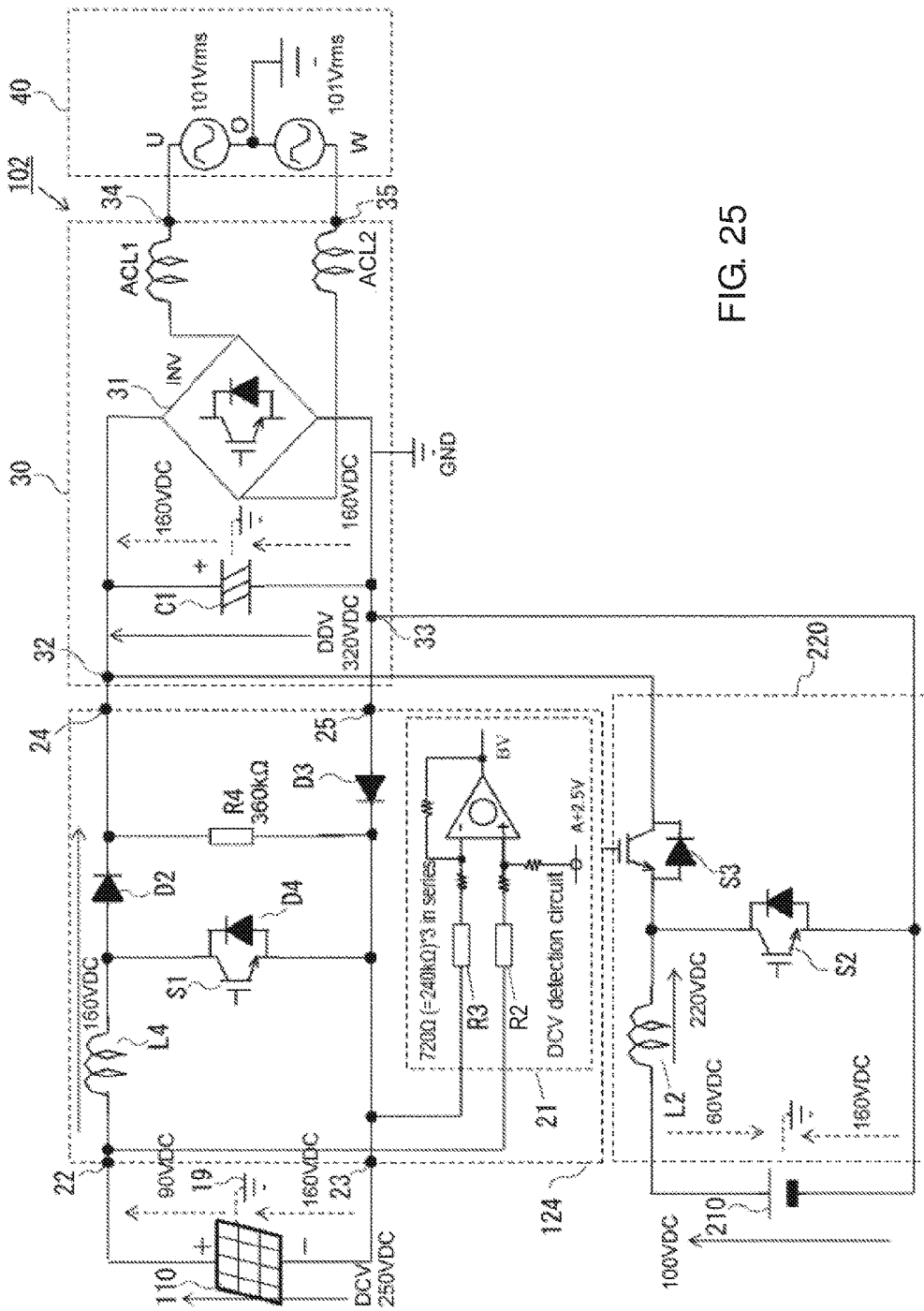
FIG. 25 is a diagram showing the circuit configuration of a distributed power system according to a third embodiment (during the daytime).
Figure 26:
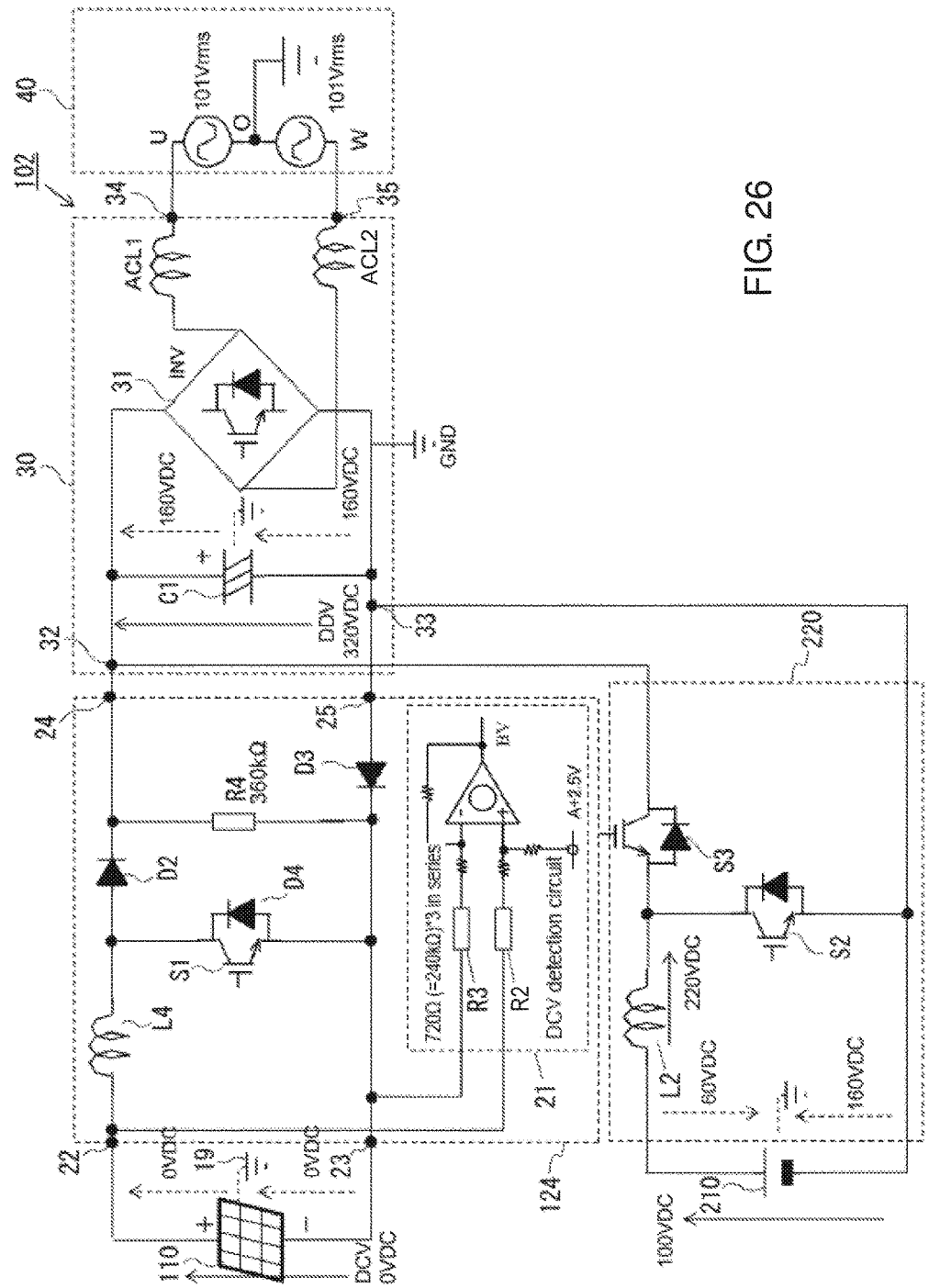
FIG. 26 is a diagram showing the circuit configuration of a distributed power system according to a third embodiment (during the nighttime).

FIGS. 25 and 26 are diagrams each showing the circuit configuration of a distributed power system 102 according to a third embodiment. FIG. 25 shows the system state during the daytime. FIG. 26 shows the system state during the nighttime. The distributed power system 102 according to a third embodiment includes a DCV detection circuit 21 and a resistor circuit that divide the positive electrode voltage and the negative terminal voltage relative to GND for a DC-DC converter 124, and adjust the potential to ground of the solar module 1. The system according to a third embodiment differs from the system according to a second embodiment in its components for adjusting the potential to ground of the solar module 1, and includes the same other components as in a second embodiment. In a third embodiment, the same components as those in a second embodiment are given the same reference numerals, and will not be described.

As shown in FIGS. 25 and 26, the DC-DC converter 124 in a third embodiment includes a potential adjustment section having a diode D3 (third diode) and a resistor R4 having a resistance equivalent to that of the DCV detection circuit 21. The resistor R4 has a first terminal connected to the positive electrode 24 of the output terminal of the DC-DC converter, and a second terminal connected to the cathode of the diode D3. The anode of the diode D3 is connected to the negative electrode 25 of the output terminal of the DC-DC converter. The second terminal of the resistor R4 and the cathode of the diode D3 are connected to the negative electrode of the solar array 110.

Figure 27:
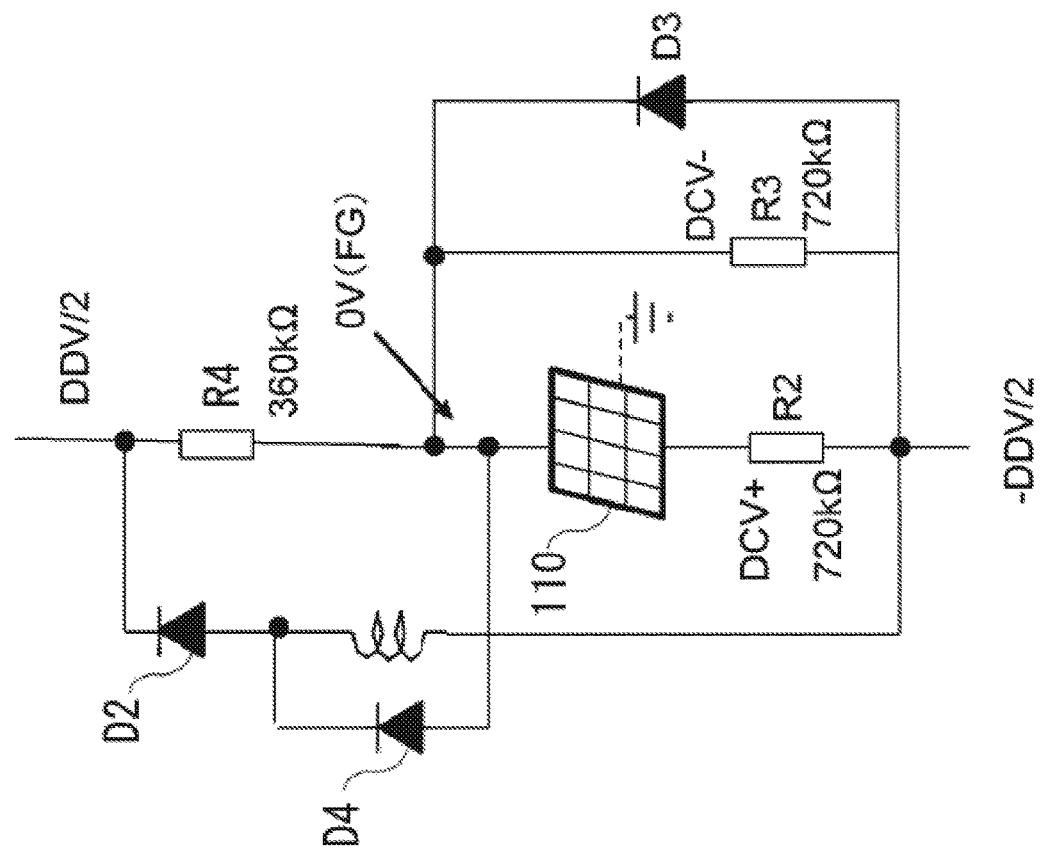
FIG. 27 is a diagram describing the voltage-dividing relation between a resistor circuit and a DCV detection circuit in a DC-DC converter according to a third embodiment.

FIG. 27 is a diagram describing the voltage-dividing relation between the DCV detection circuit 21 and the resistor circuit including the diodes D2 to D4 and the resistors R2 to R4 in the DC-DC converter 124 according to a third embodiment.

In this example shown in FIG. 27, the diode D3 is placed equally as the diodes D2 and D4, whereas the resistor R4 is placed equally as the resistors R2 and R3 in the DCV detection circuit 21. Thus, when no power is generated during the nighttime, the positive- and negative-end voltages to ground of the solar array 110 have substantially the same potential. The voltages to ground of the solar array 110 may be set at any value by changing the voltage-dividing relation between the resistor circuit and the DCV detection circuit 21. For example, a positive voltage to ground may be applied to the negative electrode of the solar array 110 by setting the resistor R4 at a value lower than the resistors R2 and R3.

In the distributed power system 102 according to a third embodiment, although some of the solar modules 1 adjacent to the negative electrode have negative potentials to ground during the daytime, the nighttime voltage to ground is 0 V. This prevents PID from reducing the performance. If the performance decreases during the daytime, the performance can recover during the nighttime. Additionally, the distributed power system 102 has the voltage to ground of the solar module 1 of 0 V during the nighttime, and thus prevents PID from reducing the performance as shown in FIG. 20, regardless of whether the solar module 1 is of p-type or n-type.

Modification 3-1

Figure 28:
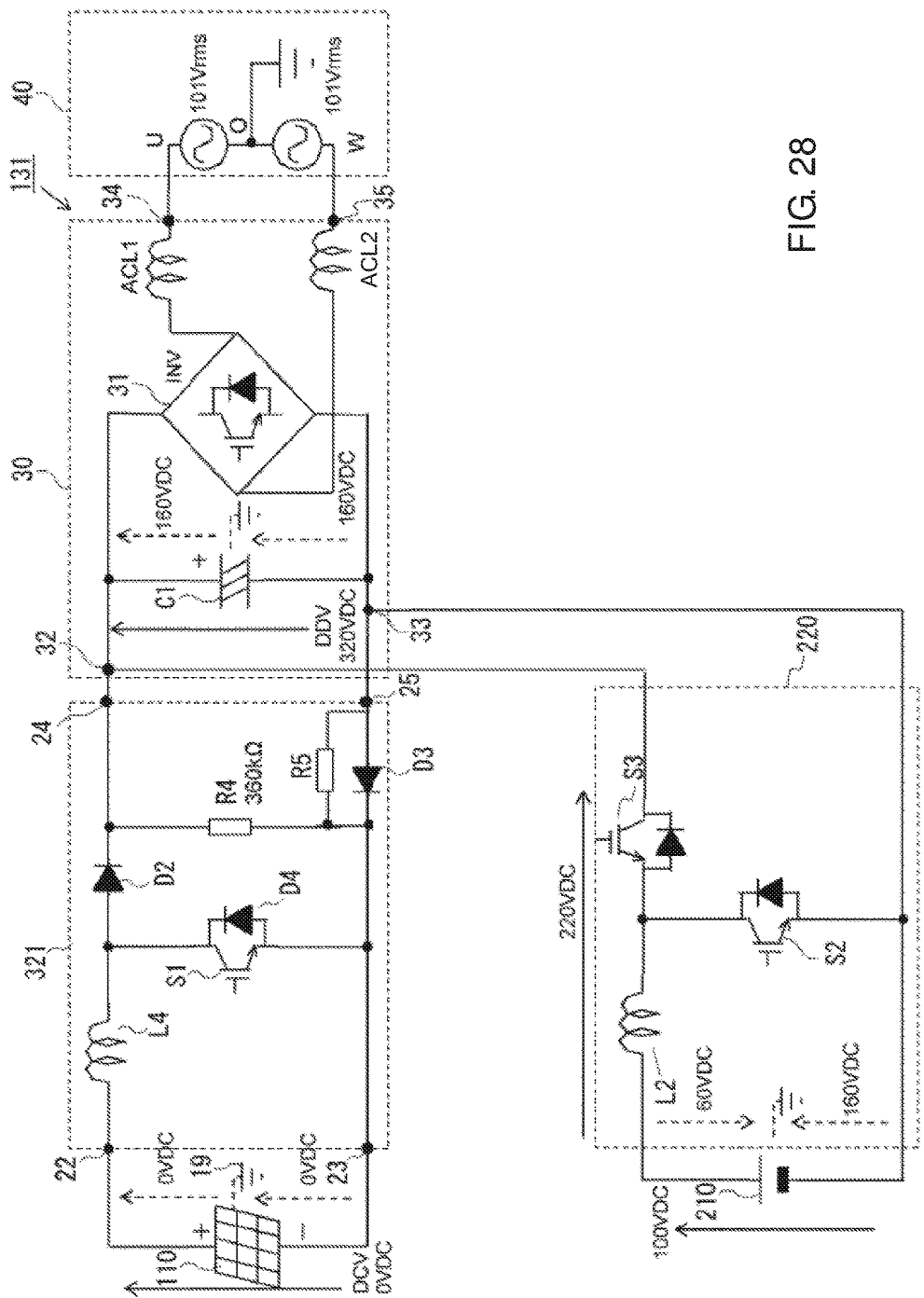
FIG. 28 is a diagram showing the circuit configuration of a distributed power system according to modification 3-1.

FIG. 28 is a diagram showing the circuit configuration of a distributed power system 131 according to modification 3-1.

The system according to modification 3-1 differs from the system according to a third embodiment in that it includes a resistor R5 in parallel with a diode D3 in a DC-DC converter 321, and includes the same other components as in a third embodiment.

As shown in FIG. 28, the resistor R5 and the resistor R4 may divide the voltage to adjust the positive- and negative-electrode potentials to ground of the solar array 110. For example, the nighttime potential to ground of the solar module 1 is adjusted to 0 V to prevent PID from reducing the performance.

Modification 3-2

Figure 29:
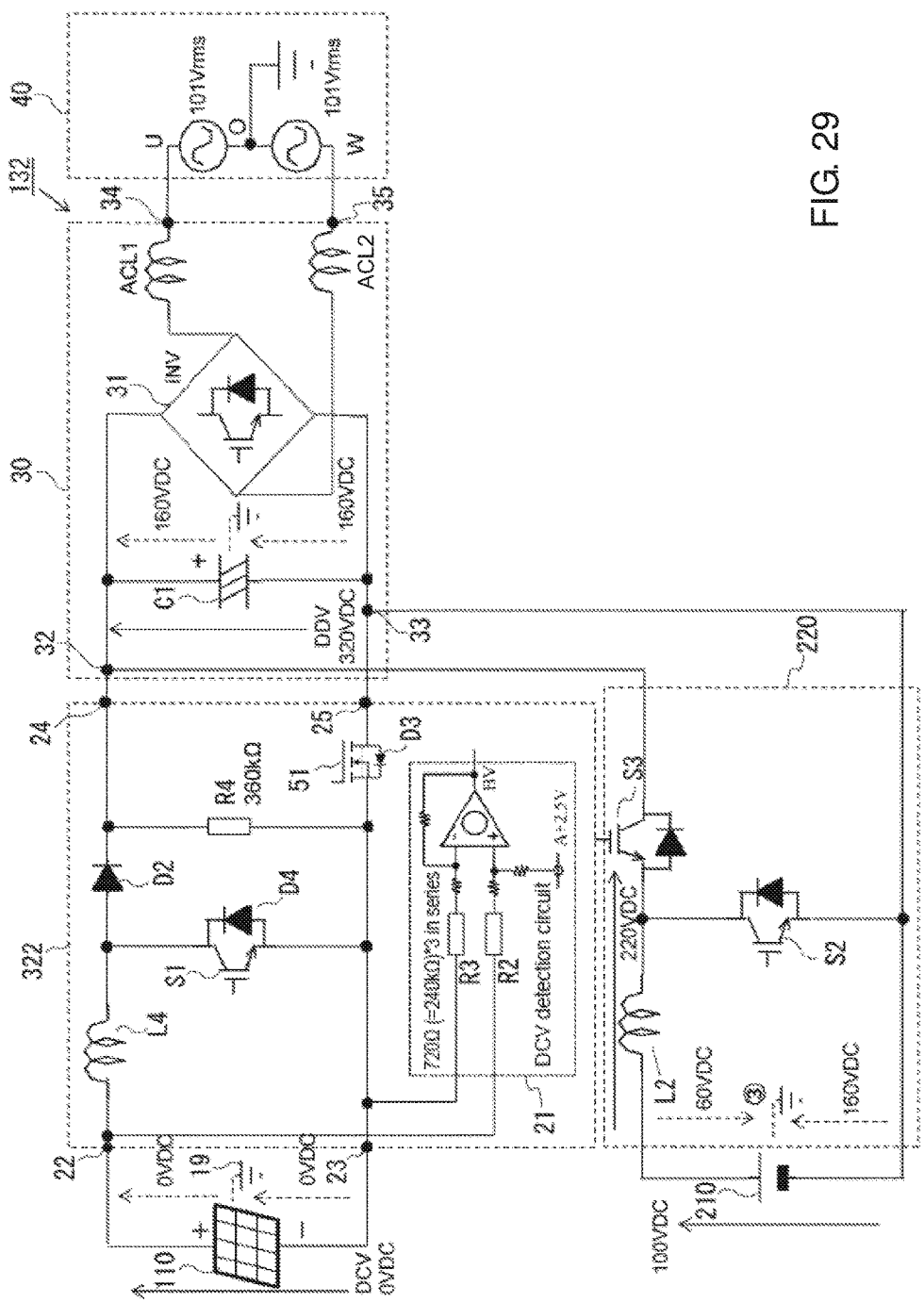
FIG. 29 is a diagram showing the circuit configuration of a distributed power system according to modification 3-2.

FIG. 29 is a diagram showing the circuit configuration of a distributed power system 132 according to modification 3-2.

The system according to modification 3-2 differs from the system according to a third embodiment in that it includes a metal-oxide-semiconductor field-effect transistor (MOSFET) 51 in parallel with a diode D3 in a DC-DC converter 322, and includes the same other components as in a third embodiment.

As shown in FIG. 29, the MOSFET 51 is placed in parallel with the diode D3. When the DC-DC converter 322 is driven, a current is passed through the MOSFET 51 instead of the diode D3. This reduces power loss. The diode D3 may be included in the MOSFET.

Modification 3-3

Figure 30:
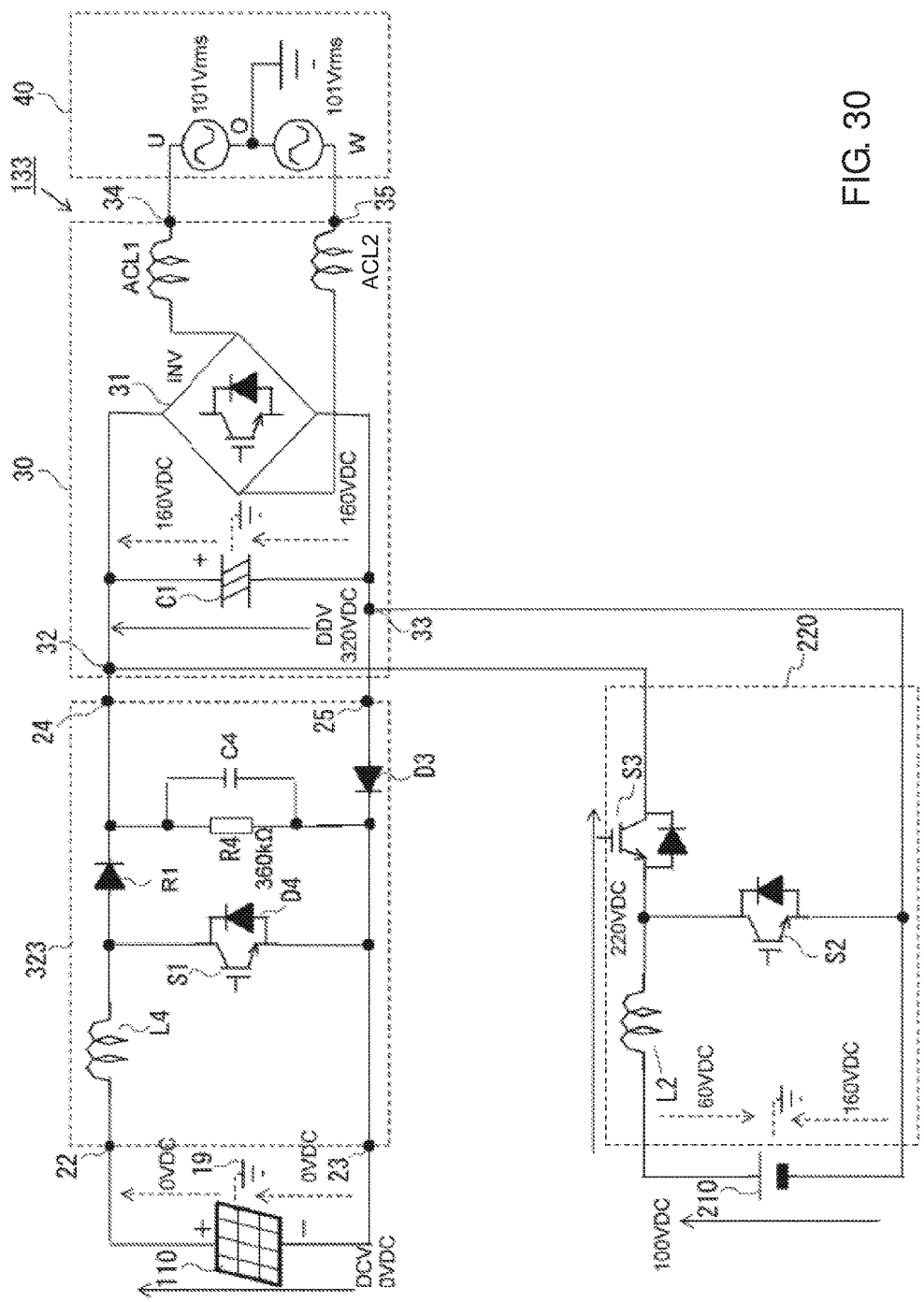
FIG. 30 is a diagram showing the circuit configuration of a distributed power system according to modification 3-3.

FIG. 30 is a diagram showing the circuit configuration of a distributed power system 133 according to modification 3-3.

The system according to modification 3-3 differs from the system according to a third embodiment in that it includes a capacitor C4 in parallel with a resistor R4 in a DC-DC converter 323, and includes the same other components as in a third embodiment.

The capacitor C4 placed in parallel with the resistor R4 as shown in FIG. 30 reduces noise.

Figure 31:
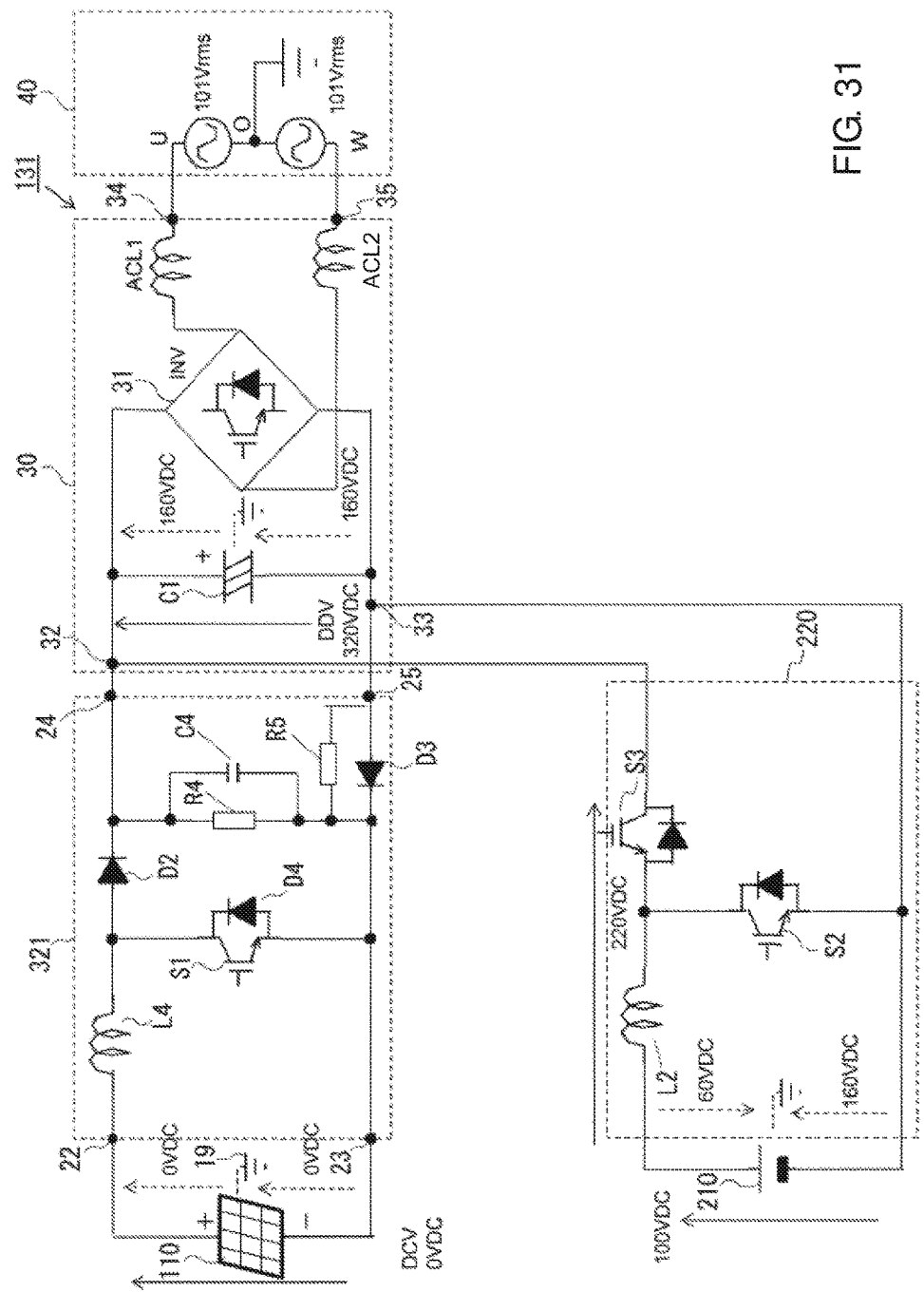
FIG. 31 shows an example with a noise-reducing capacitor connected in parallel with a resistor.

The noise-reducing capacitor is not limited to the capacitor C4 shown in FIG. 30. As shown in FIG. 31, the noise-reducing capacitor C4 may be placed in parallel with the resistor R4 in the distributed power system 131 shown in FIG. 28.

Figure 32:
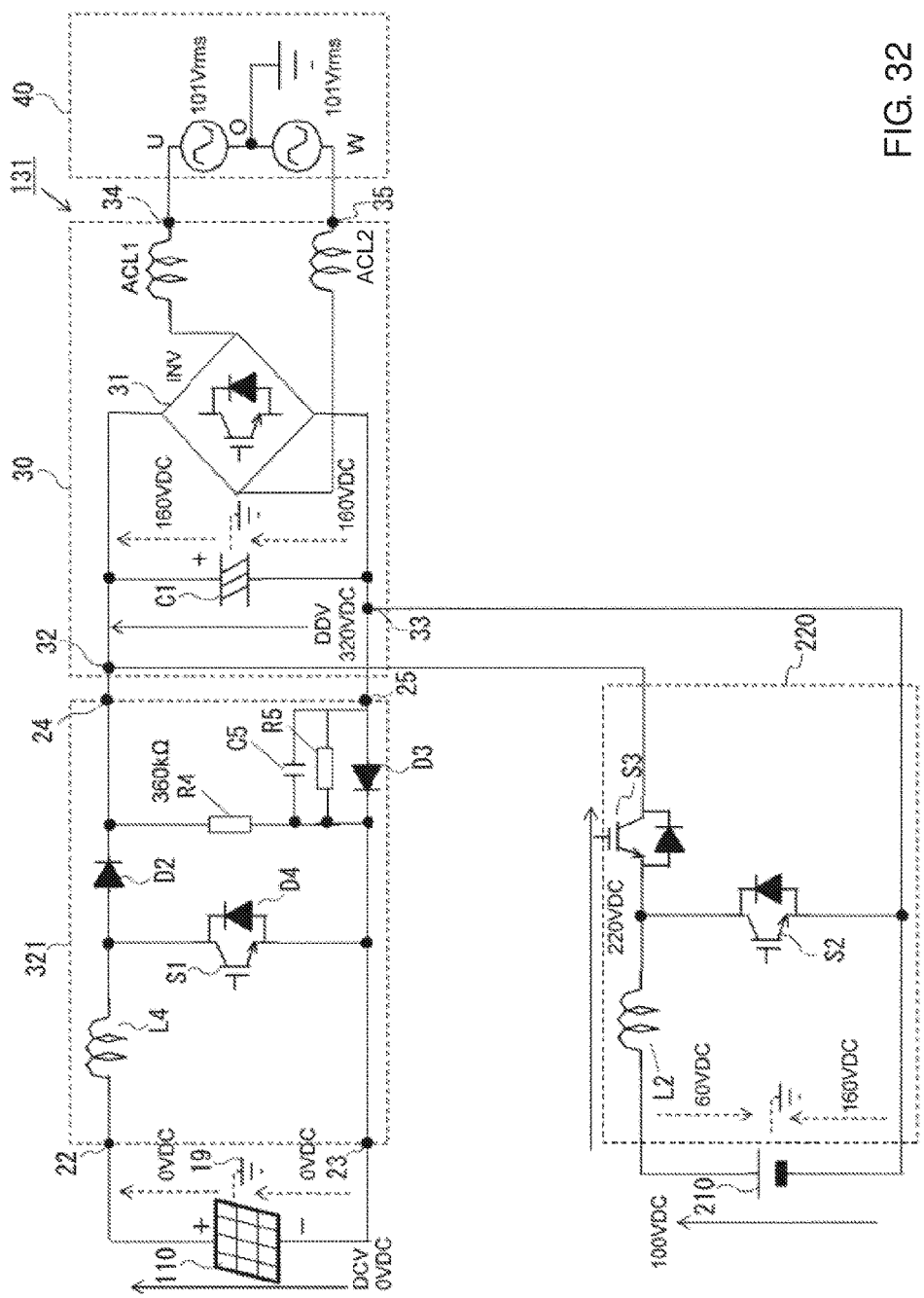
FIG. 32 shows an example with a noise-reducing capacitor connected in parallel with a resistor.

Additionally, the noise-reducing capacitor is not limited to the capacitor C4 shown in FIG. 30. As shown in FIG. 32, a noise-reducing capacitor C5 may be placed in parallel with the resistor R5 in the distributed power system 131 shown in FIG. 28.

Figure 33:
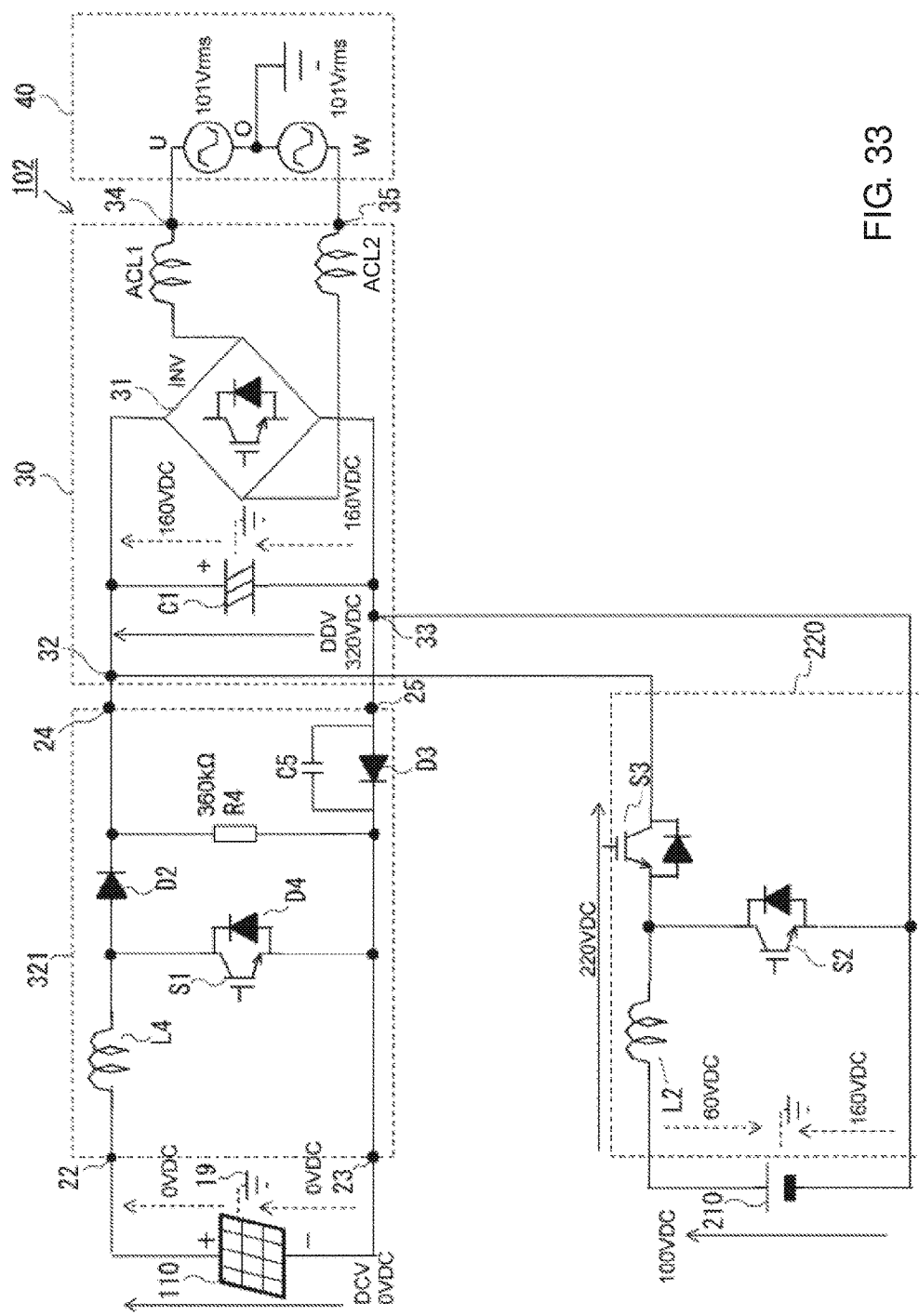
FIG. 33 shows an example with the noise-reducing capacitor connected in parallel with a diode.

Additionally, the noise-reducing capacitor is not limited to the capacitor C4 shown in FIG. 30. As shown in FIG. 33, the noise-reducing capacitor C5 may also be placed in parallel with the diode D3 in the distributed power system 102 shown in FIG. 26.

Modification 3-4

Figures 34A, 34B:
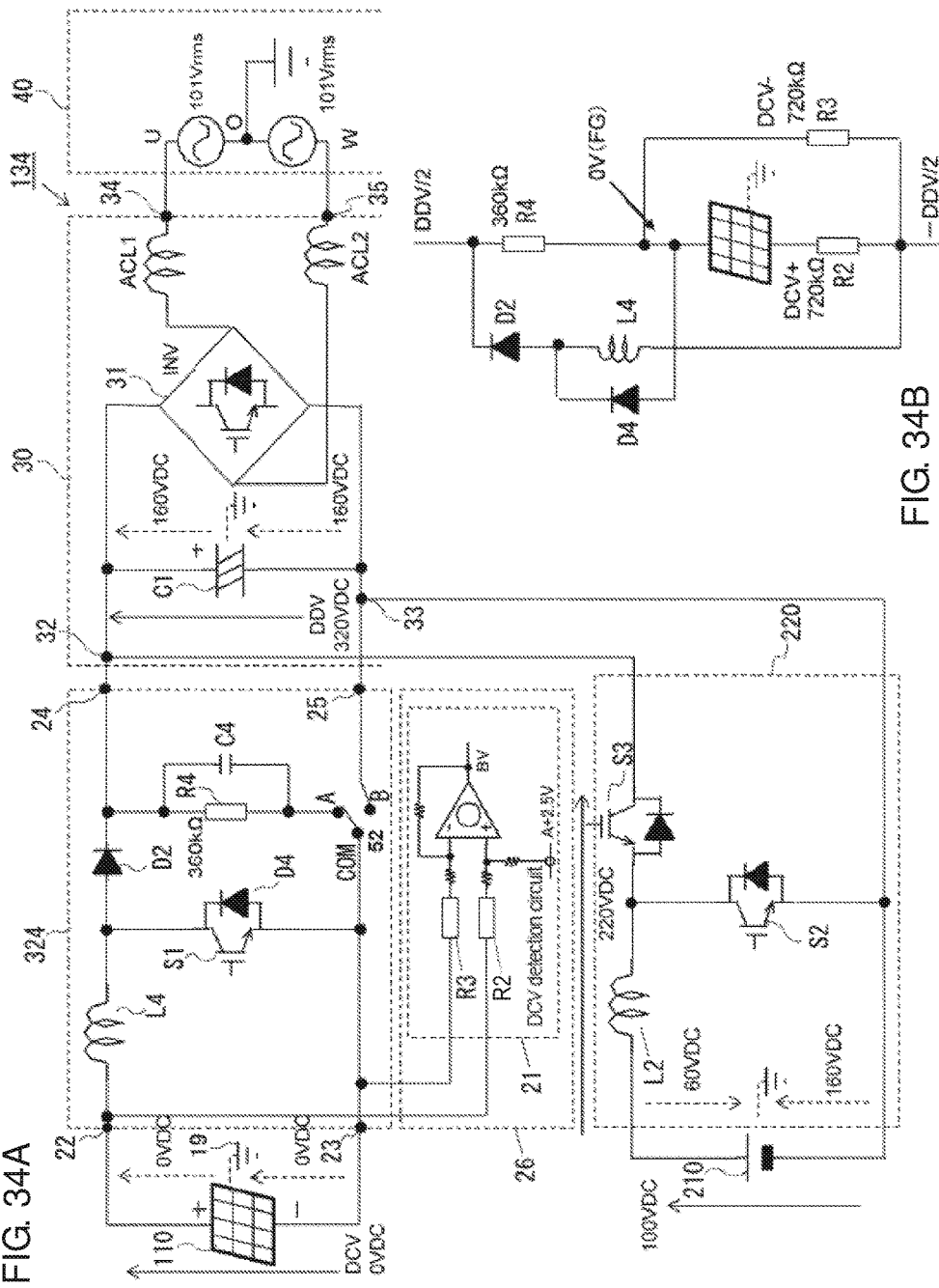
FIGS. 34A and 34B are diagrams each showing the circuit configuration of a distributed power system according to modification 3-4.

FIGS. 34A and 34B are diagrams each showing the circuit configuration of a distributed power system 134 according to modification 3-4.

The system according to modification 3-4 differs from the system according to a third embodiment in that it includes a three-terminal (change-over) relay 52 in a DC-DC converter 324. The system includes the same other components as in a third embodiment, which are given the same reference numerals and will not be described.

As shown in FIG. 34A, the positive electrode of the output terminal of the DC-DC converter 324 in modification 3-4 is connected to one terminal of a resistor R4 equivalent to resistor components R2 and R3 in a DCV detection circuit 21. The other terminal of the resistor R4 is connected to contact A of the three-terminal relay 52.

The three-terminal relay 52 has a common terminal connected to the negative electrode of the input terminal of the DC-DC converter 324, and contact B connected to the negative output terminal. The change-over of the three-terminal relay 52 is controlled by a control circuit 26 including a DCV detection circuit 21. For example, contact A is open with contact B being closed during the daytime, and the negative electrode of the solar array 110 is connected to a negative electrode 25 of an output terminal of the DC-DC converter 324. During the nighttime, the control circuit 26 opens contact B of the three-terminal relay 52 with contact A being closed, and the negative electrode of the solar array 110 is connected to one terminal of the resistor R4.

FIG. 34B is a diagram describing the voltage dividing operation performed by the DCV detection circuit 21 and the voltage-dividing resistor R4 with contact A of the three-terminal relay 52 being closed during the nighttime. Although not shown in FIG. 34A, the DCV detection circuit 21 is connected to the negative electrode 25 of the output terminal at a point closer to the output terminal of the DC-DC converter 324 than contact B of the three-terminal relay 52, and this point serves as a potential reference.

When contact B of the three-terminal relay 52 is open, the DC-DC converter 324 has the resistor component R2 in the DCV detection circuit 21 between the negative electrode 25 of its output terminal and the negative electrode of the solar array 110, and the resistor component R3 in the DCV detection circuit 21 between the negative electrode 25 and the positive electrode of the solar array 110. The voltage across the solar array 110 is thus divided by the resistor components R2 and R3 in the DCV detection circuit 21, the voltage-dividing resistor R4, and the diodes D2 and D4 to adjust the positive- and negative-electrode potentials to ground of the solar array 110. The distributed power system 134 according to modification 3-4 prevents PID by adjusting the positive- and negative-electrode potentials to ground to 0 V while the solar array 110 is generating no power during the nighttime. In modification 3-4, the structure including the resistor R4, the three-terminal relay 52, and the DCV detection circuit 21 that divide the voltage to adjust the positive- and negative-electrode potentials to ground of the solar array 110 corresponds to a potential adjustment section.

Modification 3-5

FIGS. 35A and 35B are diagrams each showing the circuit configuration of a distributed power system 135 according to modification 3-5.

The system according to modification 3-5 differs from the system according to modification 3-4 in that the three-terminal relay 52 in the distributed power system 134 is replaced with a normally closed relay and a MOS diode. The system includes the same other components as in modification 3-4, which are given the same reference numerals and will not be described.

A DC-DC converter 325 in modification 3-5 includes a control circuit 261 including a DCV detection circuit 21 for detecting the DC voltage across the solar array 110 and a welding detection circuit 27. The control circuit 261 controls the switching element S1 or the change-over of the three-terminal relay 52 based on, for example, a detection value from the DCV detection circuit 21. The control circuit 261 also detects welding on a contact of the terminal relay 52 based on a detection value from the welding detection circuit 27. The welding detection circuit 27 detects the voltage between the common terminal of the three-terminal relay 52 and contact B. When contact B is closed, a voltage is detected. When contact B is open, a voltage is not detected. Thus, the control circuit 261 determines welding on a contact when the welding detection circuit 27 detects a voltage although the control circuit 261 opens contact B during, for example, the nighttime, or when the welding detection circuit 27 does not detect a voltage although the control circuit 261 closes contact B during the daytime. When detecting welding, the control circuit 261 may deactivate the DC-DC converter 124 or provide an alert to another device.

In modification 3-5, with contact A of the three-terminal relay 52 being closed as shown in FIG. 35A, a resistor component R6 in the welding detection circuit 27 is in parallel with the resistor component R3 of the DCV detection circuit 21 as shown in FIG. 35B. The voltage across the solar array 110 is thus divided by the resistor components R2 and R3 in the DCV detection circuit 21, the resistor component R6 in the welding detection circuit 27, the voltage-dividing resistor R4, and the diodes D2 and D4 to adjust the positive- and negative-electrode potentials to ground of the solar array 110. The distributed power system 135 according to modification 3-5 prevents PID by adjusting the positive- and negative-electrode potentials to ground to 0 V while the solar array 110 is generating no power during the nighttime. In modification 3-5, the structure including the resistor R4, the three-terminal relay 52, the DCV detection circuit 21, and the welding detection circuit 27 that divide the voltage to adjust the positive- and negative-electrode potentials to ground of the solar array 110 corresponds to a potential adjustment section.

Modification 3-6

Figure 36:
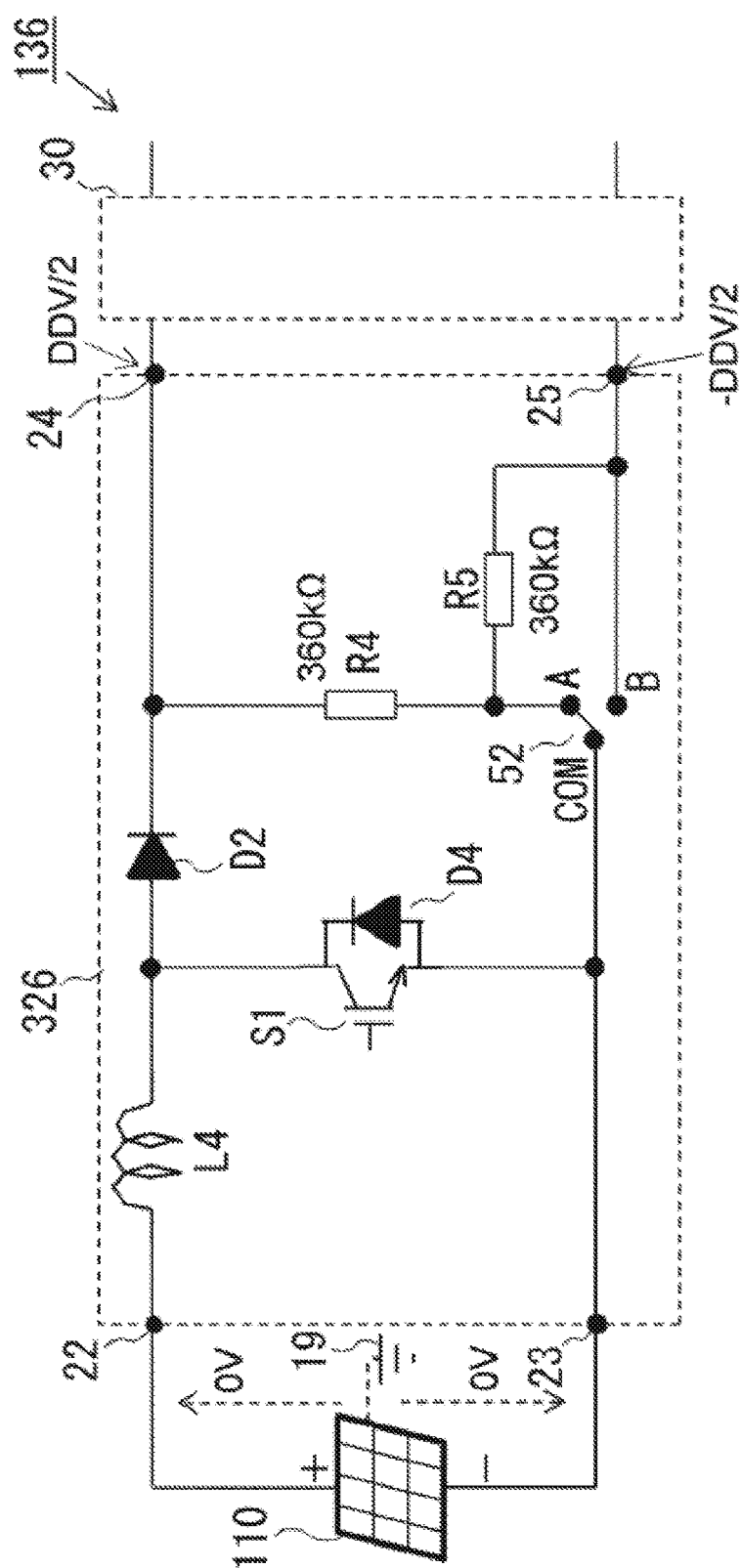
FIG. 36 is a diagram showing the circuit configuration of a distributed power system according to modification 3-6.

FIG. 36 is a diagram showing the circuit configuration of a distributed power system 136 according to modifications 3-6.

The system according to modification 3-6 differs from the system according to modification 3-4 in that the DCV detection circuit 21 in the distributed power system 136 is replaced with a voltage-dividing resistor R5. The system includes the same other components as in modification 3-4, which are given the same reference numerals and will not be described. FIG. 36 mainly shows the circuit configuration of a DC-DC converter 326, and does not show the circuit of the power conditioner 30 or other components such as the storage battery 210.

In modification 3-4, the resistor components R2 and R3 in the DCV detection circuit 27 are used for dividing the voltage. However, in the configuration without the DCV detection circuit 27 or the configuration in which the resistor components in the DCV detection circuit 27 are not responsible for dividing the voltage between the positive and negative electrodes of the solar array 110, the resistor R5 may divide the voltage as shown in FIG. 36. The resistor R5 has one terminal connected to the negative electrode of the resistor R4, and the other terminal connected to the negative electrode 25 of the output terminal of the DC-DC converter 326. This allows, when contact A of the three-terminal relay 52 is closed during the nighttime, the resistor R4, the diodes D2 and D4, and the resistor R5 to divide the voltage to adjust the positive- and negative-electrode potentials to ground of the solar array 110.

Modification 3-7

FIGS. 37A and 37B are diagrams each showing the circuit configuration of a distributed power system 137 according to modification 3-7. The system according to modification 3-7 differs from the distributed power system 135 in modifications 3-5 in that it includes a welding detection circuit 27 for detecting deposition on a contact of a three-terminal relay 52. The system includes the same other components as in modifications 3-5, which are given the same reference numerals and will not be described.

In a DC-DC converter 327 in modification 3-7, the three-terminal relay 52 has a first terminal connected to the negative electrode of the solar array 110, a second terminal connected to the negative electrode 25 of the output terminal of the DC-DC converter 327, and a third terminal connected to the resistor R4 as shown in FIG. 37A.

The change-over of the three-terminal relay 52 is controlled by the control circuit 261 including the DCV detection circuit 21. For example, a contact is closed during the daytime, and the negative electrode of the solar array 110 is connected to the negative electrode 25 of the output terminal of the DC-DC converter 324.

The three-terminal relay 52 is controlled by the control circuit 261 to electrically connect the negative electrode of the solar array 110 to the resistor R4 during the nighttime, or to break the current between the negative electrode of the solar array 110 and the resistor R4 during the daytime.

FIG. 37B is a diagram describing the voltage dividing operation performed by the control circuit 261 and the voltage-dividing resistor R4 with a contact of the three-terminal relay 52 being open during the nighttime and the negative electrode of the solar array 110 electrically connected to the resistor R4 by a MOSFET 54. Thus, in the DC-DC converter 327 according to modification 3-7, the resistor components R2 and R3 in the DCV detection circuit 21, the resistor component R6 in the welding detection circuit 27, the voltage-dividing resistor R4, and the diodes D2 and D4 divide the voltage to adjust the positive- and negative-electrode potentials to ground of the solar array 110. The distributed power system 137 according to modification 3-7 prevents PID by adjusting the positive- and negative-electrode potentials to ground to 0 V while the solar array 110 is generating no power during the nighttime. In modification 3-7, the structure including the resistor R4, the relay 52, the MOSFET 54, the DCV detection circuit 21, and the welding detection circuit 27 that divide the voltage to adjust the positive- and negative-electrode potentials to ground of the solar array 110 corresponds to a potential adjustment section.

Modification 3-8

Figure 38:
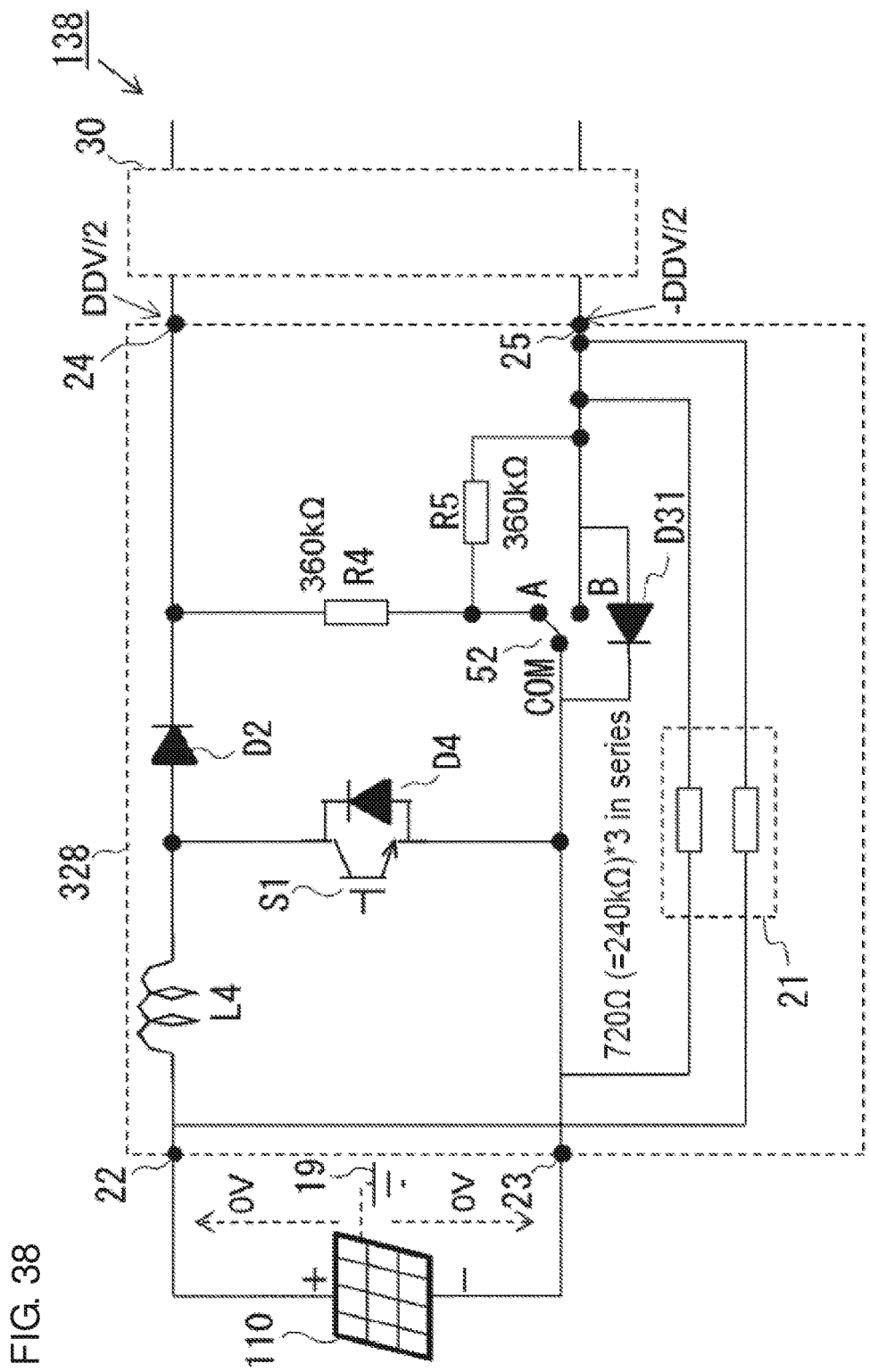
FIG. 38 is a diagram showing the circuit configuration of a distributed power system according to modification 3-8.

FIG. 38 is a diagram showing the circuit configuration of a distributed power system 138 according to modification 3-8.

The system according to modification 3-8 differs from the system according to modification 3-4 in that it includes a diode D31 between the common terminal and contact B of the three-terminal relay 52. The system includes the same other components as in modification 3-4, which are given the same reference numerals and will not be described.

As shown in FIG. 38, in a DC-DC converter 328 in modification 3-8, the diode D31 has one terminal connected to the negative output terminal, and the other terminal connected to the negative electrode of the input terminal of the DC-DC converter 328. More specifically, the diode D31 is placed between the common terminal and contact B of the three-terminal relay 52.

This system according to modification 3-8 thus prevents an open voltage equal to or greater than a voltage DDV from being generated across the solar array 110 when contact B is open during the nighttime.

Modification 3-9

Figure 39:
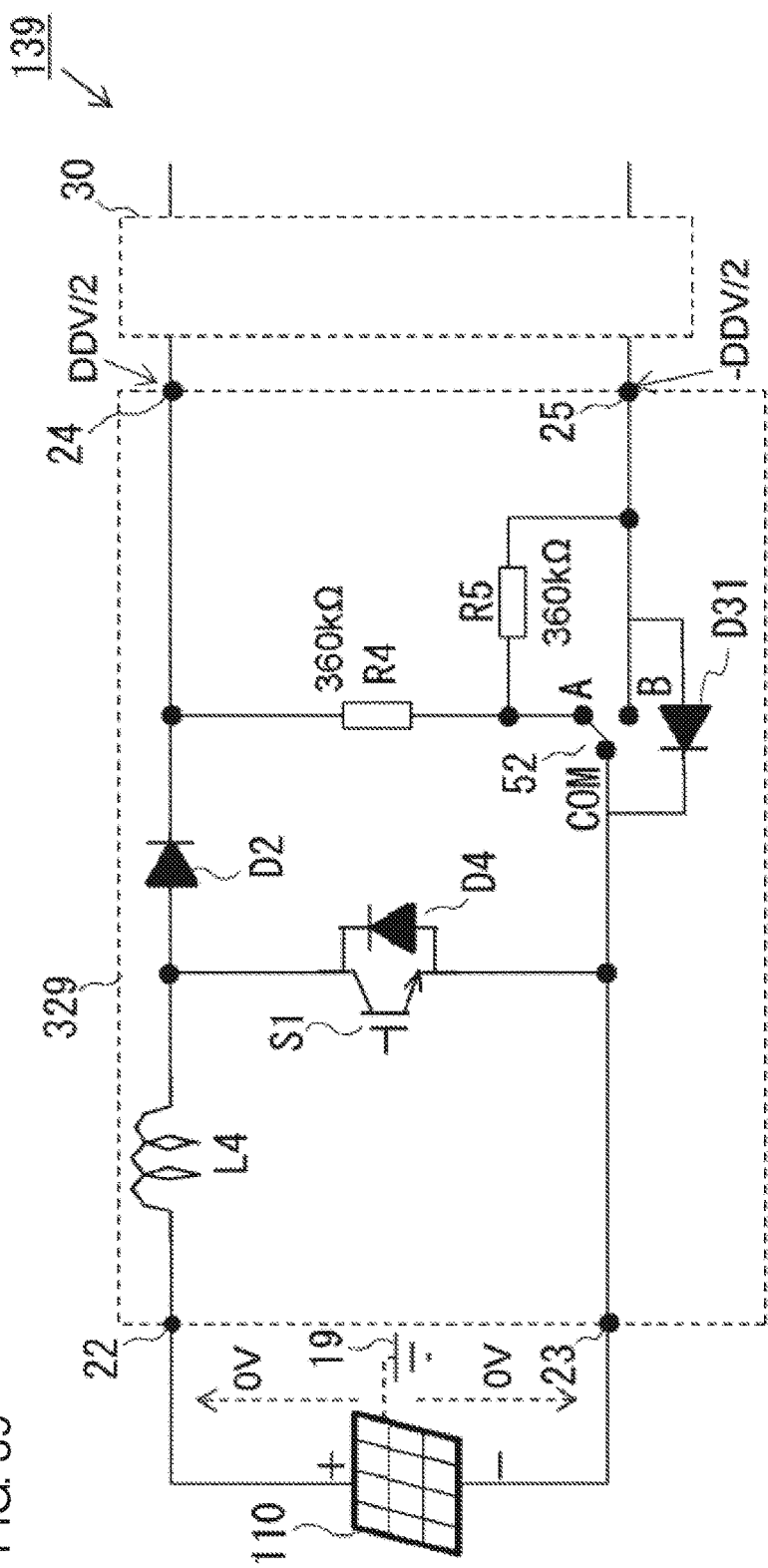
FIG. 39 is a diagram showing the circuit configuration of a distributed power system according to modification 3-9.

FIG. 39 is a diagram showing the circuit configuration of a distributed power system 139 according to modification 3-9.

The system according to modification 3-9 differs from the system according to modification 3-6 in that it includes a diode D31 between the common terminal and contact B of the three-terminal relay 52. The system includes the same other components as in modification 3-6, which are given the same reference numerals and will not be described.

As shown in FIG. 39, in a DC-DC converter 329 in modification 3-9, the diode D31 has one terminal connected to the negative output terminal, and the other terminal connected to the negative electrode of the input terminal of the DC-DC converter 329. More specifically, the diode D31 is placed between the common terminal and contact B of the three-terminal relay 52.

The structure according to modification 3-9 prevents an open voltage equal to or greater than a voltage DDV from being generated across the solar array 110 when contact B is open during the nighttime.

Fourth Embodiment

Figure 40:
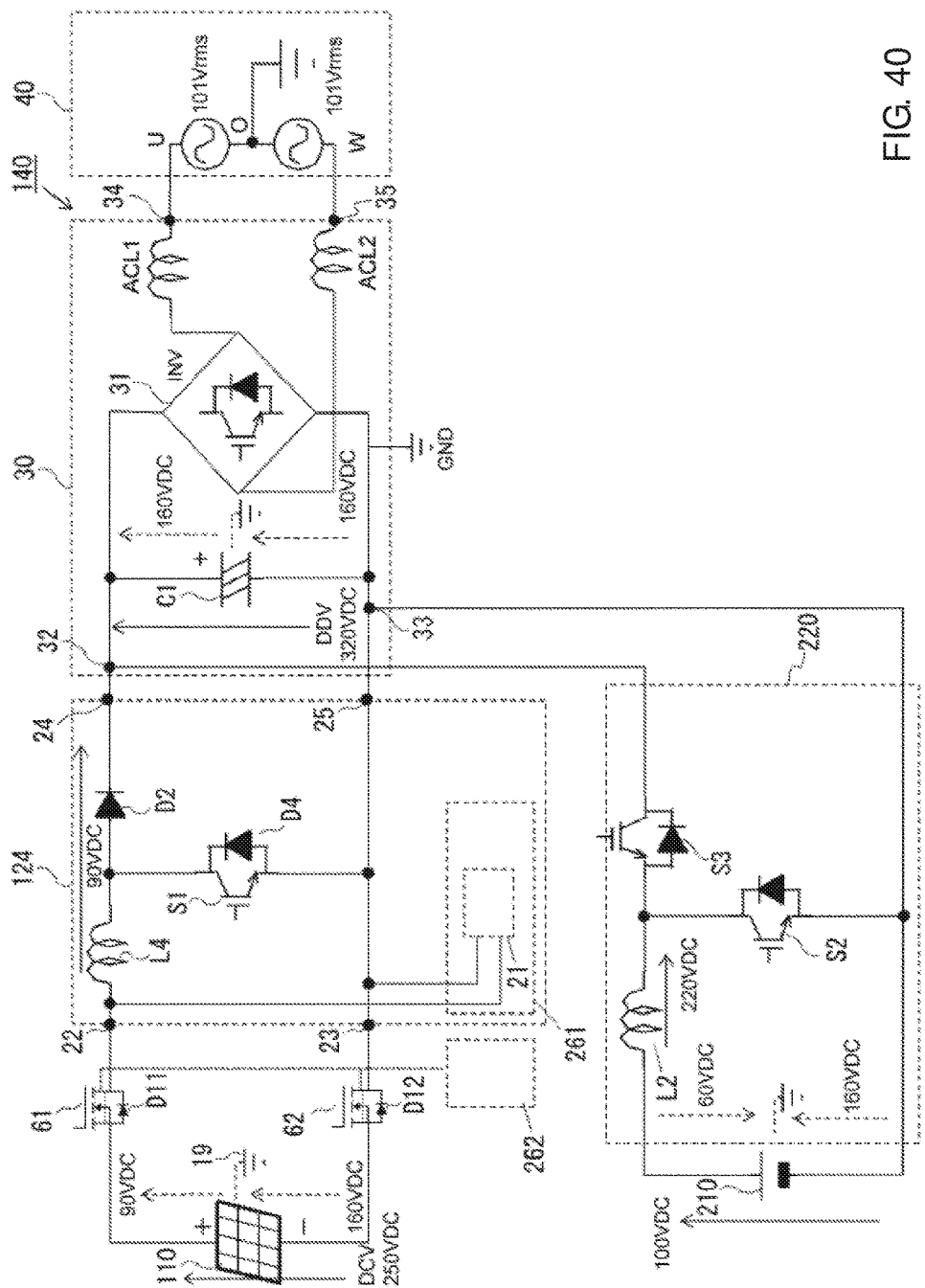
FIG. 40 is a diagram showing the circuit configuration of a distributed power system according to a fourth embodiment.

FIG. 40 is a diagram showing the circuit configuration of a distributed power system 140 according to a fourth embodiment. The distributed power system 140 according to a fourth embodiment includes disconnectors for electrically disconnecting the solar array 110 from the DC-DC converter 124. The system according to a fourth embodiment differs from the system according to a second embodiment in that it includes the disconnectors, and the other components that are the same in a fourth embodiment. In a fourth embodiment, the same components as those in a second embodiment are given the same reference numerals, and will not be described.

The distributed power system 140 in a fourth embodiment includes MOSFETs 61 and 62, diodes D11 and D12, and a control circuit 262 as disconnectors.

The MOSFET 61 has one terminal connected to the positive electrode of the solar array 110, and the other terminal connected to a positive input terminal 22 of the DC-DC converter 124.

The diode D11 is connected in parallel with the MOSFET 61. The anode of the diode D11 is connected to the positive electrode of the solar array 110, and the cathode is connected to the positive input terminal 22 of the DC-DC converter 124.

The MOSFET 62 has one terminal connected to the negative electrode of the solar array 110, and the other terminal connected to a negative input terminal 23 of the DC-DC converter 124.

The diode D12 is connected in parallel with the MOSFET 62. The anode of the diode D12 is connected to the negative electrode of the solar array 110, and the cathode is connected to the negative input terminal 23 of the DC-DC converter 124.

The control circuit 262 controls the MOSFETs 61 and 62 and turns on the MOSFETs 61 and 62 during the daytime, and turns off the MOSFETs 61 and 62 during the nighttime. The control circuit 262 distinguishes day from night by detecting, for example, the voltage across the solar array 110 or the voltage across the MOSFETs 61 and 62 and the diodes D11 and D12. The control circuit 262 may also obtain a control signal indicating the daytime or the nighttime from the control circuit 26 for the DC-DC converter 124. Although the disconnectors and the DC-DC converter 124 are placed separately in this example, the DC-DC converter 124 may include the disconnectors. In this case, the control circuit 26 for the DC-DC converter 124 may control the MOSFETs 61 and 62, and may eliminate the separate control circuit 262.

In a fourth embodiment, the MOSFETs 61 and 62 are turned on during the daytime to electrically connect the solar array 110 to the DC-DC converter 124, whereas the MOSFETs 61 and 62 are turned off during the nighttime to electrically disconnect the solar array 110 from the DC-DC converter 124.

Figure 41:
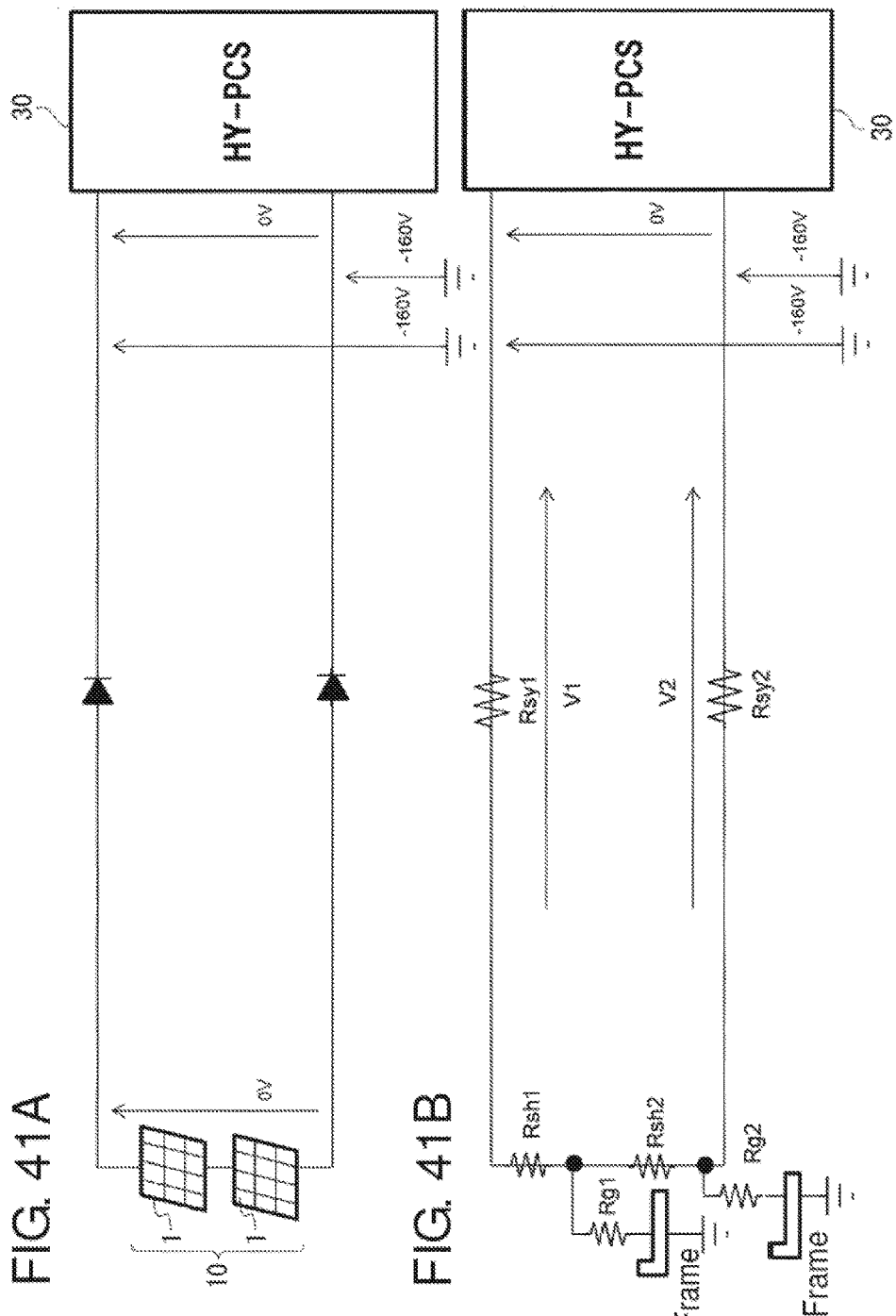
FIGS. 41A and 41B are diagrams describing the state of the electrically disconnected solar array.

In this case, the solar array 110 as shown in FIG. 41A has the diodes D11 and D12 between the solar array 110 and the power conditioner 30 adjacent to the DC-DC converter 124. This prevents the solar array 110 from receiving the electric currents when the storage battery charges and discharges during the nighttime to cause the potentials at the positive and negative electrodes of the power conditioner 30. The diodes D11 and D12 as shown in FIGS. 41B and 42 have resistor components Rsy1 and Rsy2 with resistances considerably larger (e.g., about 130 MO) than the resistances of resistors Rsh1 and Rsh2 in the solar array 110 and resistor components Rg1 and Rg2 between the cells 13 and the frames 11 of the solar array 110.

Figure 42:
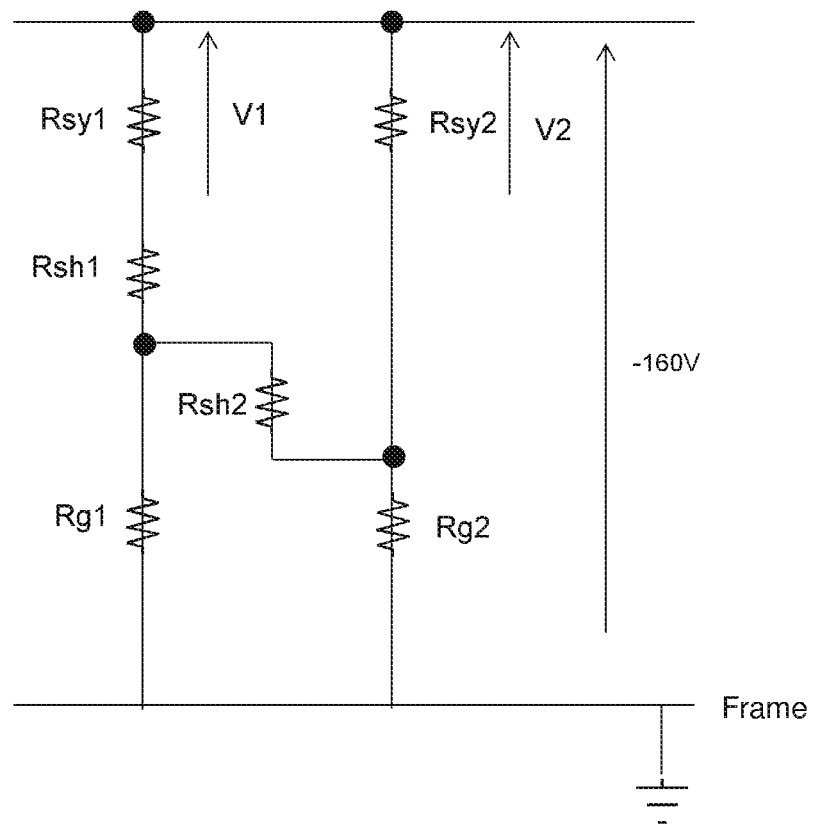
FIG. 42 is a diagram describing the state of the electrically disconnected solar array.

As shown in FIG. 42, when Rsy1=Rsy2>>Rsh1, Rsh2, Rg1, Rg2, V1=V2≈−160 V, and the potential to ground at the cells 13 is substantially 0 V. This prevents PID from reducing the performance of the solar array 110.

In this example, the single MOSFET 61 is placed on the positive line, and the single MOSFET 62 is placed on the negative line. However, a plurality of MOSFETs may be placed in series on each of the positive and negative lines.

Modification 4-1

Figure 43:
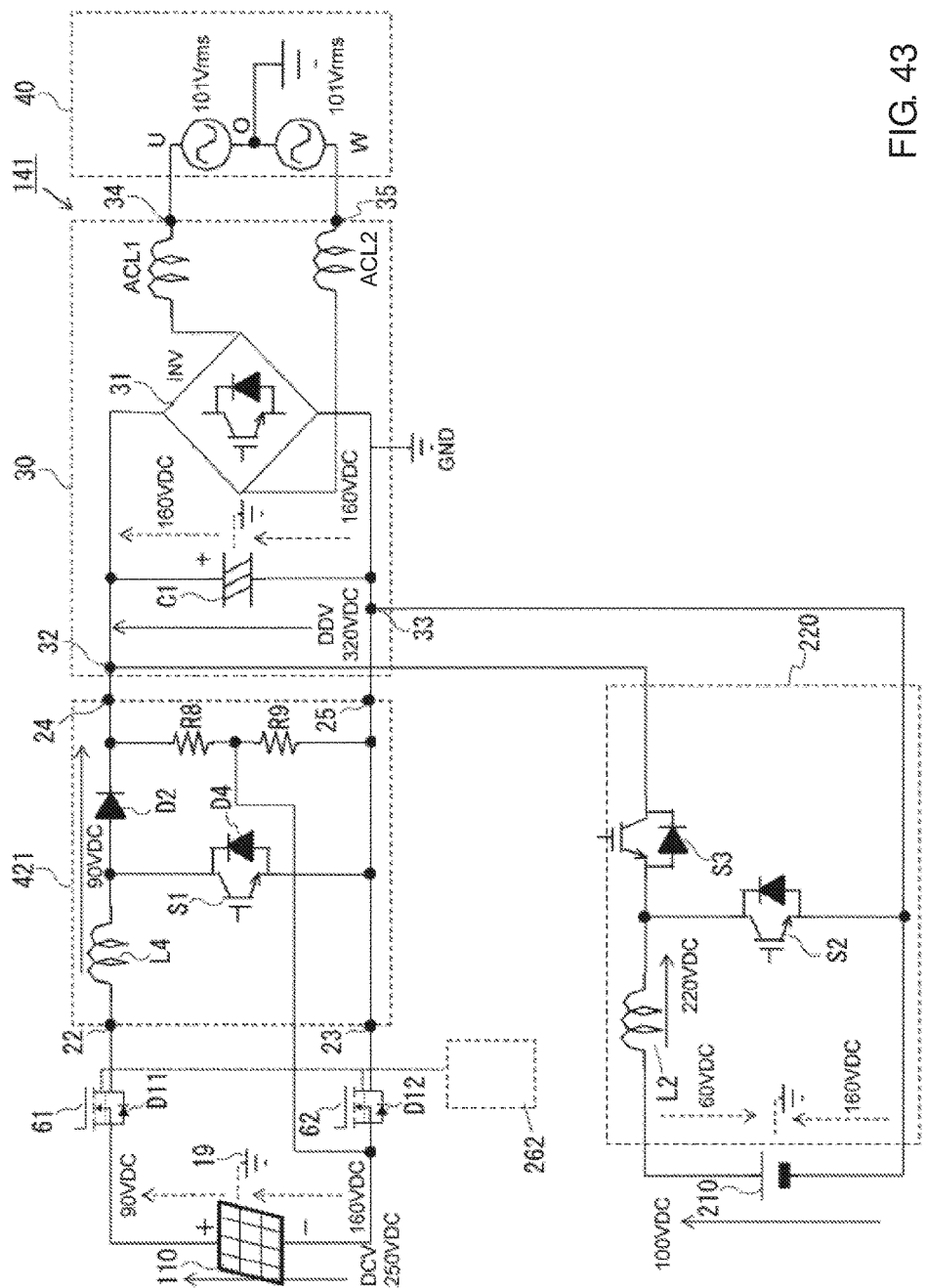
FIG. 43 is a diagram showing the circuit configuration of a distributed power system according to modification 4-1.

FIG. 43 is a diagram showing the circuit configuration of a distributed power system 141 according to modification 4-1. The system according to modification 4-1 differs from the system according to a fourth embodiment in that it includes a resistor circuit for adjusting the potential of the solar array when the MOSFETs 61 and 62 are turned off. The system includes the same other components as in a fourth embodiment, which are given the same reference numerals and will not be described.

The distributed power system 141 in this example has voltage-dividing resistors R8 and R9 connected in series between the positive and negative output terminals in a DC-DC converter 421. The negative electrode of the input terminal of the DC-DC converter 421 is connected between the resistor R8 and the resistor R9.

When the MOSFETs 61 and 62 are turned off, the voltage-dividing operation performed by the resistors R8 and R9 adjusts the potential to ground of the solar array 110. In modification 4-1, when the solar array 110 generates no power during the nighttime, adjusting the potential to ground of the solar array 110 to 0 V prevents PID from reducing the performance.

Modification 4-2

Figure 44:
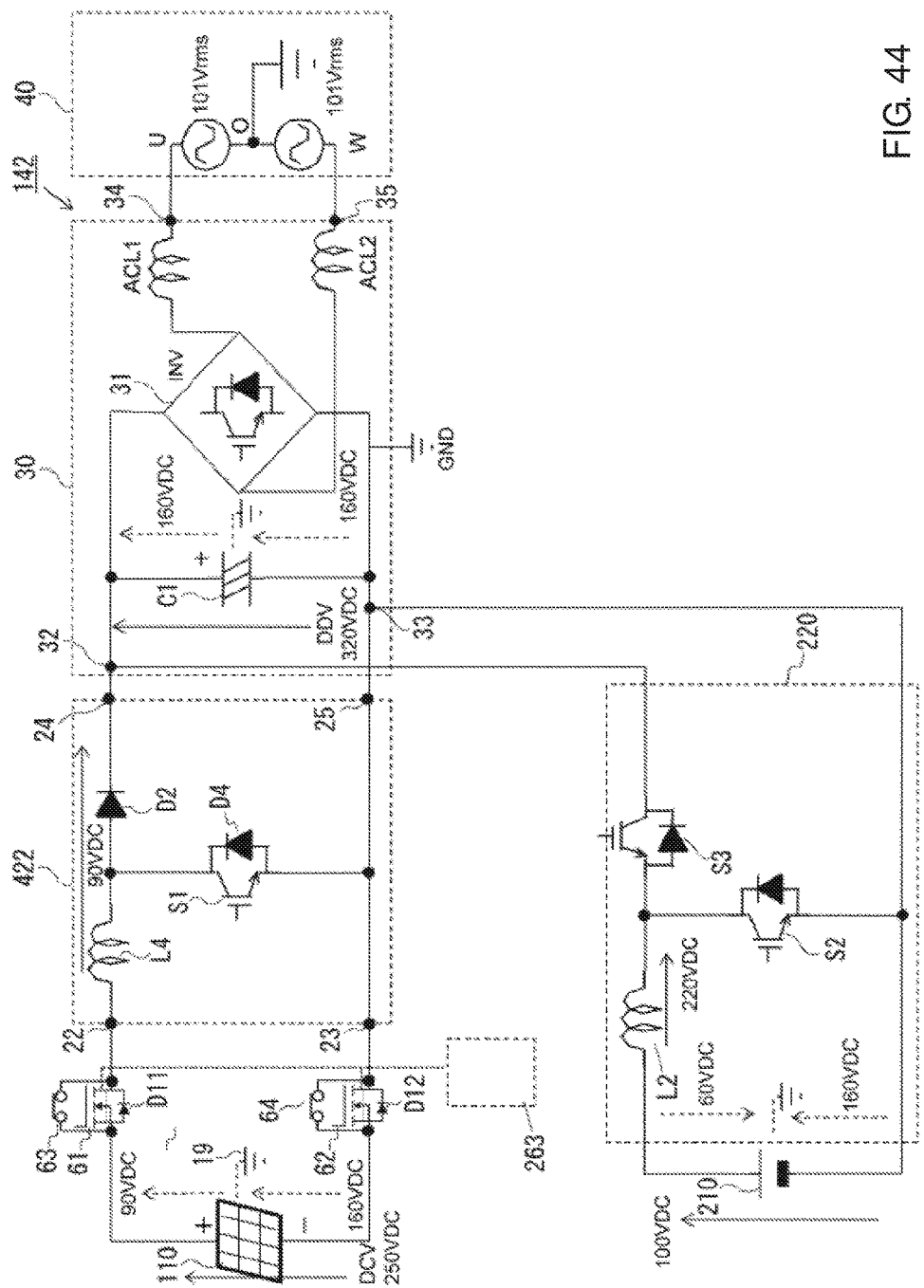
FIG. 44 is a diagram showing the circuit configuration of a distributed power system according to modification 4-2.

FIG. 44 is a diagram showing the circuit configuration of a distributed power system 142 according to modification 4-2. The system according to modification 4-2 differs from the system according to the forth embodiment in that it includes relays placed in parallel with the MOSFETs 61 and 62. The system includes the same other components as in a fourth embodiment, which are given the same reference numerals and will not be described.

The distributed power system 142 in this example includes relays (normally closed) 63 and 64 connected in parallel with the MOSFETs 61 and 62 for a DC-DC converter 422. At dawn, a control circuit 263 turns on the MOSFETs 61 and 62, and also turns on the relays 63 and 64. At dusk, the control circuit 263 turns off the MOSFETs 61 and 62, and also turns off the relays 63 and 64.

The distributed power system 142 in modification 4-2 thus enables more reliable disconnection of the solar array 110 during the nighttime.

Modification 4-3

Figure 45:
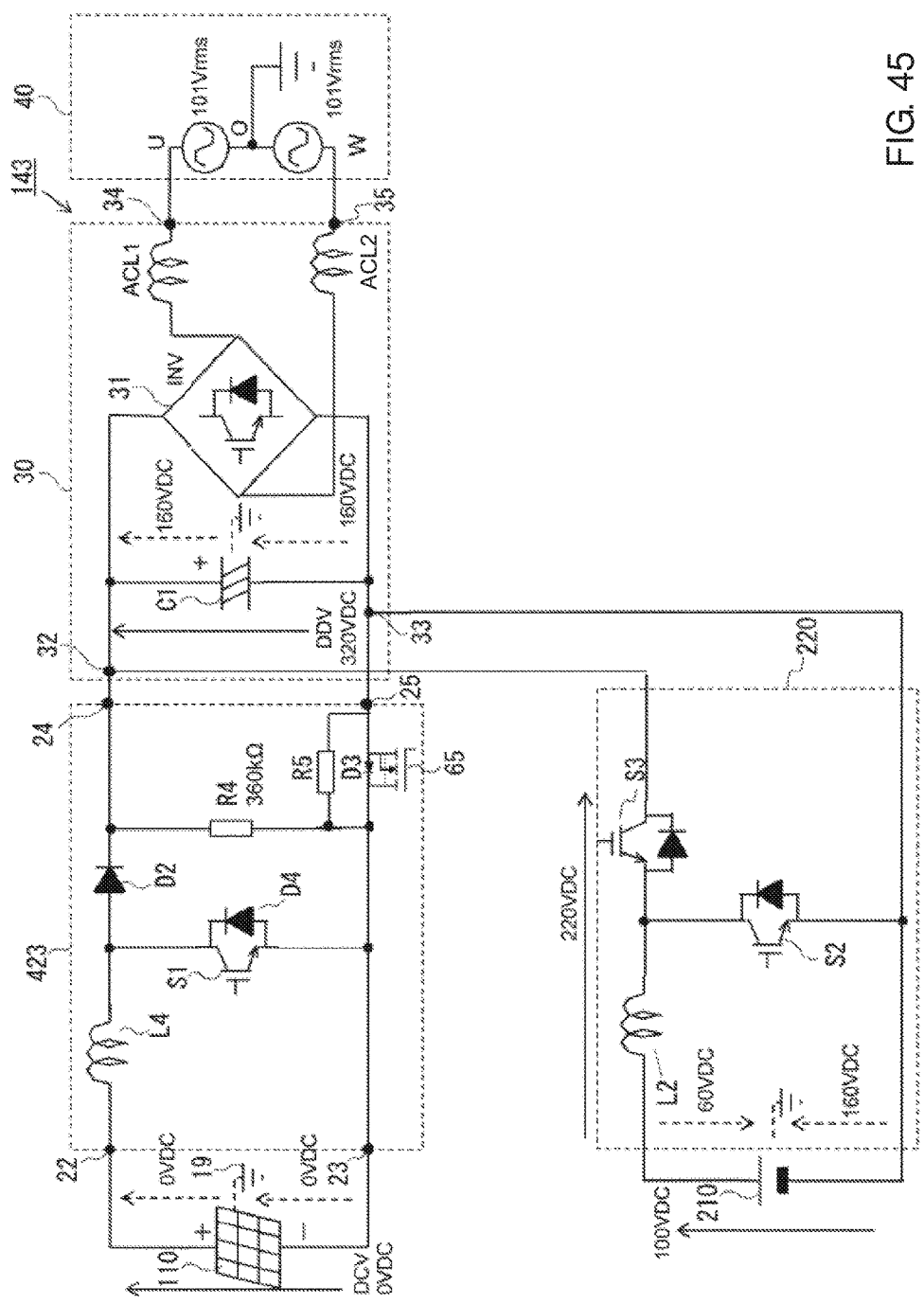
FIG. 45 is a diagram showing the circuit configuration of a distributed power system according to modification 4-3.

FIG. 45 is a diagram showing the circuit configuration of a distributed power system 143 according to modification 4-3. The system according to modification 4-3 differs from the system according to modification 3-1 shown in FIG. 28 in that it includes a MOSFET 65 in parallel with the diode D3. The system includes the same other components as in modification 3-1, which are given the same reference numerals and will not be described. Also in modification 4-3, the diode D3 may be included in the MOSFET 65.

The distributed power system 143 in this example includes the MOSFET 65 connected in parallel with the diode D3 in a DC-DC converter 423. More specifically, the MOSFET 65 has one terminal connected to the negative electrode of the output terminal of the DC-DC converter 423, and the other terminal connected to the negative electrode of the input terminal of the DC-DC converter 423. At dawn, the control circuit 262 turns on the MOSFET 65. At dusk, the control circuit 262 turns off the MOSFET 65.

During the nighttime, the distributed power system 143 in modification 4-3 thus electrically disconnects the solar array 110 and adjusts the voltage to ground of the solar array 110 through the voltage-dividing operation performed by the resistor R5 and the resistor R4. When, for example, the solar array 110 generates no power during the nighttime, adjusting the potential to ground of the solar array 110 to 0 V prevents PID from reducing the performance.

Modifications 4-4

Figure 46:
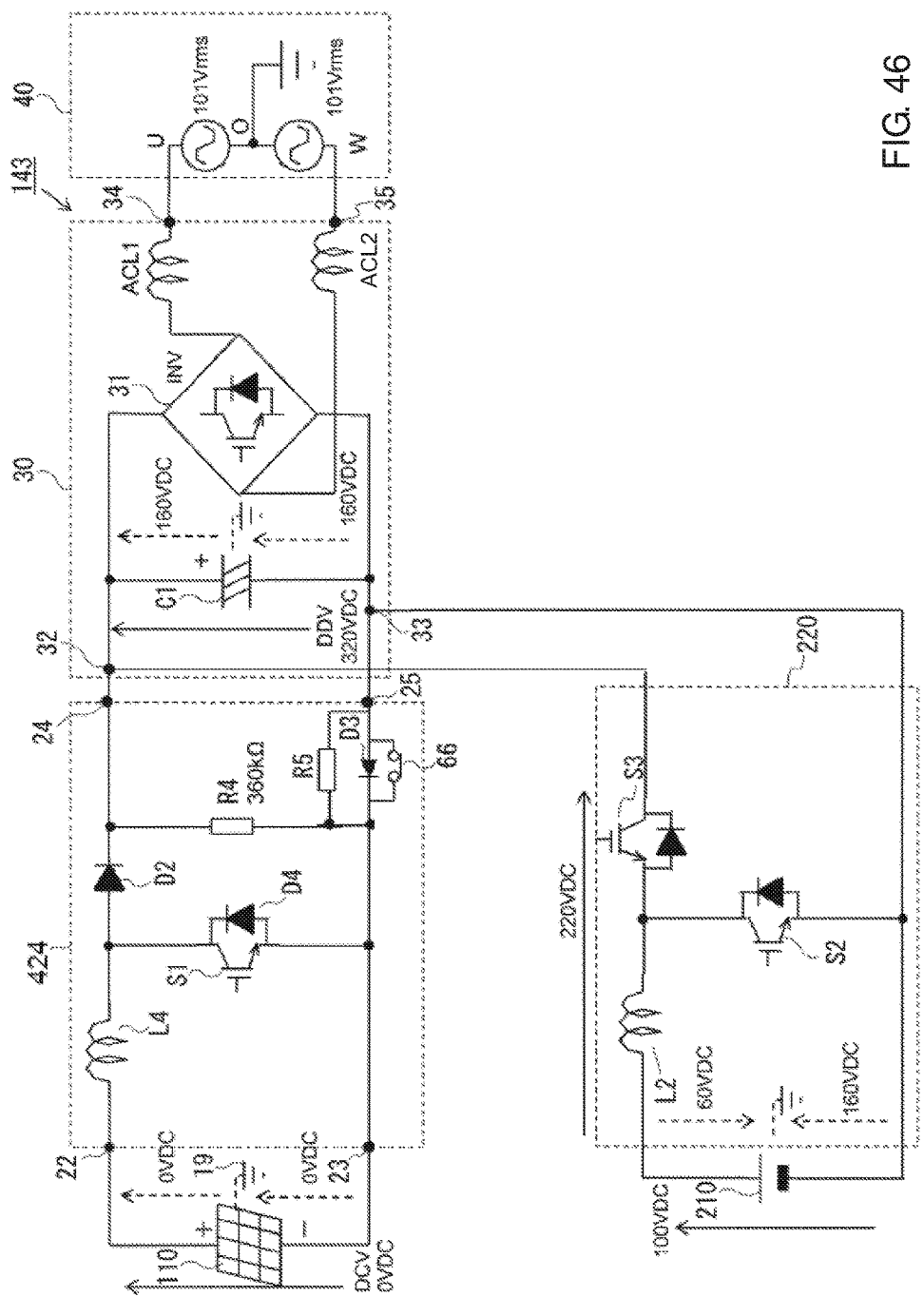
FIG. 46 is a diagram showing the circuit configuration of a distributed power system according to modification 4-4.
Figure 47:
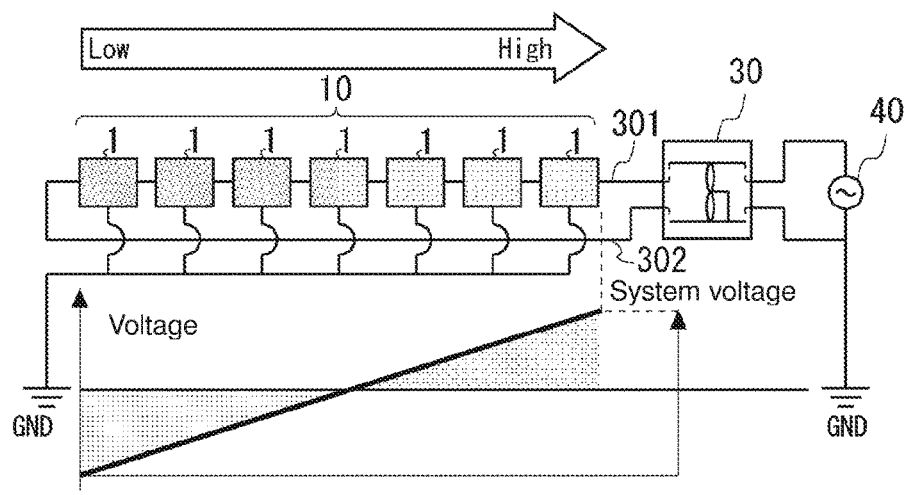
FIG. 47 is a conceptual illustration of an example PID phenomenon.

FIG. 46 is a diagram showing the circuit configuration of a distributed power system 144 according to modification 4-4. The system according to modification 4-4 differs from the system according to modification 4-3 in that the MOSFET 65 is replaced with a relay 66. The system includes the same other components as in modification 4-3, which are given the same reference numerals and will not be described.

The distributed power system 144 in this example has the relay (normally closed) 66 connected in parallel with the diode D3 in a DC-DC converter 424. More specifically, the relay 66 has one terminal connected to the negative electrode of the output terminal of the DC-DC converter 424, and the other terminal connected to the negative electrode of the input terminal of the DC-DC converter 424. At dawn, the control circuit 262 turns on the relay 66. At dusk, the control circuit 262 turns off the relay 66.

During the nighttime, the distributed power system 144 in modification 4-4 thus electrically disconnects the solar array 110 and adjusts the voltage to ground of the solar array 110 through the voltage-dividing operation performed by the resistor R5 and the resistor R4. When, for example, the solar array 110 generates no power during the nighttime, adjusting the potential to ground of the solar array 110 to 0 V prevents PID from reducing the performance.

The embodiments and modifications of the present invention described above are only illustrative and not restrictive. The features described in the embodiments and modifications may be combined without departing from the scope and spirit of the present invention.

REFERENCE SIGNS LIST 1 solar module
10 solar module string
11 frame
12 back-sheet
13 cell
14 glass sheet
15 sealant
16 electrode pattern
19 ground
21 detection circuit
26 control circuit
27 welding detection circuit
30 power conditioner
31 inverter
40 panelboard
S1 switching element

The invention claimed is:

1. A distributed power system that is connected to a utility grid during both daytime and nighttime, the system comprising:
a plurality of power supplies including a solar array;
a non-isolated DC-DC converter having an input terminal and an output terminal, and configured to raise, at a predetermined step-up ratio, a DC voltage input from the power supplies via the input terminal and to output the DC voltage via the output terminal;
an inverter configured to convert the DC voltage output from the DC-DC converter via the output terminal into an alternating current; and
a potential adjustment section configured to adjust a potential at a negative electrode of the solar array to a potential higher than a potential at a negative electrode of the inverter at least during nighttime.

2. The distributed power system according to claim 1, wherein
the potential adjustment section includes a circuit configuration including a common potential at a positive electrode of an output terminal of the solar array and a positive electrode of the output terminal of the DC-DC converter.

3. The distributed power system according to claim 2, wherein
the DC-DC converter includes at least a reactor, a diode, and a switching element, and
the potential adjustment section further includes a series-connected circuit configuration in which a first terminal of the reactor is connected to a negative electrode of the solar array, a second terminal of the reactor is connected to a cathode of the diode, and an anode of the diode is connected to a negative electrode of the output terminal of the DC-DC converter.

4. The distributed power system according to claim 1, wherein
the potential adjustment section includes a circuit configuration in which an equivalent voltage appears between a positive electrode of the input terminal of the DC-DC converter and a positive electrode of the output terminal of the DC-DC converter and between a negative electrode of the input terminal of the DC-DC converter and a negative electrode of the output terminal of the DC-DC converter when raising a voltage.

5. The distributed power system according to claim 4, wherein
the DC-DC converter includes at least a first reactor and a second reactor, a first diode and a second diode, a capacitor, and a switching element, and
the potential adjustment section includes a series-connected circuit configuration in which a first terminal of the first reactor is connected to the positive electrode of the input terminal of the DC-DC converter, a second terminal of the first reactor is connected to an anode of the first diode, and a cathode of the first diode is connected to the positive electrode of the output terminal of the DC-DC converter, and
a first terminal of the second reactor is connected to the negative electrode of the input terminal of the DC-DC converter, a second terminal of the second reactor is connected to a cathode of the second diode, and an anode of the second diode is connected to the negative electrode of the output terminal of the DC-DC converter.

6. The distributed power system according to claim 4, further comprising:
a DCV detection circuit configured to detect a DC voltage between two terminals of the solar array,
wherein the potential adjustment section includes a circuit configuration including a resistor having a resistance equivalent to a resistance of the DCV detection circuit between the positive electrode of the input terminal of the DC-DC converter and the positive electrode of the output terminal of the DC-DC converter.

7. The distributed power system according to claim 4, further comprising:
a DCV detection circuit configured to detect a DC voltage between two terminals of the solar array,
wherein the potential adjustment section includes a circuit configuration including a GND for a control circuit of the DC-DC converter between the positive electrode and the negative electrode of the output terminal of the DC-DC converter.

8. The distributed power system according to claim 1, further comprising:
a DCV detection circuit configured to detect a DC voltage between two terminals of the solar array,
wherein the potential adjustment section includes a circuit configuration in which the positive electrode of the output terminal of the DC-DC converter is connected to a first terminal of a resistor having a resistance equivalent to a resistance of the DCV detection circuit, a second terminal of the resistor is connected to a cathode of a third diode, an anode of the third diode is connected to the negative electrode of the output terminal of the DC-DC converter, and the second terminal of the resistor and the cathode of the third diode are connected to the negative electrode of the solar array.

9. The distributed power system according to claim 8, wherein
the third diode is connected to a resistor in parallel with the third diode between the cathode and the anode of the third diode.

10. The distributed power system according to claim 8, wherein the third diode is connected to a capacitor in parallel with the third diode between the cathode and the anode of the third diode.

11. The distributed power system according to claim 8, wherein
the resistor has two terminals each connected to a capacitor.

12. The distributed power system according to claim 1, further comprising:
a DCV detection circuit configured to detect a DC voltage between two terminals of the solar array,
wherein the potential adjustment section includes a circuit configuration in which a positive electrode of the output terminal of the DC-DC converter is connected to a first terminal of a resistor having a resistance equivalent to a resistance of the DCV detection circuit,
a second terminal of the resistor is connected to a positive electrode of a metal-oxide-semiconductor field-effect transistor,
a negative electrode of the metal-oxide-semiconductor field-effect transistor is connected to a negative electrode of the output terminal of the DC-DC converter, and the second terminal of the resistor and the positive electrode of the metal-oxide-semiconductor field-effect transistor are connected to the negative electrode of the solar array.

13. The distributed power system according to claim 1, further comprising:
a DCV detection circuit configured to detect a DC voltage between two terminals of the solar array,
wherein the potential adjustment section includes a circuit configuration in which a positive electrode of the output terminal of the DC-DC converter is connected to a first terminal of a resistor having a resistance equivalent to a resistance of the DCV detection circuit,
a three-terminal relay is connected to a second terminal of the resistor, the negative electrode of the solar array, and a negative electrode of the output terminal of the DC-DC converter,
the three-terminal relay is connected to the negative electrode of the solar array and the negative electrode of the output terminal of the DC-DC converter during daytime, and
during nighttime, the second terminal of the resistor is connected to the negative electrode of the solar array under control.

14. The distributed power system according to claim 1, wherein
the potential adjustment section includes a circuit configuration including disconnectors configured to electrically disconnect the solar array from the input terminal of the DC-DC converter, between the positive electrode of the solar array and a positive electrode of the input terminal of the DC-DC converter, and between the negative electrode of the solar array and a negative electrode of the input terminal of the DC-DC converter.

15. The distributed power system according to claim 14, wherein
the disconnectors are metal-oxide-semiconductor field-effect transistors.

16. The distributed power system according to claim 15, wherein
the disconnectors include relays placed in parallel with the metal-oxide-semiconductor field-effect transistors.

17. The distributed power system according to claim 14, wherein
the DC-DC converter includes resistors between a positive electrode of the output terminal and a negative electrode of the output terminal, and
an intermediate section between the resistors, the negative electrode of the solar array, and one of the disconnectors connected to the negative electrode are electrically connected.

18. The distributed power system according to claim 1, wherein
the solar array is a solar module array including a plurality of solar panels connected in series or in parallel.

19. A DC-DC converter included in the distributed power system according to claim 1.

20. A power conditioner included in the distributed power system according to claim 1, the power conditioner comprising:
a non-isolated DC-DC converter having an input terminal and an output terminal, and configured to raise, at a predetermined step-up ratio, a DC voltage input from the power supplies via the input terminal and to output the DC voltage via the output terminal; and
an inverter configured to convert the DC voltage output from the DC-DC converter via the output terminal into an alternating current.

* * * * *